United States Patent
Okamoto et al.

(10) Patent No.: US 9,793,905 B2
(45) Date of Patent: Oct. 17, 2017

(54) SEMICONDUCTOR DEVICE

(71) Applicant: Semiconductor Energy Laboratory Co., Ltd., Atsugi-shi, Kanagawa-ken (JP)

(72) Inventors: Yuki Okamoto, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/925,161

(22) Filed: Oct. 28, 2015

(65) Prior Publication Data

US 2016/0126888 A1    May 5, 2016

(30) Foreign Application Priority Data

Oct. 31, 2014  (JP) ................. 2014-222832

(51) Int. Cl.
 *H03L 7/099*   (2006.01)
 *H03K 3/03*    (2006.01)
 *H01L 27/1156* (2017.01)

(52) U.S. Cl.
 CPC ........... *H03L 7/099* (2013.01); *H03K 3/0315* (2013.01); *H01L 27/1156* (2013.01)

(58) Field of Classification Search
 CPC ........... H03B 5/12; H03K 3/03; H03K 3/0315
 See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,504,439 B1* | 1/2003 | Ozawa ............... | H03K 3/0315 331/177 R |
| 6,563,174 B2 | 5/2003 | Kawasaki et al. | |
| 6,727,522 B1 | 4/2004 | Kawasaki et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Jeffrey Shin
(74) *Attorney, Agent, or Firm* — Fish & Richardson P.C.

(57) ABSTRACT

An object of the present invention is to provide a semiconductor device including an oscillator circuit including a circuit between inverters. In the circuit, a sum of the length $(a_1)$ of a wiring path between a terminal A and a terminal $C_1$ and a length $(b_1)$ of a wiring path between a terminal $D_1$ and a terminal B is substantially equal to a sum of the length $(a_2)$ of a wiring path between the terminal A and a terminal $C_2$ and the length $(b_2)$ of a wiring path between a terminal $D_2$ and the terminal B.

20 Claims, 25 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 9,344,037 B2 | 5/2016 | Okamoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2015/0256161 A1 | 9/2015 | Okamoto et al. |
| 2016/0028347 A1 | 1/2016 | Okamoto et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp.115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Tehnology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phase for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures over 1000° C. ", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical Properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1215-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid Stae Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductor", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID

(56) References Cited

OTHER PUBLICATIONS

Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Gao.X et al., "Jitter Analysis and a Benchmarking Figure-of-Merit for Phase-Locked Loops", IEEE Transactions on Circuits and Systems, Feb. 1, 2009, vol. 56, No. 2, pp. 117-121.

Anand.S et al., "A CMOS Clock Recovery Circuit for 2.5-Gb/s NRZ Data", IEEE Journal of Solid-State Circuits, Mar. 1, 2001, vol. 36, No. 3, pp. 432-439.

Zhai.C et al., "An N-path Filter Enhanced Low Phase Noise Ring VCO", 2014 Symposium on VLSI Circuits Digest of Technical Papers, Jun. 10, 2014, pp. 187-188.

Okamoto.Y et al., "CAAC-OS-based Nonvolatile Programmable Analog Device: Voltage Controlled Oscillator Realizing Instant Frequency Switching", SSDM 2014 (Extended Abstracts of the 2014 International Conference on Solid State Devices and Materials), Sep. 8, 2014, pp. 452-453.

* cited by examiner

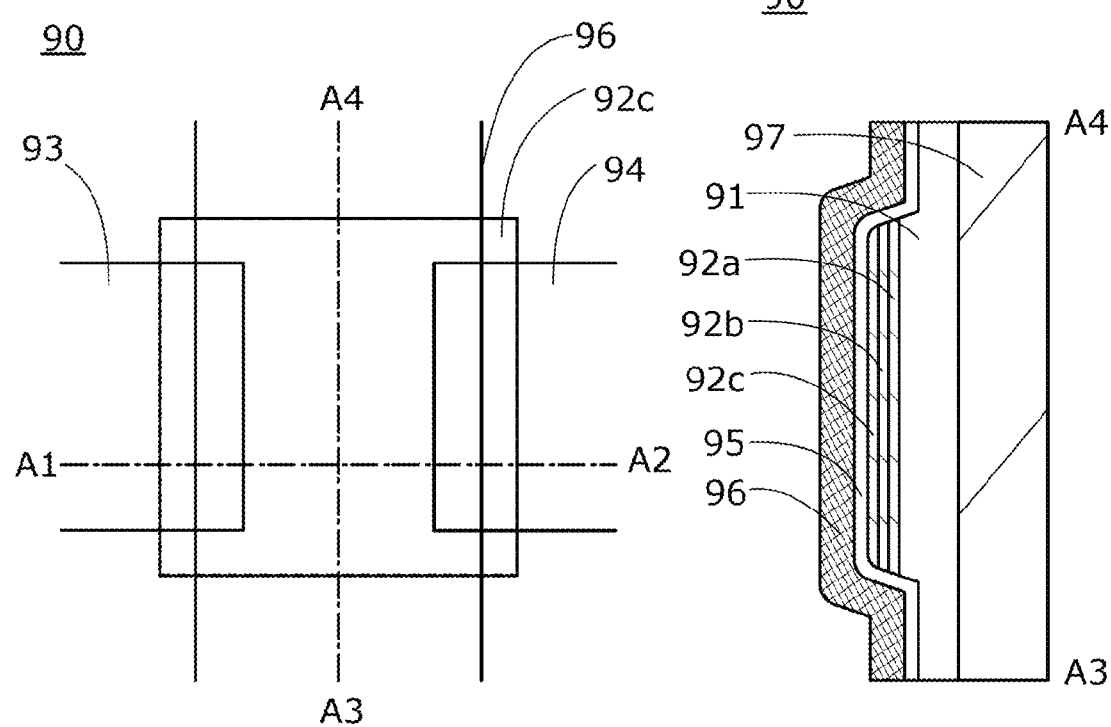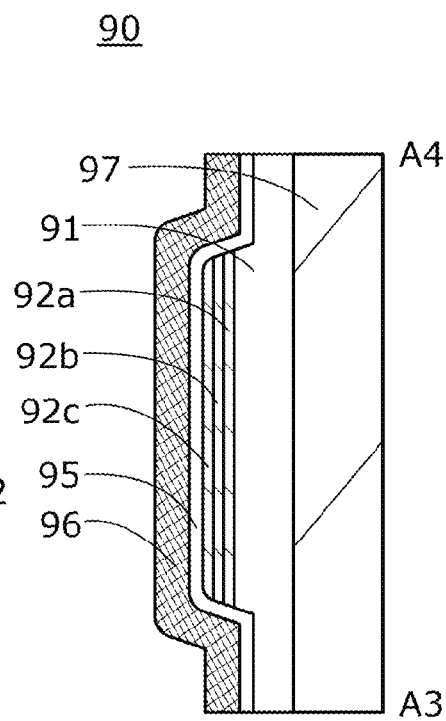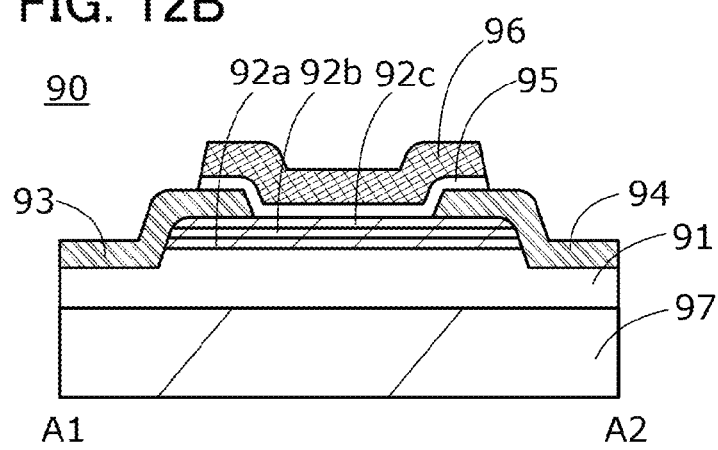

SEMICONDUCTOR DEVICE

BACKGROUND OF THE INVENTION

1. Field of the Invention

One embodiment of the present invention relates to a device such as a semiconductor device or a method for driving the device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

Phase-locked loops (PLLs) have been actively developed (see Non-Patent Document 1). The PLLs are used to operate a circuit such as a CPU or a programmable logic device at a desired operation speed.

REFERENCE

Non-Patent Document

[Non-Patent Document 1] X. Gao, A. M. Klumperink, P. F. J. Geraedts, and B. Nauta, "Jitter Analysis and a Benchmarking Figure-of-Merit for Phase-Locked Loops," IEEE Trans. On Circuits and Systems-II, vol. 56, no. 2, pp. 117-121, February 2009

SUMMARY OF THE INVENTION

Conventional PLL circuits have difficulty in changing the oscillation frequency instantly.

An object of one embodiment of the present invention is to provide a novel circuit configuration. Another object of one embodiment of the present invention is to change the oscillation frequency or to provide a circuit configuration capable of achieving the change. Another object of one embodiment of the present invention is to improve the accuracy of oscillation frequency or to provide a circuit configuration capable of achieving the improvement.

Note that an object of one embodiment of the present invention is to provide a novel semiconductor device or the like. Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including an oscillator circuit. The oscillator circuit includes first to n-th inverters (n is an odd number of 3 or more), a first circuit, and a second circuit. A first terminal of the first circuit is electrically connected to an output terminal of the i-th inverter (i is one of 1 to n−1). A second terminal of the first circuit is electrically connected to an input terminal of the i+1-th inverter. A first terminal of the second circuit is electrically connected to the output terminal of the i-th inverter. A second terminal of the second circuit is electrically connected to the input terminal of the i+1-th inverter. The sum of the length of a wiring path between the output terminal of the i-th inverter and the first terminal of the first circuit and the length of a wiring path between the second terminal of the first circuit and the input terminal of the i+1-th inverter is substantially equal to the sum of the length of a wiring path between the output terminal of the i-th inverter and the first terminal of the second circuit and the length of a wiring path between the second terminal of the second circuit and the input terminal of the i+1-th inverter.

Another embodiment of the present invention preferably has the following configuration. An insulating film is provided over at least part of the first circuit and part of the second circuit. A first wiring and a second wiring are provided over the insulating film and electrically connected to the output terminal of the i-th inverter and the input terminal of the i+1-th inverter, respectively. The first wiring is electrically connected to the first terminal of the first circuit through a first opening provided in the insulating film and to the first terminal of the second circuit through a second opening provided in the insulating film. The second wiring is electrically connected to the second terminal of the first circuit through a third opening provided in the insulating film and to the second terminal of the second circuit through a fourth opening provided in the insulating film. The distance between the first opening and the second opening is substantially equal to the distance between the third opening and the fourth opening.

Another embodiment of the present invention preferably includes a first region in which the j-th inverter (j is an odd number greater than or equal to 1 and less than or equal to n) is provided, a second region in which the first circuit and the second circuit are provided, and a third region in which the k-th inverter (k is an even number greater than or equal to 2 and less than or equal to n−1) is provided. The second region is preferably positioned between the first region and the third region.

Another embodiment of the present invention preferably has the following configuration. The first circuit has a function of storing first data. The first circuit has a function of switching between a mode in which the first terminal and the second terminal are electrically disconnected from each other and a mode in which the resistance between the first terminal and the second terminal is set to a value based on the first data. The second circuit has a function of storing second data. The second circuit has a function of switching between a mode in which the first terminal and the second terminal are electrically disconnected from each other and a mode in which the resistance between the first terminal and the second terminal is set to a value based on the second data.

In another embodiment of the present invention, the first data and the second data may each be an analog potential.

Another embodiment of the present invention may have the following configuration. The first circuit includes a first transistor and a first capacitor. The second circuit includes a second transistor and a second capacitor. The first data is input to the first capacitor through the first transistor. The second data is input to the second capacitor through the second transistor. A channel formation region of the first transistor includes an oxide semiconductor. A channel formation region of the second transistor includes an oxide semiconductor.

Another embodiment of the present invention may have the following configuration. The first circuit includes a third transistor and a fourth transistor. The second circuit includes a fifth transistor and a sixth transistor. The third transistor and the fourth transistor are electrically connected in series between the first terminal of the first circuit and the second terminal of the first circuit. The fifth transistor and the sixth transistor are electrically connected in series between the first terminal of the second circuit and the second terminal of the second circuit. The resistance between a source and a drain of the third transistor is based on the first data. The fourth transistor has a function of controlling conduction/non-conduction between the first terminal of the first circuit and the second terminal of the first circuit. The resistance between a source and a drain of the fifth transistor is based on the second data. The sixth transistor has a function of controlling conduction/non-conduction between the first terminal of the second circuit and the second terminal of the second circuit.

The above-described device may include a PLL. The PLL includes the oscillator circuit, a frequency divider, a phase comparator, and a loop filter.

According to one embodiment of the present invention, a novel circuit configuration can be provided. According to one embodiment of the present invention, the oscillation frequency can be changed, or a circuit configuration capable of achieving the change can be provided. According to one embodiment of the present invention, the accuracy of oscillation frequency can be improved, or a circuit configuration capable of achieving the improvement can be provided.

Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

FIGS. 12A to 12C illustrate a structure of a transistor.

DETAILED DESCRIPTION OF THE INVENTION

Figure 1:
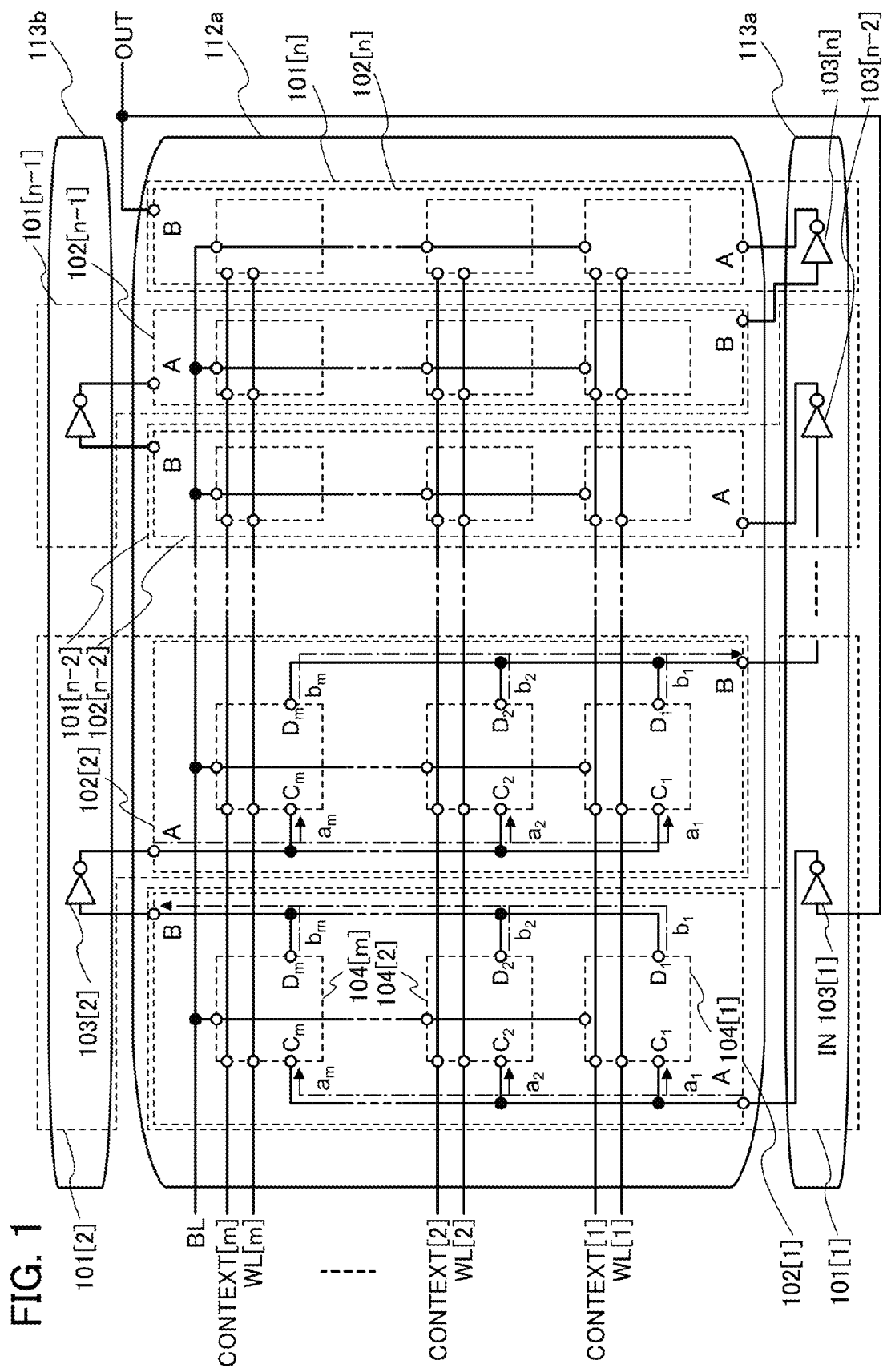
FIG. 1 illustrates a configuration of a device.

Embodiments of the present invention will be described below in detail with reference to the drawings. Note that the present invention is not limited to the following description, and it is easily understood by those skilled in the art that the modes and details can be variously changed without departing from the spirit and scope of the present invention. Therefore, the present invention should not be construed as being limited to the description of the embodiments below.

One embodiment of the present invention includes, in its category, every semiconductor device using a transistor, for example, integrated circuits, RF tags, and semiconductor display devices. Note that the category of integrated circuits includes large scale integrated circuits (LSIs) including a microprocessor, an image processing circuit, a digital signal processor (DSP), and a microcontroller, and programmable logic devices (PLDs) such as a field programmable gate array (FPGA) and a complex PLD (CPLD). In addition, the category of semiconductor display devices includes semiconductor display devices in which a circuit element including a semiconductor film is included in a driver circuit, such as liquid crystal display devices, light-emitting devices in which a light-emitting element typified by an organic light-emitting diode (OLED) is provided in each pixel, electronic paper, digital micromirror devices (DMDs), plasma display panels (PDPs), and field emission displays (FEDs).

In this specification, the category of semiconductor display devices includes a panel in which a display element such as a liquid crystal element or a light-emitting element is provided in each pixel, and a module in which an IC or the like including a controller is mounted on the panel.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation other than that shown in a drawing or text is possible.

Here, X and Y each denote an object (e.g., a device, an element, a circuit, a wiring, an electrode, a terminal, a conductive film, or a layer).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase the signal amplitude, the amount of current, or the like, an operational amplifier, a differential amplifier circuit, a source follower circuit, or a buffer circuit; a signal generation circuit; a memory circuit; or a control circuit) can be connected between X and Y. For example, in the case where a signal output from X is transmitted to Y even when another circuit is provided between X and Y, X and Y are functionally connected.

Note that an explicit description "X and Y are connected" means that X and Y are electrically connected (i.e., X and Y are connected with another element or another circuit provided therebetween), X and Y are functionally connected (i.e., X and Y are functionally connected with another circuit provided therebetween), and X and Y are directly connected (i.e., X and Y are connected without another element or another circuit provided therebetween). That is, the explicit description "X and Y are electrically connected" is the same as the explicit simple description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to these examples, a source (or a first terminal or the like) and a drain (or a second terminal or the like) of a transistor can be distinguished from each other to specify the technical scope. Note that one embodiment of the present invention is not limited to these expressions which are just examples. Here, X, Y, Z1, and Z2 each denote an object (e.g., a device, an element, a circuit, a wiring, an electrode, a terminal, a conductive film, or a layer).

Note that a "source" of a transistor in this specification means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

The terms "source" and "drain" of a transistor interchange with each other depending on the conductivity type of the transistor or the level of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming that the source and the drain are fixed for convenience; actually, the names of the source and the drain interchange with each other depending on the relation of the potentials.

Embodiment 1

In this embodiment, a device of one embodiment of the present invention will be described. In the case where a semiconductor element such as a transistor is used for the device of one embodiment of the present invention, the device of one embodiment of the present invention may be referred to as a semiconductor device.

FIG. 1 illustrates an example of a configuration of a semiconductor device of one embodiment of the present invention. The device in FIG. 1 has a function of generating an alternating current signal such as a clock signal by oscillating and may be referred to as an oscillator (or an oscillator circuit). Specifically, the device in FIG. 1 has a function of changing the frequency (or oscillation frequency) of a signal in accordance with an input voltage and may be referred to as a voltage-controlled oscillator (or a voltage-controlled oscillator circuit).

The device in FIG. 1 includes circuits $101[1]$ to $101[n]$ (n is an odd number of 3 or more). The circuits $101[1]$ to $101[n]$ are connected in a ring form. Specifically, an output terminal of each of the circuits $101[1]$ to $101[n-1]$ is connected to an input terminal of the circuit in the next stage. An output terminal of the circuit $101[n]$ is connected to an input terminal of the circuit $101[1]$. The output terminal of the circuit $101[n]$ is also connected to a terminal OUT. From the terminal OUT, a signal generated by oscillation of the device in FIG. 1 is output.

Note that the signal generated by oscillation of the device in FIG. 1 may be output through a buffer or the like.

The circuits $101[1]$ to $101[n]$ each have a function of outputting an inverted signal of an input signal. In addition, the circuits $101[1]$ to $101[n]$ each have a function of storing a plurality of data sets and a function of setting delay time in accordance with the stored data sets. The delay time refers to delay time of an output signal with respect to an input signal. Since the circuits $101[1]$ to $101[n]$ can each store a plurality of data sets, the delay time can be changed.

The device in FIG. 1 can change the oscillation frequency by changing the delay time in each of the circuits $101[1]$ to $101[n]$.

The circuits $101[1]$ to $101[n]$ preferably include respective circuits $102[1]$ to $102[n]$ and respective inverters $103[1]$ to $103[n]$. A terminal A of the circuit $102[i]$ (i is a natural number greater than or equal to 1 and less than or equal to n−1) is electrically connected to an output terminal of the inverter $103[i]$, and a terminal B of the circuit $102[i]$ is electrically connected to an input terminal of the inverter $103[i+1]$. A terminal A of the circuit $102[n]$ is electrically connected to an output terminal of the inverter $103[n]$, and a terminal B of the circuit $102[n]$ is electrically connected to an input terminal of the inverter $103[1]$ and the terminal OUT. That is, the inverters $103[1]$ to $103[n]$ are connected in a ring form and form an inverter ring. Furthermore, between any two adjacent inverters of the inverters $103[1]$ to $103[n]$, corresponding one of the circuits $102[1]$ to $102[n]$ is connected. Note that the circuits $102[1]$ to $102[n]$ are sometimes referred to as a circuit 102 when there is no need to distinguish them. Similarly, the inverters $103[1]$ to $103[n]$ are sometimes referred to as an inverter 103 when there is no need to distinguish them.

The circuits $102[1]$ to $102[n]$ each have a function of storing a plurality of data sets and a function of setting the resistance between the terminal A and the terminal B in accordance with the stored data sets. Since the circuits 102[1] to 102[n] can each store a plurality of data sets, the resistance between the terminal A and the terminal B can be changed.

The inverters 103[1] to 103[n] each have a function of outputting an inverted signal of an input signal.

Note that instead of each of the inverters 103[1] to 103[n], a circuit having a function of outputting an inverted signal of an input signal may be employed. Examples of such a circuit include a NAND circuit and a NOR circuit.

The device in FIG. 1 can change the oscillation frequency by changing the resistance between the terminal A and the terminal B of the circuit 102 in each of the circuits 101[1] to 101[n]. Specifically, when the resistance between the terminal A and the terminal B of the circuit 102 is changed, the load on the output terminal of the inverter 103 is changed. Consequently, the delay time is changed in each of the circuits 101[1] to 101[n], leading to a change in oscillation frequency.

In the device in FIG. 1, between any two adjacent inverters of the inverters 103[1] to 103[n], corresponding one of the circuits 102[1] to 102[n] is connected; however, the configuration of the semiconductor device described in this embodiment is not limited thereto. The oscillation frequency can be changed when the circuit 102 is connected between at least two of the inverters 103[1] to 103 [n].

The circuits 102[1] to 102[n] each include circuits 104[1] to 104[m] (m is a natural number of 2 or more). Terminals $C_1$ to $C_m$ of the circuits 104[1] to 104[m] are electrically connected to the terminal A of the circuit 102, and terminals $D_1$ to $D_m$ of the circuits 104[1] to 104[m] are electrically connected to the terminal B of the circuit 102. Furthermore, the circuits 104[1] to 104[m] are each electrically connected to a wiring BL, corresponding one of wirings CONTEXT[1] to CONTEXT[m], and corresponding one of wirings WL[1] to WL[m]. In the circuit 104[j] (j is one of 1 to m), the corresponding one of the wirings WL[1] to WL[m] refers to the wiring WL[j]. In the circuit 104[j], the corresponding one of the wirings CONTEXT[1] to CONTEXT[m] refers to the wiring CONTEXT[j]. The terminals $C_1$ to $C_m$ are sometimes referred to as a terminal C when there is no need to distinguish them. The terminals $D_1$ to $D_m$ are sometimes referred to as a terminal D when there is no need to distinguish them.

Hereinafter, the direction in which the wiring WL and the wiring CONTEXT extend may be called a row direction, and the direction in which the circuits 104[1] to 104[m] are arranged may be called a column direction.

Here, the terminal A of the circuit 102 is electrically connected to the output terminal of the inverter 103 in the same stage, and the terminal B of the circuit 102 is electrically connected to the input terminal of the inverter 103 in the next stage. Therefore, as a synonym for the expression "terminal A of the circuit 102", the expression "output terminal of the inverter 103 in the same stage" is sometimes used in this specification and the like. As a synonym for the expression "terminal B of the circuit 102", the expression "input terminal of the inverter 103 in the next stage" is sometimes used in this specification and the like. In other words, the following expression is possible: the terminals $C_1$ to $C_m$ of the circuits 104[1] to 104[m] of the circuit 102 are electrically connected to the output terminal of the inverter 103 in the same stage, and the terminals $D_1$ to $D_m$ of the circuits 104[1] to 104[m] are electrically connected to the input terminal of the inverter 103 in the next stage.

As an example of the specific configuration of the circuit 102, the configuration of the circuit 102[i] will be described with reference to FIG. 2.

The circuits 104[1] to 104[m] each include a transistor 105, a transistor 106, a transistor 107, and a capacitor 108. The circuit 104[j] is used as an example below to describe the connection relation in the circuit 104. Note that the connection relation in the circuits 104[1] to 104[j−1] and the circuits 104[j+1] to 104[m] is similar to that in the circuit 104[j].

In the circuit 104[j], a first terminal of the transistor 105 is electrically connected to the wiring BL, a second terminal of the transistor 105 is electrically connected to a gate of the transistor 106, and a gate of the transistor 105 is electrically connected to the wiring WL[j]. A first terminal of the transistor 106 is electrically connected to the terminal $C_j$. A first terminal of the transistor 107 is electrically connected to a second terminal of the transistor 106, a second terminal of the transistor 107 is electrically connected to the terminal $D_j$, and a gate of the transistor 107 is electrically connected to the wiring CONTEXT[j]. A first terminal of the capacitor 108 is electrically connected to the gate of the transistor 106, and a second terminal of the capacitor 108 is electrically connected to a wiring supplied with a predetermined potential.

Note that the positions of the transistor 106 and the transistor 107 may be reversed as long as the transistor 106 and the transistor 107 are connected in series between the terminal $C_j$ and the terminal $D_j$.

The resistance between the terminal A and the terminal B of the circuit 102 is substantially equal to the combined resistance of every resistance between the terminal C and the terminal D of the circuits 104[1] to 104[m]. Accordingly, the resistance between the terminal A and the terminal B of the circuit 102 can be changed by controlling the resistance between the terminal C and the terminal D of each of the circuits 104[1] to 104[m].

The circuits 104[1] to 104[m] each have a function of storing a potential at a node SN and setting the resistance between the first terminal and the second terminal (hereinafter, also referred to as a source and a drain) of the transistor 106 in accordance with the potential. A potential can be stored at the node SN as follows: the transistor 105 is turned on, a potential of the wiring BL is input to the node SN, and charge based on the potential of the wiring BL is accumulated in the capacitor 108. In addition, the circuits 104[1] to 104[m] can each store an analog potential at the node SN. Thus, different potentials can be stored at the nodes SN of the circuits 104[1] to 104[m], so that the transistors 106 can have different resistances between the first terminal and the second terminal. In the case where the transistor 106 is an n-channel transistor, the resistance between the first terminal and the second terminal of the transistor 106 decreases as the potential of the node SN increases. In the case where the transistor 106 is a p-channel transistor, the resistance between the first terminal and the second terminal of the transistor 106 decreases as the potential of the node SN decreases.

As the transistor 105, a transistor including an oxide semiconductor in a channel formation region is preferably employed. As will be described later, the off-state current of the transistor including an oxide semiconductor in a channel formation region is low, and therefore, charge leakage from the capacitor 108 can be reduced. Particularly in the case where charge based on an analog potential is accumulated in the capacitor 108, as compared with the case of a digital potential, even a slight potential change might cause data fluctuation. Therefore, the effect of employing the transistor including an oxide semiconductor in a channel formation region as the transistor 105 is particularly significant.

Note that the potential stored at the node SN is preferably a potential at which the transistor 106 is turned on. Thus, the resistance between the source and the drain of the transistor 106 can also be referred to as on-state resistance of the transistor 106.

Note that the capacitor 108 may be omitted in the case where charge based on the potential of the wiring BL can be accumulated as parasitic capacitance at the node SN, such as gate capacitance of the transistor 106.

The circuits 104[1] to 104[m] each have a function of switching conduction/non-conduction between the terminal C and the terminal D. The conduction/non-conduction between the terminal C and the terminal D can be switched by turning on/off the transistor 107. In the circuits 104[1] to 104[m], the transistor 107 in an on state enables electrical connection between the terminal C and the terminal D; therefore, the resistance between the terminal C and the terminal D depends on the resistance between the source and the drain of the transistor 106. Specifically, the resistance between the terminal C and the terminal D is substantially equal to the sum of the resistance between the source and the drain of the transistor 106 and the resistance between the source and the drain of the transistor 107 in an on state. On the other hand, the transistor 107 in an off state does not allow the electrical connection between the terminal C and the terminal D; therefore, regardless of the resistance between the source and the drain of the transistor 106, the impedance between the terminal C and the terminal D is high.

In other words, the circuits 104[1] to 104[m] each have a function of switching between a mode in which the terminal C and the terminal D are electrically disconnected from each other and a mode in which the resistance between the terminal C and the terminal D is set to a value based on stored data.

The resistance between the terminal A and the terminal B of the circuit 102 can be changed by a variety of methods.

The resistance between the terminal A and the terminal B of the circuit 102 can be changed by controlling the number of circuits (at least one) which are selected from the circuits 104[1] to 104[m] and in which the electrical connection between the terminal C and the terminal D is to be established. In the case where the same data is stored in the circuits 104[1] to 104[m], the circuits 104[1] to 104[m] have the same resistance between the source and the drain of the transistor 106. In this case, the resistance between the terminal A and the terminal B of the circuit 102 can be controlled by the number of circuits which are selected from the circuits 104[1] to 104[m] and in which the electrical connection between the terminal C and the terminal D is to be established.

The resistance between the terminal A and the terminal B of the circuit 102 can be changed in accordance with data stored in one circuit which is selected from the circuits 104[1] to 104[m] and in which the electrical connection between the terminal C and the terminal D is to be established. In the case where different data sets are stored in the circuits 104[1] to 104[m], the circuits 104[1] to 104[m] have different resistances between the source and the drain of the transistor 106. In this case, the resistance between the terminal A and the terminal B of the circuit 102 can be controlled by the choice of one from among the circuits 104[1] to 104[m].

Note that the above two examples may be combined as appropriate. That is, the resistance between the terminal A and the terminal B of the circuit 102 may be changed as follows: different data sets are stored in at least two of the circuits 104[1] to 104[m], and at least one circuit in which the electrical connection between the terminal C and the terminal D is to be established is selected from the circuits 104[1] to 104[m].

To improve the accuracy of oscillation frequency, the oscillation frequencies for specific data are preferably substantially equal. Concretely speaking, in the case where specific data is stored in one of the circuits 104[1] to 104[m], substantially the same oscillation frequency is preferably obtained in whichever one of the circuits 104[1] to 104[m] the specific data may be stored.

As described above, the semiconductor device described in this embodiment can change the oscillation frequency by changing the delay time in each of the circuits 101[1] to 101[n]. The delay time in each of the circuits 101[1] to 101[n] is determined by the resistance between the terminal A and the terminal B of each of the circuits 102[1] to 102[n]; the resistance between the terminal A and the terminal B of the circuit 102 is controlled by data stored in the circuits 104[1] to 104[m].

Conversely, in the case where the resistance between the terminal A and the terminal B of the circuit 102 varies, the oscillation frequency might fluctuate even when the same data is stored in the circuits 104[1] to 104[m].

For example, the following cases are supposed: the case where specific data is stored in only the circuit 104[1] and the case where data identical to the specific data is stored in only the circuit 104[m]. In these cases, when the length of the wiring path from the terminal A to the terminal B varies between a wiring path via the circuit 104[1] and a wiring path via the circuit 104[m], the choice of the wiring path makes a difference in the wiring resistance between the terminal A and the terminal B. That is, the oscillation frequency might fluctuate even when the same data is stored in the circuit 104[1] and the circuit 104[m].

Therefore, in the semiconductor device described in this embodiment, the circuit 102 has a configuration in which the lengths of wiring paths between the terminal A and the terminal B are substantially equal regardless of choice of the circuit 104 through which the wiring path is routed. Note that in this specification and the like, the expression "the length of A is substantially equal to the length of B" or the like does not necessarily mean that the length of A is exactly the same as the length of B. For example, the length of A can be regarded as being substantially equal to the length of B when the difference therebetween is 20% or less, preferably 10% or less, further preferably 5% or less of the length of A or the length of B.

Specifically, as illustrated in FIG. 1, the following sums are equal in the circuit 102: the sum of the length ($a_1$) of a wiring path between the terminal A and the terminal $C_1$ and the length ($b_1$) of a wiring path between the terminal $D_1$ and the terminal B, the sum of the length ($a_2$) of a wiring path between the terminal A and the terminal $C_2$ and the length ($b_2$) of a wiring path between the terminal $D_2$ and the terminal B, and the sum of the length ($a_m$) of a wiring path between the terminal A and the terminal $C_m$ and the length ($b_m$) of a wiring path between the terminal $D_m$ and the terminal B. Although not illustrated in FIG. 1, the same applies to wiring paths between the terminal A and the terminals $C_3$ to $C_{m-1}$ and wiring paths between the terminals $D_3$ to $D_{m-1}$ and the terminal B.

In other words, in the circuit 102 of the semiconductor device described in this embodiment, the length of one of wirings paths between the terminal A and the terminals $C_1$ to $C_m$ and the length of corresponding one of wirings paths between the terminals $D_1$ to $D_m$ and the terminal B satisfy the relation, $a_1+b_1=a_2+b_2= \ldots =a_m+b_m$, which is simplified to the following formula (1).

[Formula 1]

$$a_j+b_j=L_L \qquad (1)$$

In the formula, regarding the circuit 102 and the circuit 104[*j*] (j is one of 1 to m), $a_j$ denotes the length of a wiring path between the terminal A and the terminal $C_j$, and $b_j$ denotes the length of a wiring path between the terminal $D_j$ and the terminal B. In addition, $L_L$ represents a given length.

In the circuit 102, when the wirings between the terminal A and the terminals $C_1$ to $C_m$ and the wirings between the terminals $D_1$ to $D_m$ and the terminal B satisfy the relation in the formula (1), the wiring resistances between the terminal A and the terminal B can be substantially equal regardless of the choice of the wiring path. Accordingly, the semiconductor device described in this embodiment can have substantially equal oscillation frequencies for specific data, which leads to an improvement in the accuracy of oscillation frequency.

In the semiconductor device described in this embodiment, the circuits 102[1] to 102[*n*] and the inverters 103[1] to 103[*n*] are divided as illustrated in FIG. 1. That is, the inverter 103[$k_1$] ($k_1$ is an odd number greater than or equal to 1 and less than or equal to n) is provided in a first region 113*a*, the circuits 102[1] to 102[*n*] are provided in a second region 112*a*, and the inverter 103[$k_2$] ($k_2$ is an even number greater than or equal to 2 and less than or equal to n−1) is provided in a third region 113*b*. On the substrate plane, the second region 112*a* is positioned between the first region 113*a* and the third region 113*b*.

As for the circuit 101[1] and the circuit 101[2], the inverter 103[1] of the circuit 101[1] is provided in the first region 113*a*, the circuit 102[1] of the circuit 101[1] and the circuit 102[2] of the circuit 101[2] are provided in the second region 112*a*, and the inverter 103[2] of the circuit 101[2] is provided in the third region 113*b*.

In this manner, the circuits 102[1] and 102[2] are provided in the region between the inverter 103[1] and the inverter 103[2]; therefore, the terminal A and the terminal B of the circuit 102[1] are provided on the first region 113*a* side and the third region 113*b* side, respectively, and the terminal A and the terminal B of the circuit 102[2] are provided on the third region 113*b* side and the first region 113*a* side, respectively. In this case, in a plan view of each of the circuits 102[1] and 102[2], the wirings between the terminal A and the terminals $C_1$ to $C_m$ and the wirings between the terminals $D_1$ to $D_m$ and the terminal B have a substantially two-fold rotational symmetry. Consequently, the sum of the length of one of the wirings between the terminal A and the terminals $C_1$ to $C_m$ and the length of corresponding one of the wirings between the terminals $D_1$ to $D_m$ and the terminal B is constant.

Such a positional relation between the circuits 101, the circuits 102 and the inverters 103 enables the wirings of the circuits 102 to be provided according to the formula (1) without extension or addition of a wiring. Accordingly, the semiconductor device described in this embodiment can have improved accuracy of oscillation frequency, while an increase in area is suppressed.

If the third region 113*b* is not provided and all the inverters 103 are provided in the first region 113*a*, the terminal A and the terminal B of the circuit 102 are both provided on the first region 113*a* side. In this case, in the circuit 102, the length of one of the wirings paths between the terminal A and the terminals $C_1$ to $C_m$ and the length of corresponding one of the wirings paths between the terminals $D_1$ to $D_m$ and the terminal B satisfy the relation, $a_1+b_1<a_2+b_2< \ldots <a_m+b_m$. Thus, the wiring resistance between the terminal A and the terminal B depends on the choice of the wiring path, which results in a decrease in the accuracy of oscillation frequency.

Moreover, the circuit 101 in an odd-numbered stage and the circuit 101 in an even-numbered stage are preferably provided in pairs as in the case of the circuit 101[1] and the circuit 101[2] in FIG. 1. Accordingly, a space (widths of two circuits 102) corresponding to the width of the circuit 102 in the odd-numbered stage and the width of the circuit 102 in the even-numbered stage in the direction (row direction) parallel to the direction in which the wiring CONTEXT extends can be used for the inverter 103 in the odd-numbered stage and the inverter 103 in the even-numbered stage. Therefore, it is effective to increase the channel width of a transistor included in the inverter 103 in the direction parallel to the direction in which the wiring CONTEXT extends.

Figure 3:
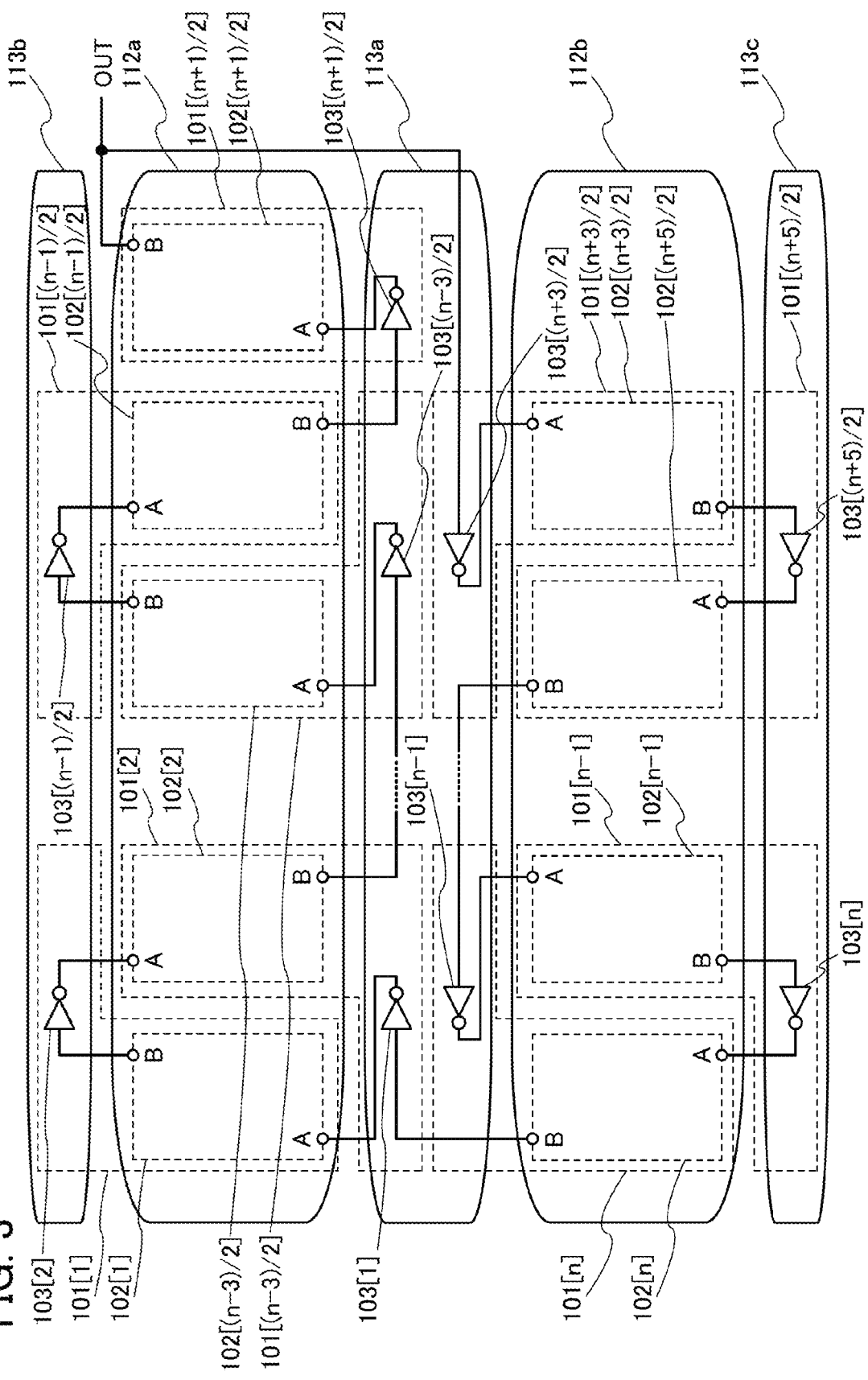
FIG. 3 illustrates a configuration of a device.

In the configuration in FIG. 1, the circuits 101[1] to 101[*n*], the circuits 102[1] to 102[*n*], and the inverters 103[1] to 103 [*n*] are divided and provided in the first region 113*a*, the second region 112*a*, and the third region 113*b*; however the configuration of the semiconductor device described in this embodiment is not limited thereto. For example, as illustrated in FIG. 3, the circuits 101[1] to 101[*n*], the circuits 102[1] to 102[*n*], and the inverters 103[1] to 103[*n*] may be divided and provided in the first region 113*a*, the second region 112*a*, the third region 113*b*, a fourth region 112*b*, and a fifth region 113*c*. Note that FIG. 1 can be referred to for detailed configuration of the circuit 102, which is omitted in FIG. 3.

Here, the inverter 103[$k_3$] ($k_3$ is an odd number greater than or equal to 1 and less than or equal to (n+1)/2) and the inverter 103 [$k_4$] ($k_4$ is an even number greater than or equal to (n+3)/2 and less than or equal to n−1) are provided in the first region 113*a*. The inverter 103[$k_5$] ($k_5$ is an even number greater than or equal to 2 and less than or equal to (n−1)/2) is provided in the third region 113*b*. The inverter 103 [$k_6$] ($k_6$ is an odd number greater than or equal to (n+5)/2 and less than or equal to n) is provided in the fifth region 113*c*. The circuit 102[$k_7$] ($k_7$ is a natural number greater than or equal to 1 and less than or equal to (n+1)/2) is provided in the second region 112*a*. The circuit 102[$k_8$] ($k_8$ is a natural number greater than or equal to (n+3)/2 and less than or equal to n) is provided in the fourth region 112*b*.

On the substrate plane, the second region 112*a* is positioned between the first region 113*a* and the third region 113*b*, and the fourth region 112*b* is positioned between the first region 113*a* and the fifth region 113*c*.

As in the configuration in FIG. 1, such a positional relation between the circuits 101, the circuits 102 and the inverters 103 enables the wirings of the circuits 102 to be provided according to the formula (1) without extension or addition of a wiring. Accordingly, the semiconductor device in FIG. 3 can have improved accuracy of oscillation frequency, while an increase in area is suppressed.

Moreover, as in the configuration in FIG. 1, the circuit 101 in an odd-numbered stage and the circuit 101 in an even-numbered stage are preferably provided in pairs. Accordingly, a space corresponding to the width of the circuit 102 in the odd-numbered stage and the width of the circuit 102 in the even-numbered stage in the direction (row direction) parallel to the direction in which the wiring CONTEXT extends can be used for the inverter 103 in the odd-numbered stage and the inverter 103 in the even-numbered stage. Therefore, it is effective to increase the channel width of a transistor included in the inverter 103 in the direction parallel to the direction in which the wiring CONTEXT extends.

Note that as the proportion of the resistance of the transistor 106 in the resistance between the terminal A and the terminal B is increased, the amount of change in oscillation frequency with respect to the resistance between the source and the drain of the transistor 106 can be increased. Thus, the channel width (W) of the transistor 106 is preferably smaller than the W of the transistor 107. Alternatively, the W of the transistor 106 is preferably smaller than the W of one or all transistors included in the inverter 103 or in a circuit which can be employed instead of the inverter 103.

As described above, a NAND circuit, a NOR circuit, or the like may be employed instead of the inverter 103. An output terminal of the NAND circuit or the NOR circuit corresponds to the output terminal of the inverter 103, and a first input terminal of the NAND circuit or the NOR circuit corresponds to the input terminal of the inverter 103. That is, the output terminal of the NAND circuit or the NOR circuit is connected to the terminal A of the circuit 102, and the first input terminal of the NAND circuit or the NOR circuit is connected to the terminal B of the circuit 102 in the previous stage. In the circuits 101[1] to 101[n], second input terminals of the NAND circuits or the NOR circuits are preferably connected to the same wiring. By controlling the potential of the wiring to which the second input terminal of the NAND circuit or the NOR circuit is connected, the potential of the terminal A of the circuit 102 can be fixed. As a result, the potential of the wiring BL can be input to the gate of the transistor 106 with the potential of the first terminal of the transistor 106 fixed; therefore, the potential difference between the gate and the source of the transistor 106 can be set accurately. Accordingly, the resistance between the source and the drain of the transistor 106 can be set accurately.

The above configuration of the semiconductor device described in this embodiment can be provided as a novel circuit configuration. In the semiconductor device described in this embodiment, the oscillation frequency can be changed, or a circuit configuration capable of achieving the change can be provided. In the semiconductor device described in this embodiment, the accuracy of oscillation frequency can be improved, or a circuit configuration capable of achieving the improvement can be provided.

Figure 4:
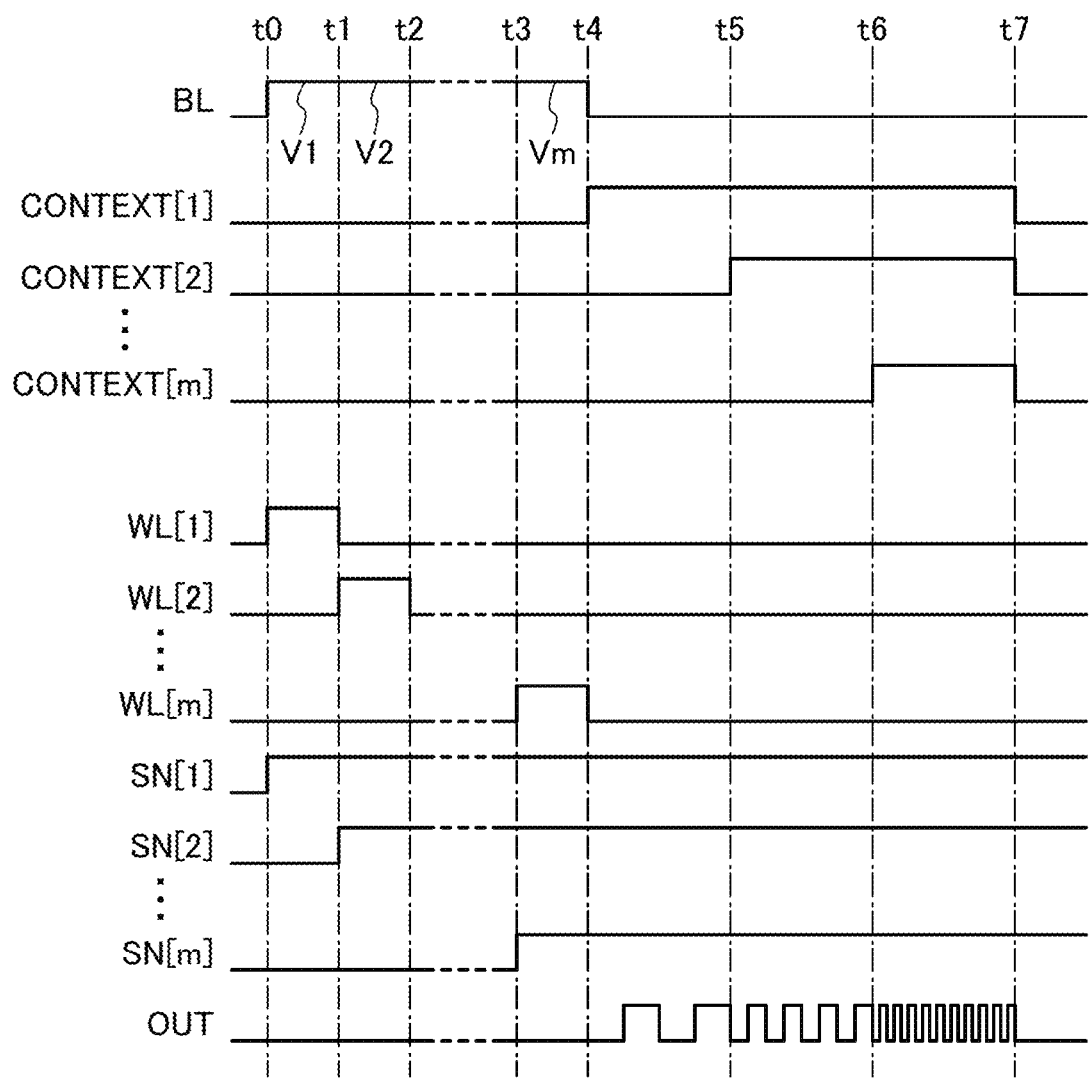
FIG. 4 illustrates an operation of a device.

Next, an example of the operation of the device in FIG. 1 will be described with reference to a timing chart in FIG. 4. FIG. 4 illustrates examples of the potentials of the wiring BL, the wirings CONTEXT[1] to CONTEXT[m], the wirings WL[1] to WL[m], the nodes SN of the circuits 104[1] to 104[m], and the output terminal OUT.

Note that the circuits 101[1] to 101[n] operate in the same manner; therefore, only the operation of one of the circuits 101[1] to 101[n] will be described.

First, data is stored in each of the circuits 104[1] to 104[m], and the resistance between the source and the drain of the transistor 106 is set in accordance with the data.

At time t0, the wiring WL[1] is set at the high level, and the wiring BL is set at a potential $V_1$. Thus, the circuit 104[1] operates as follows. Since the transistor 105 is turned on, the potential $V_1$ of the wiring BL is input to the node SN through the transistor 105, and charge based on the potential $V_1$ is accumulated in the capacitor 108. After that, the wiring WL[1] is set at the low level, and the transistor 105 is thus turned off. Therefore, the node SN is kept at the potential $V_1$ owing to the charge accumulated in the capacitor 108. In this manner, data based on the potential $V_1$ is stored in the circuit 104[1].

At time t1, the wiring WL[2] is set at the high level, and the wiring BL is set at a potential $V_2$. Thus, the circuit 104[2] operates as follows. Since the transistor 105 is turned on, the potential $V_2$ of the wiring BL is input to the node SN through the transistor 105, and charge based on the potential $V_2$ is accumulated in the capacitor 108. After that, the wiring WL[2] is set at the low level, and the transistor 105 is thus turned off. Therefore, the node SN is kept at the potential $V_2$ owing to the charge accumulated in the capacitor 108. In this manner, data based on the potential $V_2$ is stored in the circuit 104[2].

At and after time t2, the wirings WL[3] to WL[m−1] are sequentially set at the high level, while the wiring BL is set at an appropriate potential at the timing at which the wiring WL is set at the high level, so that data based on the potential of the wiring BL is stored in the circuits 104[3] to 104[m−1].

At time t3, the wiring WL[m] is set at the high level, and the wiring BL is set at a potential $V_m$. Thus, the circuit 104[m] operates as follows. Since the transistor 105 is turned on, the potential $V_m$ of the wiring BL is input to the node SN through the transistor 105, and charge based on the potential $V_m$ is accumulated in the capacitor 108. After that, the wiring WL[m] is set at the low level, and the transistor 105 is thus turned off. Therefore, the node SN is kept at the potential $V_m$ owing to the charge accumulated in the capacitor 108. In this manner, data based on the potential $V_m$ is stored in the circuit 104[m].

In the above-described manner, the wirings WL[1] to WL[m] are sequentially set at the high level, and the potential of the wiring BL is set as appropriate, so that data based on the potential of the wiring BL can be sequentially stored in the circuits 104[1] to 104[m].

From time t0 to t4, the wirings CONTEXT[1] to CONTEXT[m] may be set at the high level or the low level. That is, the transistor 107 of each of the circuits 104[1] to 104[m] may be in either an on state or an off state. FIG. 4 illustrates an example in which the wirings CONTEXT[1] to CONTEXT[m] are set at the low level from time t0 to t4, so that the transistors 107 of the circuits 104[1] to 104[m] are in an off state. Accordingly, in each of the circuits 104[1] to 104[m], the terminal C and the terminal D are electrically disconnected from each other, and thus, the impedance between the terminal A and the terminal B of the circuit 102 is high. Therefore, the device in FIG. 1 does not oscillate from time t0 to t4. Furthermore, when the transistors 107 of the circuits 104[1] to 104[m] are turned off, the terminal B is brought into a floating state. Accordingly, the potential of the terminal B gradually changes to a predetermined potential such as a ground potential. For example, in the case where the potential of the terminal B is a potential corresponding to the low level, a high level potential is output from the inverter 103 in the next stage. That is, the potential of the terminal A can be fixed. As a result, the potential of the wiring BL can be input to the gate of the transistor 106 with the potential of the first terminal of the transistor 106 fixed; therefore, the potential difference between the gate and the source of the transistor 106 can be set accurately.

Accordingly, the resistance between the source and the drain of the transistor 106 can be set accurately.

Note that FIG. 4 illustrates an example in which the potentials $V_1$ to $V_m$ have the same value. However, one embodiment of the present invention is not limited to this example.

Note that the potential of the wiring BL which is stored in the circuit 104[*j*] is referred to as a potential $V_j$.

Although FIG. 4 illustrates an example in which the wirings WL[1] to WL[m] are sequentially set at the high level, the operation is not limited thereto. The wirings WL[1] to WL[m] may be set at the high level in a given order. Two or more of the wirings WL[1] to WL[m] may be set at the high level at the same time. Not all the wirings WL[1] to WL[m] need to be set at the high level. It is also possible to combine the above conditions.

Although FIG. 4 illustrates an example in which the wirings WL[1] to WL[m] are set at the high level to turn on the transistors 105, the operation is not limited thereto. The wirings WL[1] to WL[m] may be set at the low level to turn on the transistors 105. The potentials of the wirings WL[1] to WL[m] at which the transistors 105 are turned on may be called "active", and the potentials of the wirings WL[1] to WL[m] at which the transistors 105 are turned off may be called "non-active" (or "inactive"). Similarly, the potentials of the wirings CONTEXT[1] to CONTEXT[m] at which the transistors 107 are turned on may be called "active", and the potentials of the wirings CONTEXT[1] to CONTEXT[m] at which the transistors 107 are turned off may be called "non-active".

Subsequently, the conduction/non-conduction between the terminal C and the terminal D is controlled in each of the circuits 104[1] to 104[*m*], whereby the resistance between the terminal A and the terminal B of the circuit 102 is changed. Then, in accordance with the resistance between the terminal A and the terminal B of the circuit 102, the frequency of a signal from the terminal OUT is changed.

At time t4, the wiring CONTEXT[1] is set at the high level, and the wirings CONTEXT[2] to CONTEXT[m] are set at the low level. Accordingly, the transistor 107 of the circuit 104[1] is turned on, so that the resistance between the terminal C and the terminal D becomes a value based on the resistance between the source and the drain of the transistor 106. That is, the resistance between the terminal C and the terminal D of the circuit 104[1] becomes a value based on the stored data. On the other hand, the transistor 107 of each of the circuits 104[2] to 104[*m*] is turned off, so that the terminal C and the terminal D are electrically disconnected from each other. Thus, the frequency of the signal from the terminal OUT is determined in accordance with the data stored in the circuit 104[1].

At time t5, the wirings CONTEXT[1] and CONTEXT[2] are set at the high level, and the wirings CONTEXT[3] to CONTEXT[m] are set at the low level. Accordingly, the transistor 107 of each of the circuits 104[1] and 104[2] is turned on, so that the resistance between the terminal C and the terminal D becomes a value based on the resistance between the source and the drain of the transistor 106. That is, the resistance between the terminal C and the terminal D of each of the circuits 104[1] and 104[2] becomes a value based on the stored data. On the other hand, the transistor 107 of each of the circuits 104[3] to 104[*m*] is turned off, so that the terminal C and the terminal D are electrically disconnected from each other. Thus, the frequency of the signal from the terminal OUT is determined in accordance with the data stored in the circuits 104[1] and 104[2].

At time t4, the electrical connection between the terminal C and the terminal D is established in one of the circuits 104[1] to 104[*m*], whereas at time t5, the electrical connection between the terminal C and the terminal D is established in two of the circuits 104[1] to 104[*m*]. Therefore, the resistance between the terminal A and the terminal B of the circuit 102 is set lower at time t5 than at time t4; accordingly, the frequency of the signal from the terminal OUT determined at time t5 is higher than that determined at time t4.

At time t6, the wirings CONTEXT[1] to CONTEXT[m] are set at the high level. Accordingly, the transistor 107 of each of the circuits 104[1] to 104[*m*] is turned on, so that the resistance between the terminal C and the terminal D becomes a value based on the resistance between the source and the drain of the transistor 106. That is, the resistance between the terminal C and the terminal D of each of the circuits 104[1] to 104[*m*] becomes a value based on the stored data. Thus, the frequency of the signal from the terminal OUT is determined in accordance with the data stored in the circuits 104[1] to 104[*m*].

At time t4, the electrical connection between the terminal C and the terminal D is established in one of the circuits 104[1] to 104[*m*], and at time t5, the electrical connection between the terminal C and the terminal D is established in two of the circuits 104[1] to 104[*m*], whereas at time t6, the electrical connection between the terminal C and the terminal D is established in m circuits of the circuits 104[1] to 104[*m*]. Therefore, the resistance between the terminal A and the terminal B of the circuit 102 is set lower at time t6 than at time t4 and at time t5; accordingly, the frequency of the signal from the terminal OUT determined at time t6 is higher than that determined at time t4 and that determined at time t5.

In the above-described manner, the frequency of the signal from the terminal OUT can be changed in accordance with the number of circuits which are selected from the circuits 104[1] to 104[*m*] and in which the electrical connection between the terminal C and the terminal D is established.

Although FIG. 4 illustrates an example in which the potentials $V_1$ to $V_m$ of the wiring BL have the same value, i.e., an example in which the same data is stored in the circuits 104[1] to 104[*m*], the operation is not limited thereto. For example, the potentials $V_1$ to $V_m$ of the wiring BL may have different values. That is, different data sets may be stored in the circuits 104[1] to 104[*m*]. Alternatively, at least two of the potentials $V_1$ to $V_m$ of the wiring BL may have different values. That is, different data sets may be stored in at least two of the circuits 104[1] to 104[*m*].

Figure 5:
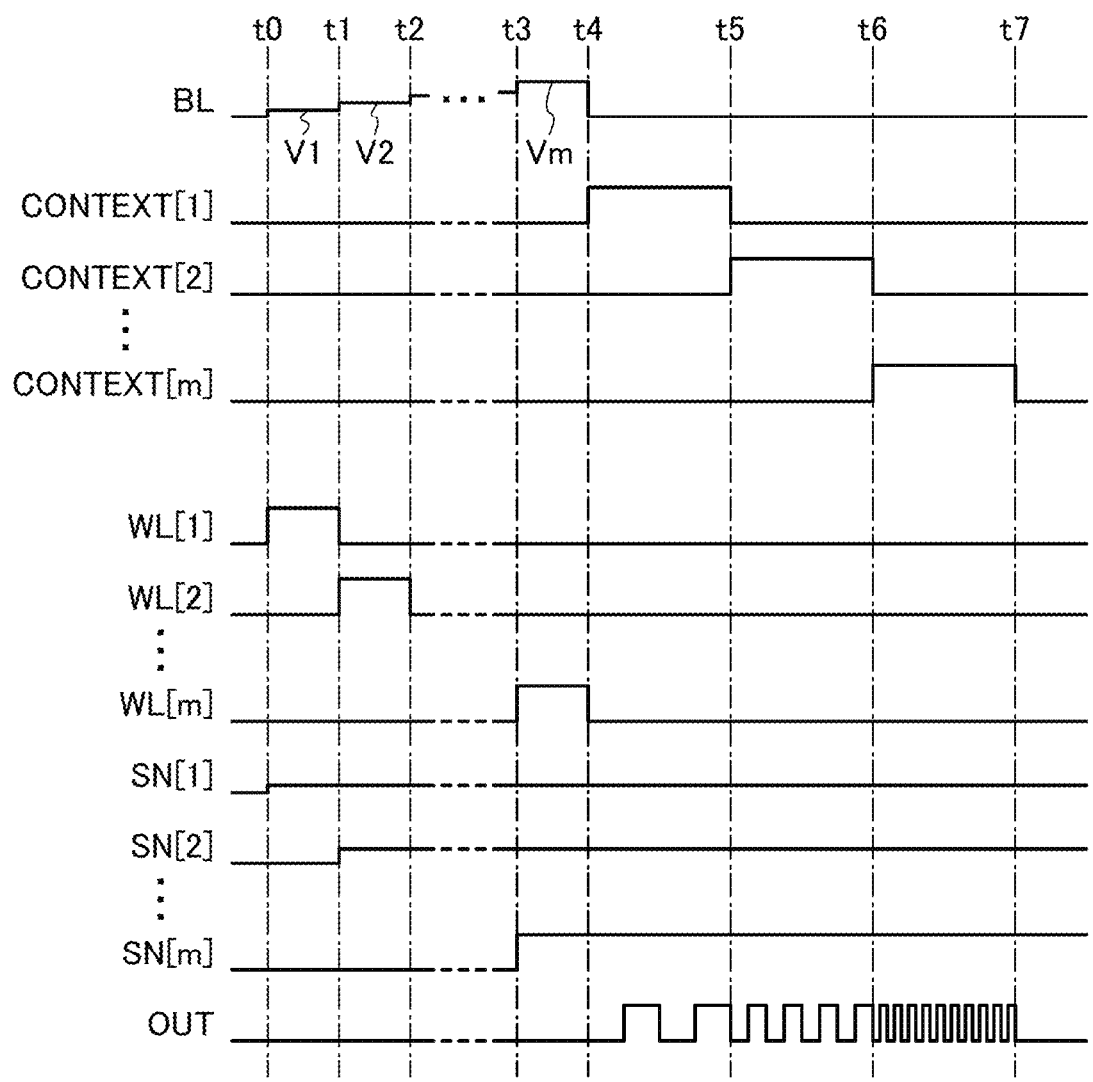
FIG. 5 illustrates an operation of a device.

FIG. 5 illustrates an example in which the potential of the wiring BL rises every time one of the wirings WL[1] to WL[m] is set at the high level. The potentials $V_1$ to $V_m$ are in the following relation: the potential $V_j$ is higher than the potential $V_{j-1}$ and lower than the potential $V_{j+1}$; for example, the potential $V_2$ is higher than the potential $V_1$, and the potential $V_m$ is higher than the potential $V_{m-1}$.

FIG. 5 illustrates an example in which the wiring CONTEXT[1] is set at the high level at time t4, the wiring CONTEXT[2] is set at the high level at time t5, and the wiring CONTEXT[m] is set at the high level at time t6. In other words, at time t4, the frequency of the signal from the terminal OUT is determined in accordance with the data stored in the circuit 104[1]; at time t5, in accordance with the data stored in the circuit 104[2]; and at time t6, in accordance with the data stored in the circuit 104[*m*].

Since the potential $V_2$ is higher than the potential $V_1$, the resistance between the source and the drain of the transistor 106 is lower in the circuit 104[2] than in the circuit 104[1]. Therefore, the resistance between the terminal A and the terminal B of the circuit 102 is set lower at time t5 than at time t4; accordingly, the frequency of the signal from the terminal OUT determined at time t5 is higher than that determined at time t4.

Since the potential $V_m$ is higher than the potential $V_1$ and the potential $V_2$, the resistance between the source and the drain of the transistor 106 is lower in the circuit 104[$m$] than in the circuit 104[1] and in the circuit 104[2]. Therefore, the resistance between the terminal A and the terminal B of the circuit 102 is set lower at time t6 than at time t4 and at time t5; accordingly, the frequency of the signal from the terminal OUT determined at time t6 is higher than that determined at time t4 and that determined at time t5.

In the above-described manner, the frequency of the signal from the terminal OUT can be changed in accordance with the data stored in a circuit which is selected from the circuits 104[1] to 104[$m$] and in which the electrical connection between the terminal C and the terminal D is established.

Figure 6:
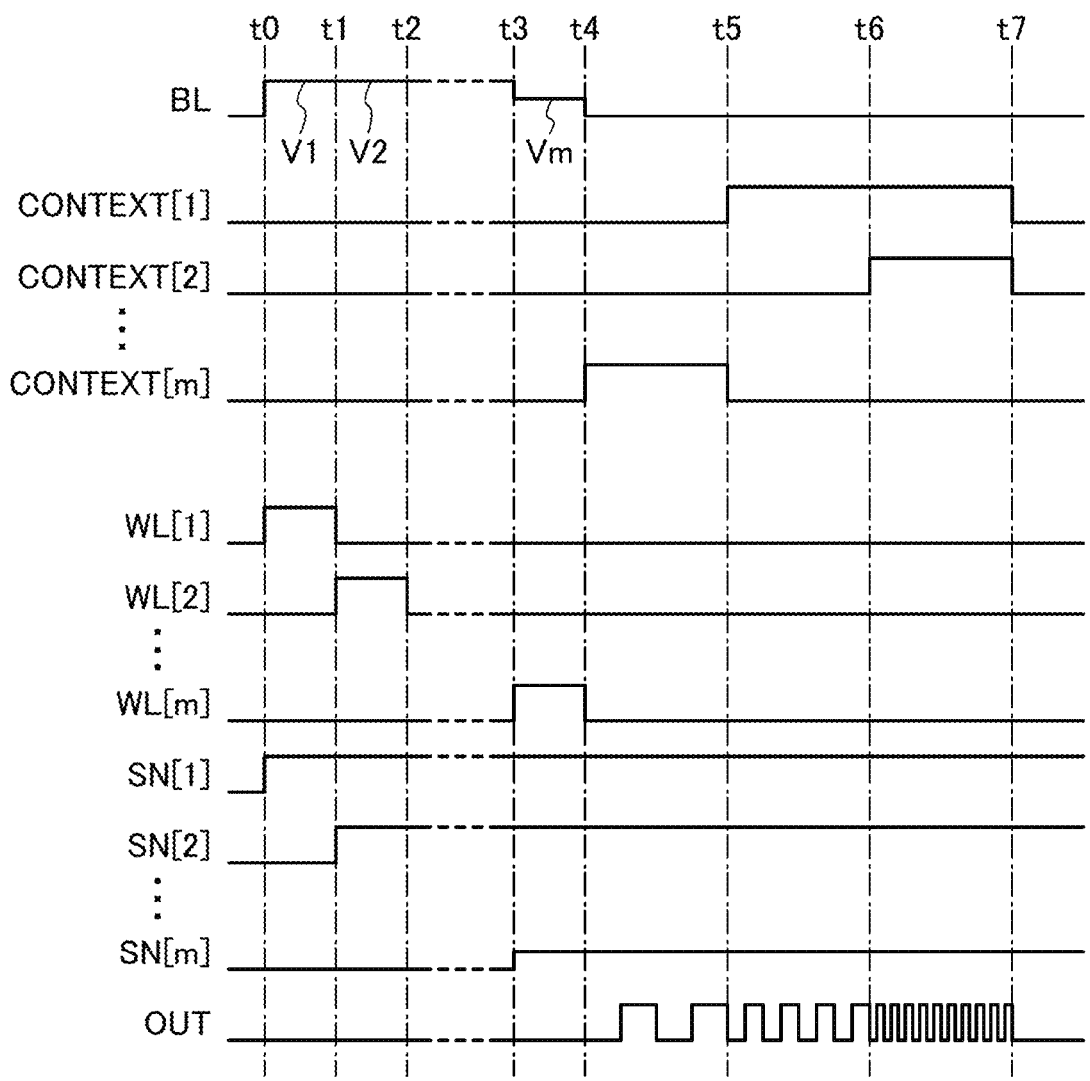
FIG. 6 illustrates an operation of a device.

FIG. 6 illustrates an example in which the potentials $V_1$ to $V_{m-1}$ have the same value and the potential $V_m$ is lower than the potentials $V_1$ to $V_{m-1}$.

FIG. 6 illustrates an example in which the wiring CONTEXT[m] is set at the high level at time t4, the wiring CONTEXT[1] is set at the high level at time t5, and the wirings CONTEXT[1] and CONTEXT[2] are set at the high level at time t6. In other words, at time t4, the frequency of the signal from the terminal OUT is determined in accordance with the data stored in the circuit 104[$m$]; at time t5, in accordance with the data stored in the circuit 104[1]; and at time t6, in accordance with the data stored in the circuits 104[1] and 104[2].

Since the potential $V_1$ is higher than the potential $V_m$, the resistance between the source and the drain of the transistor 106 is lower in the circuit 104[1] than in the circuit 104[$m$]. Therefore, the resistance between the terminal A and the terminal B of the circuit 102 is set lower at time t5 than at time t4; accordingly, the frequency of the signal from the terminal OUT determined at time t5 is higher than that determined at time t4.

At time t5, the electrical connection between the terminal C and the terminal D is established in the circuit 104[1], whereas at time t6, the electrical connection between the terminal C and the terminal D is established in the circuits 104[1] and 104[2]. Therefore, the resistance between the terminal A and the terminal B of the circuit 102 is set lower at time t6 than at time t5; accordingly, the frequency of the signal from the terminal OUT determined at time t6 is higher than that determined at time t5.

In the above-described manner, the operations illustrated in FIG. 4 and FIG. 5 may be combined.

Figure 7:
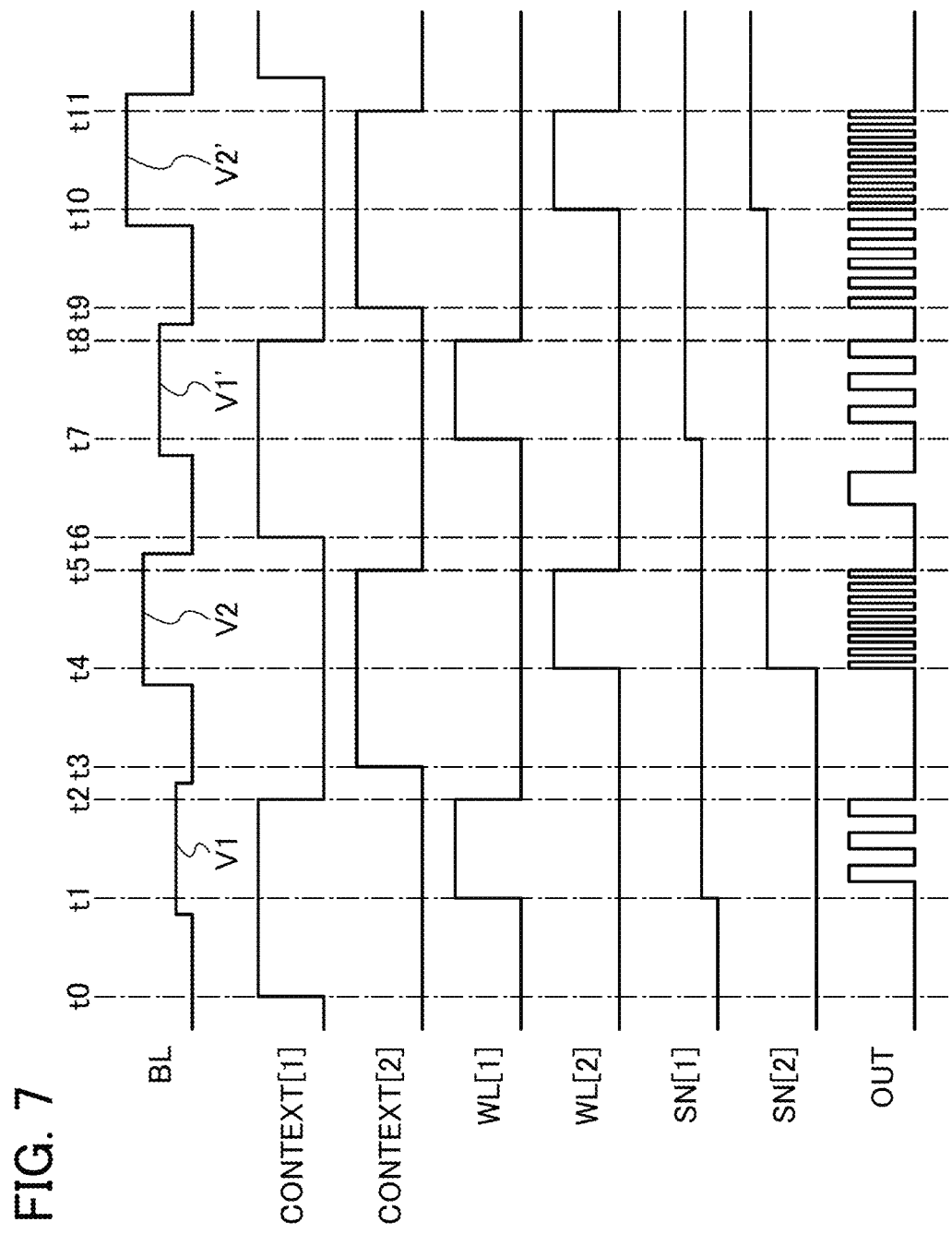
FIG. 7 illustrates an operation of a device.

Next, a method for storing data in the circuits 104[1] to 104[$m$] so that the frequency of the signal from the terminal OUT is accurately set will be described with reference to FIG. 7.

For convenience, the case where m is 2 will be described. That is, the circuit 102 includes the circuit 104[1] and the circuit 104[2].

In the initial state, data is stored neither in the circuit 104[1] nor in the circuit 104[2]. In other words, in each of the circuits 104[1] and 104[2], the potential of the node SN is set to a potential at which the transistor 106 is turned off.

At time t0, the wiring CONTEXT[1] is set at the high level. Accordingly, the transistor 107 of the circuit 104[1] is turned on. Note that the terminal C and the terminal D are electrically disconnected from each other because the transistor 106 is in an off state. Therefore, the device in FIG. 1 does not oscillate.

At time t1, the wiring WL[1] is set at the high level, and the wiring BL is set at the potential $V_1$. Accordingly, the transistor 105 of the circuit 104[1] is turned on, the potential $V_1$ of the wiring BL is thus input to the node SN through the transistor 105, and charge based on the potential $V_1$ is accumulated in the capacitor 108. Thus, the resistance between the source and the drain of the transistor 106 becomes a value based on the potential $V_1$. Furthermore, since the transistor 107 of the circuit 104[1] is in an on state, the device in FIG. 1 oscillates and the frequency of the signal from the terminal OUT becomes $f(V_1)$.

At time t2, the wiring CONTEXT[1] is set at the low level. Accordingly, the transistor 107 of the circuit 104[1] is turned off. As a result, the device in FIG. 1 stops oscillating.

At time t3, the wiring CONTEXT[2] is set at the high level. Accordingly, the transistor 107 of the circuit 104[2] is turned on. Note that the terminal C and the terminal D are electrically disconnected from each other because the transistor 106 is in an off state. Therefore, the device in FIG. 1 does not oscillate.

At time t4, the wiring WL[2] is set at the high level, and the wiring BL is set at the potential $V_2$. Accordingly, the transistor 105 of the circuit 104[2] is turned on, the potential $V_2$ of the wiring BL is thus input to the node SN through the transistor 105, and charge based on the potential $V_2$ is accumulated in the capacitor 108. Thus, the resistance between the source and the drain of the transistor 106 becomes a value based on the potential $V_2$. Furthermore, since the transistor 107 of the circuit 104[2] is in an on state, the device in FIG. 1 oscillates and the frequency of the signal from the terminal OUT becomes $f(V_2)$.

At time t5, the wiring CONTEXT[2] is set at the low level. Accordingly, the transistor 107 of the circuit 104[2] is turned off. As a result, the device in FIG. 1 stops oscillating.

At time t6, the wiring CONTEXT[1] is set at the high level. Accordingly, the transistor 107 of the circuit 104[1] is turned on. As a result, the device in FIG. 1 oscillates. Note that since the transistor 106 of the circuit 104[2] is in an on state at time t6, the load between the terminal A and the terminal B of the circuit 102 is increased as compared with that at time t1. Therefore, the frequency of the signal from the terminal OUT at time t6 is lower than that at time t1, i.e., $f(V_1)$.

At time t7, the wiring WL[1] is set at the high level, and the wiring BL is set at a potential $V_1'$. Accordingly, the transistor 105 of the circuit 104[1] is turned on, the potential $V_1'$ of the wiring BL is thus input to the node SN through the transistor 105, and charge based on the potential $V_1'$ is accumulated in the capacitor 108. Thus, the resistance between the source and the drain of the transistor 106 becomes a value based on the potential $V_1'$. Furthermore, since the transistor 107 of the circuit 104[1] is in an on state, the device in FIG. 1 oscillates. Here, the potential $V_1'$ has a value for setting the frequency of the signal from the terminal OUT to $f(V_1)$ at time t7 and is higher than the potential $V_1$. Therefore, the frequency of the signal from the terminal OUT is substantially equal to $f(V_1)$.

At time t8, the wiring CONTEXT[1] is set at the low level. Accordingly, the transistor 107 of the circuit 104[1] is turned off. As a result, the device in FIG. 1 stops oscillating.

At time t9, the wiring CONTEXT[2] is set at the high level. Accordingly, the transistor 107 of the circuit 104[2] is turned on. As a result, the device in FIG. 1 oscillates. Note that the potential of the node SN of the circuit 104[1] is higher at time t9 than at time t4. That is, the resistance between the source and the drain of the transistor 106 of the circuit 104[1] is lower at time t9 than at time t4. In other words, the gate capacitance of the transistor 106 of the circuit 104[1] is higher at time t9 than at time t4. Consequently, the load between the terminal A and the terminal B of the circuit 102 at time t9 is increased as compared with that at time t4. Therefore, the frequency of the signal from the terminal OUT at time t9 is lower than that at time t4, i.e., $f(V_2)$.

At time t10, the wiring WL[2] is set at the high level, and the wiring BL is set at a potential $V_2'$. Accordingly, the transistor 105 of the circuit 104[2] is turned on, the potential $V_2'$ of the wiring BL is thus input to the node SN through the transistor 105, and charge based on the potential $V_2'$ is accumulated in the capacitor 108. Thus, the resistance between the source and the drain of the transistor 106 becomes a value based on the potential $V_2'$. Furthermore, since the transistor 107 of the circuit 104[2] is in an on state, the device in FIG. 1 oscillates. Here, the potential $V_2'$ has a value for setting the frequency of the signal from the terminal OUT to $f(V_2)$ at time t10 and is higher than the potential $V_2$. Therefore, the frequency of the signal from the terminal OUT is substantially equal to $f(V_2)$.

At time t11, the wiring CONTEXT[2] is set at the low level. Accordingly, the transistor 107 of the circuit 104[2] is turned off. As a result, the device in FIG. 1 stops oscillating.

Subsequently, the operations from time t6 to t11 are repeated; consequently, the frequency of the signal from the terminal OUT in the case where the wiring CONTEXT[1] is set at the high level can converge on $f(V_1)$, and that in the case where the wiring CONTEXT[2] is set at the high level can converge on $f(V_2)$.

The above configuration of the semiconductor device described in this embodiment can be provided as a novel circuit configuration. In the semiconductor device described in this embodiment, the oscillation frequency can be changed, or a circuit configuration capable of achieving the change can be provided. In the semiconductor device described in this embodiment, the accuracy of oscillation frequency can be improved, or a circuit configuration capable of achieving the improvement can be provided.

This embodiment can be implemented in appropriate combination with any of the structures of the other embodiments and the like disclosed in this specification and the like.

Embodiment 2

In this embodiment, a PLL in which the device described in Embodiment 1 is used will be described.

Figure 8:
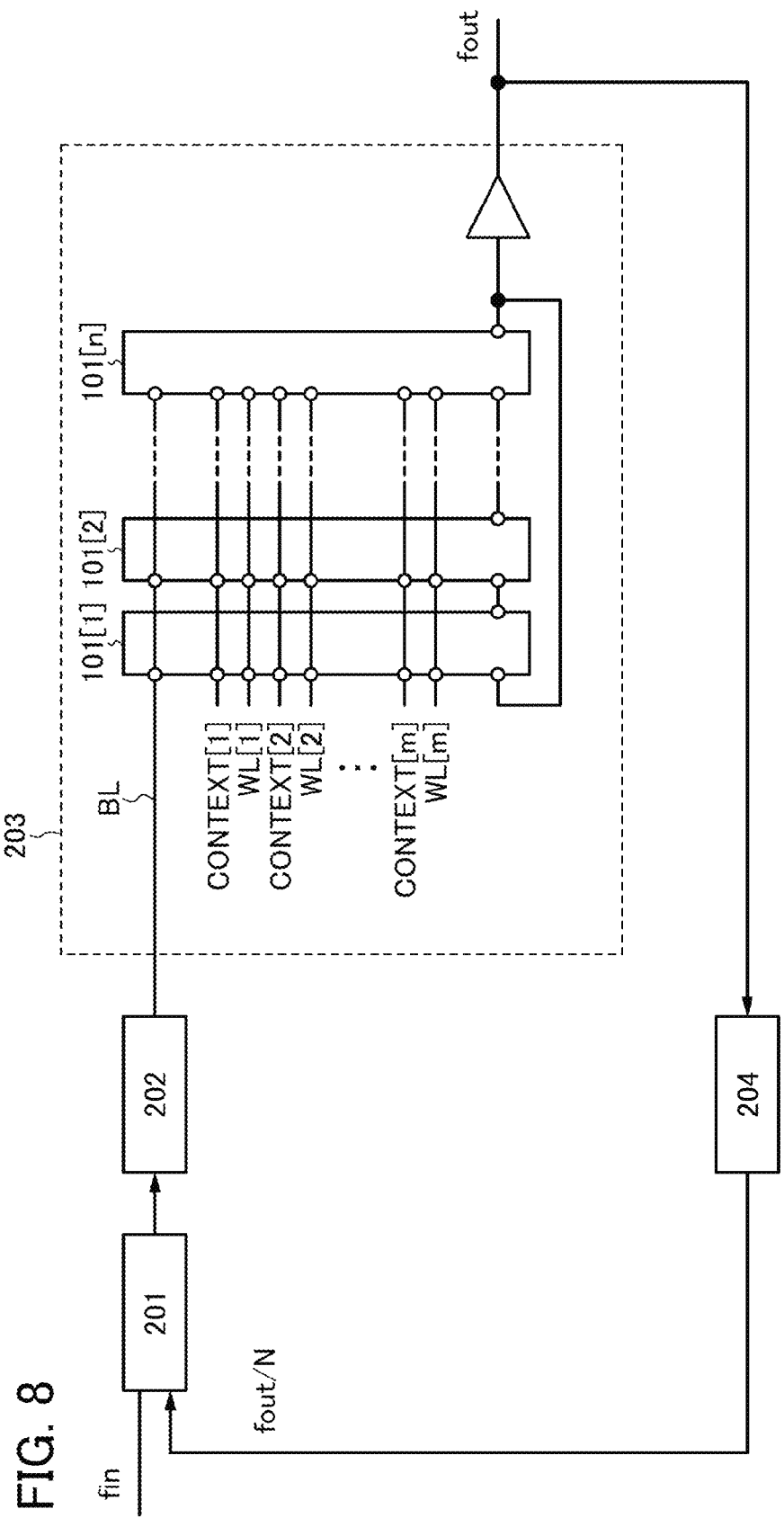
FIG. 8 illustrates a configuration of a PLL.

A PLL illustrated in FIG. 8 includes a phase comparator 201, a loop filter 202, a voltage-controlled oscillator 203, and a frequency divider 204.

The phase comparator 201 has a function of detecting a phase difference between two input signals and outputting a detection result as a voltage signal. That is, the phase comparator 201 has a function of outputting a phase difference between a signal with a frequency $f_{in}$ and a signal with a frequency $f_{out}/N$ as a voltage signal.

The loop filter 202 has a function of generating a direct-current voltage signal DATA which is to be input to the voltage-controlled oscillator 203. In addition, the loop filter 202 has a function of removing a high-frequency component from an output signal of the phase comparator 201. An example of the loop filter 202 is a low-pass filter.

The voltage-controlled oscillator 203 has a function of outputting a clock signal with a particular oscillation frequency depending on DATA. As the voltage-controlled oscillator 203, the device in FIG. 1 can be employed. Note that DATA corresponds to the potential of the wiring BL. Note that the device in FIG. 1 may output a signal through a buffer as illustrated in FIG. 8.

The frequency divider 204 has a function of generating a clock signal with an oscillation frequency which is 1/N times the particular oscillation frequency of the clock signal output from the voltage-controlled oscillator 203.

Note that DATA corresponds to the potential of the wiring BL. In addition, DATA can be controlled by N in the frequency divider 204. In other words, data which is to be stored in the circuits 101[1] to 101[n] of the voltage-controlled oscillator 203 can be controlled by N in the divider 204.

This embodiment can be implemented in appropriate combination with any of the structures of the other embodiments and the like disclosed in this specification and the like.

Embodiment 3

Examples of Plan Structure and Cross-Sectional Structure of Semiconductor Device In this embodiment, examples of the structure of the semiconductor device described in the above embodiment will be described with reference to FIGS. 9A and 9B, FIG. 10, FIGS. 11A to 11C, FIGS. 12A to 12C, FIG. 13 and FIG. 14.

Note that the following structures are just examples for the semiconductor device described in the above embodiment; the specific structure of the semiconductor device, such as a material or a configuration, is not necessarily limited to that described here.

Figure 9A:
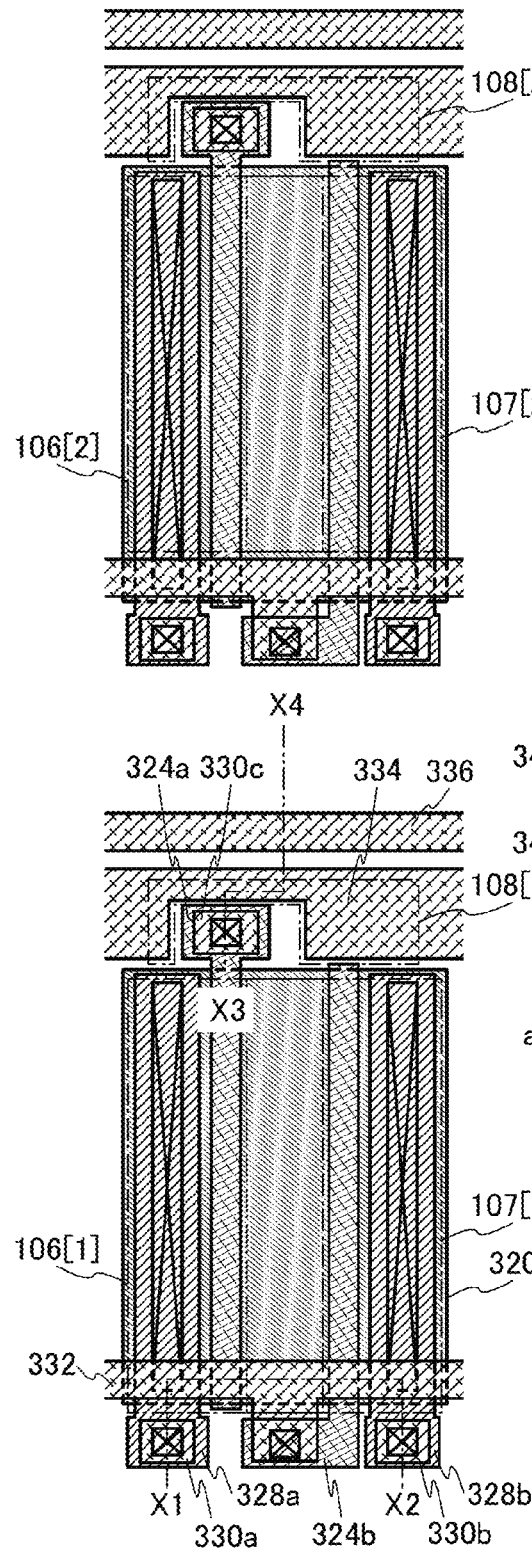
FIGS. 9A and 9B illustrate a plan structure of a device.
Figure 9B:
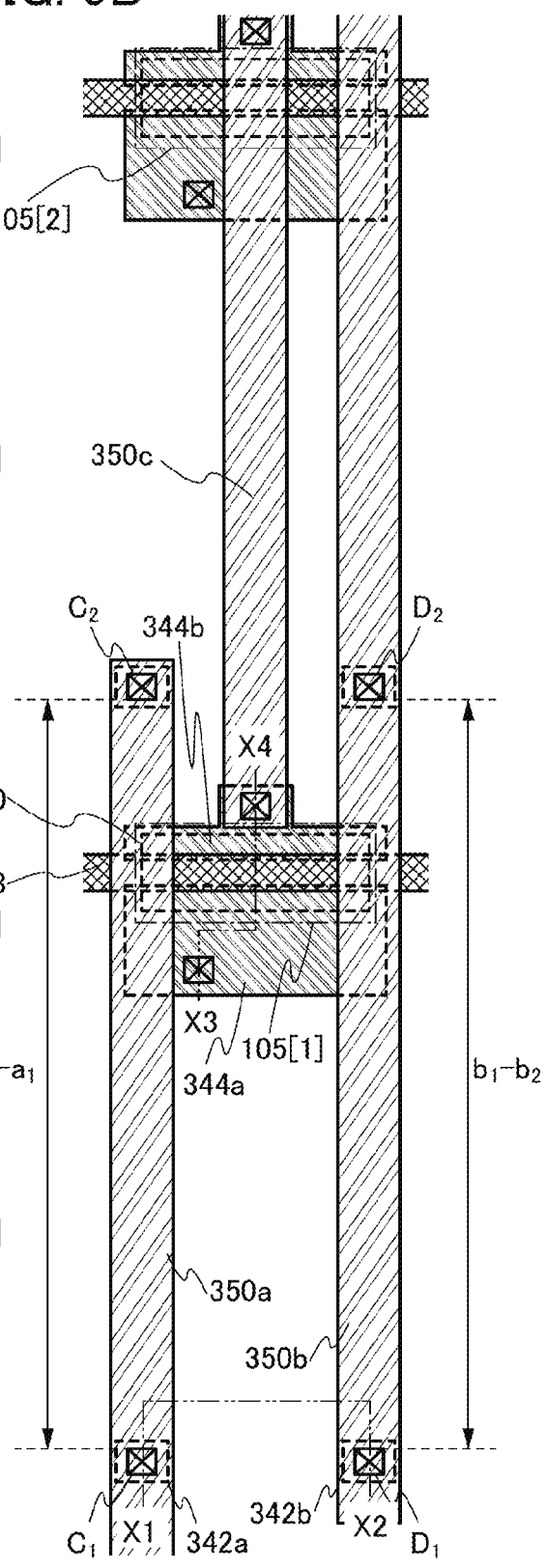
Figure 10:
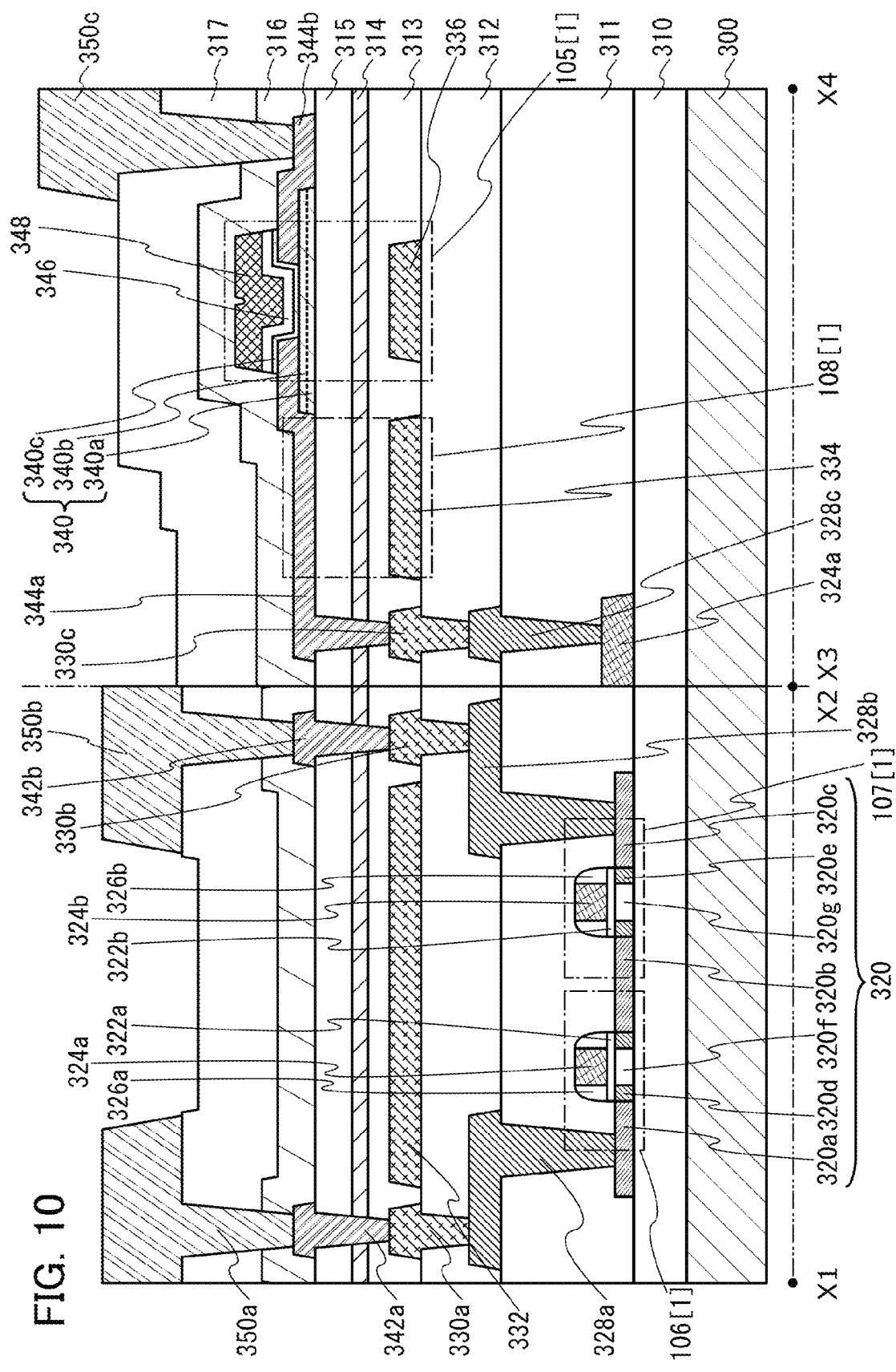
FIG. 10 illustrates a cross-sectional structure of a device.

Examples of the structure of the circuits 104[1] and 104[2] described in the above embodiment with reference to FIG. 1 and FIG. 2 will be described with reference to FIGS. 9A and 9B and FIG. 10, which show the case of m=2. FIGS. 9A and 9B are plan views of the circuits 104[1] and 104[2]. FIG. 10 is a cross-sectional view along the dashed-dotted line X1-X2 and the dashed-dotted line X3-X4 in FIGS. 9A and 9B.

FIG. 9A is a plan view illustrating main components under an insulating film 314 in FIG. 10, and FIG. 9B is a plan view illustrating main components over the insulating film 314 in FIG. 10. In FIGS. 9A and 9B, reference numerals and detailed description of components of the circuit 104[2] which are identical to those of the circuit 104[1] are omitted; the description of the components of the circuit 104[1] can be referred to for such components.

In the semiconductor device in FIGS. 9A and 9B and FIG. 10, as an example, a transistor 106[1] and a transistor 107[1] in each of which a first semiconductor material is used for a channel formation region are formed in the lower portion, and a transistor 105[1] in which a second semiconductor material is used for a channel formation region is formed in the upper portion.

The first semiconductor material and the second semiconductor material preferably have different band gaps. For example, the first semiconductor material can be a semiconductor material (e.g., silicon, germanium, silicon germanium, silicon carbide, or gallium arsenide) other than an oxide semiconductor, and the second semiconductor material can be an oxide semiconductor. A transistor including single crystal silicon, which is a material other than an oxide semiconductor, can operate at high speed easily. On the other hand, a transistor including an oxide semiconductor has a low off-state current.

Note that the semiconductor device of one embodiment of the present invention is not limited thereto; the same semiconductor material may be used for the transistor 105, the transistor 106, and the transistor 107. In this case, the transistor 105, the transistor 106, and the transistor 107 can be formed in the same layer.

The transistor 106[1] and the transistor 107[1] are formed over an insulating film 310 which is formed over a substrate 300.

The transistor 106[1] includes a semiconductor film 320 formed over the insulating film 310, a gate insulating film 322a formed over the semiconductor film 320, a gate electrode 324a provided over the gate insulating film 322a, and sidewall insulating films 326a which are provided over the gate insulating film 322a and in contact with side surfaces of the gate electrode 324a. The transistor 106[1] includes a channel formation region 320f which is in the semiconductor film 320 and overlaps with the gate electrode 324a, and an impurity region 320a and an impurity region 320b are provided with the channel formation region 320f positioned therebetween. The impurity region 320a and the impurity region 320b function as a source region and a drain region of the transistor 106[1]. Furthermore, the semiconductor film 320 preferably includes impurity regions 320d which are between the impurity region 320a and the channel formation region 320f and between the impurity region 320b and the channel formation region 320f and overlap with the sidewall insulating films 326a. The impurity regions 320d preferably function as lightly doped drain (LDD) regions whose impurity concentration is lower than that of the impurity regions 320a and 320b.

The transistor 107[1] includes the semiconductor film 320 formed over the insulating film 310, a gate insulating film 322b formed over the semiconductor film 320, a gate electrode 324b provided over the gate insulating film 322b, and sidewall insulating films 326b which are provided over the gate insulating film 322b and in contact with side surfaces of the gate electrode 324b. The transistor 107[1] includes a channel formation region 320g which is in the semiconductor film 320 and overlaps with the gate electrode 324b, and the impurity region 320b and an impurity region 320c are provided with the channel formation region 320g positioned therebetween. The impurity region 320b and the impurity region 320c function as a source region and a drain region of the transistor 107[1]. Furthermore, the semiconductor film 320 preferably includes impurity regions 320e which are between the impurity region 320b and the channel formation region 320g and between the impurity region 320c and the channel formation region 320g and overlap with the sidewall insulating films 326b. The impurity regions 320e preferably function as LDD regions whose impurity concentration is lower than that of the impurity regions 320b and 320c.

Here, the semiconductor film 320 can be formed using a semiconductor such as silicon, silicon carbide, germanium, or silicon germanium in an amorphous, microcrystalline, polycrystalline, or single crystal state. In the case where the semiconductor film 320 is formed using a thin silicon film, any of the following materials can be used for the thin film: amorphous silicon formed by a sputtering method or a vapor deposition method such as a plasma CVD method, polycrystalline silicon obtained by crystallization of amorphous silicon by treatment such as laser annealing, single crystal silicon obtained by separation of a surface portion of a single crystal silicon wafer by implantation of hydrogen ions or the like into the silicon wafer, and the like.

The insulating film 310 can be formed using, for example, an insulator containing one or more materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. The gate insulating film 322a, the gate insulating film 322b, the sidewall insulating films 326a, and the sidewall insulating films 326b can also be formed using the above insulating film which can be used as the insulating film 310.

As the substrate 300, a single crystal semiconductor substrate or a polycrystalline semiconductor substrate made of silicon or silicon carbide or a compound semiconductor substrate made of silicon germanium can be used.

An insulating substrate may be used as the substrate 300. Examples of the insulating substrate are a glass substrate, a quartz substrate, a plastic substrate, a flexible substrate, an attachment film, paper containing a fibrous material, and a base film. For the glass substrate, barium borosilicate glass, aluminoborosilicate glass, or soda lime glass can be used, for example. For the flexible substrate, a flexible synthetic resin, such as plastics typified by polyethylene terephthalate (PET), polyethylene naphthalate (PEN), and polyether sulfone (PES) or acrylic, can be used, for example. For the attachment film, polypropylene, polyester, polyvinyl fluoride, or polyvinyl chloride can be used, for example. For the base film, polyester, polyamide, polyimide, aramid, epoxy, an inorganic vapor deposition film, or paper can be used, for example.

As an example, this embodiment shows a silicon on insulator (SOI) substrate in which the insulating film 310 is provided over the substrate 300 and the semiconductor film 320 is provided over the insulating film 310; however, the structure is not limited thereto. For example, the transistors may be formed on a semiconductor substrate such as a silicon substrate, a germanium substrate, or a silicon germanium substrate and subjected to element isolation. As an element isolation method, a trench isolation (shallow trench isolation (STI)) method, a local oxidation of silicon (LOCOS) method, or the like can be used. As the substrate 300, a metal substrate, a stainless steel substrate, a substrate including stainless steel foil, a tungsten substrate, a substrate including tungsten foil, or the like may also be used.

The gate electrode 324a and the gate electrode 324b are preferably formed using a metal selected from tantalum, tungsten, titanium, molybdenum, chromium, niobium, and the like, or an alloy material or a compound material containing the metal as its main component. Alternatively, polycrystalline silicon to which an impurity such as phosphorus is added can be used. Alternatively, the gate electrode 324a and the gate electrode 324b may have a stacked-layer structure including a metal nitride film and a film of the above metal. As the metal nitride, tungsten nitride, molybdenum nitride, or titanium nitride can be used. The metal nitride film can increase the adhesiveness of the metal film and prevent separation.

The impurity regions 320a to 320e are formed by adding an impurity element which imparts n-type conductivity or an impurity element which imparts p-type conductivity to the semiconductor film 320. As the impurity element which imparts n-type conductivity, phosphorus (P), arsenic (As), or the like may be used; as the impurity element which imparts p-type conductivity, boron (B), aluminum (Al), or the like may be used.

An insulating film 311 is formed over the transistor 106[1] and the transistor 107[1], and conductive films 328a to 328c are formed over the insulating film 311. The conductive film 328a is connected to the impurity region 320a through an opening provided in the insulating film 311, the conductive film 328b is connected to the impurity region 320c through an opening provided in the insulating film 311, and the conductive film 328c is connected to the gate electrode 324a through an opening provided in the insulating film 311.

Here, the conductive film 328a functions as one of a source electrode and a drain electrode of the transistor 106[1], and the conductive film 328b functions as one of a source electrode and a drain electrode of the transistor 107[1]. Note that neither the transistor 106[1] nor the transistor 107[1] in FIG. 10 appears to have the other of the source electrode and the drain electrode; for convenience, even an element in such a state may be referred to as a transistor. In this case, in description of the connection relation of a transistor, a source region and a source electrode may be collectively referred to as a source electrode, and a drain region and a drain electrode may be collectively referred to as a drain electrode.

The conductive films 328a to 328c preferably have a single-layer structure or a stacked-layer structure of a conductive film containing a low-resistance material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), or cobalt (Co), an alloy of the low-resistance material, or a compound containing such a material as its main component. It is particularly preferable to use a high-melting-point material that has both heat resistance and conductivity, such as tungsten or molybdenum. In addition, the conductive films 328a to 328c are preferably formed using a low-resistance conductive material such as aluminum or copper. The conductive films 328a to 328c are preferably formed using a Cu—Mn alloy, in which case manganese oxide formed at the interface with an insulator containing oxygen has a function of suppressing Cu diffusion. In addition, the conductive films 328a to 328c and the like can be formed by a sputtering method, a CVD method, or the like.

The insulating film 311 can be formed using the above insulating film which can be used as the insulating film 310. Alternatively, for the insulating film 311, an organic resin such as a polyimide resin, a polyamide resin, an acrylic resin, a siloxane resin, an epoxy resin, or a phenol resin can be used.

When the insulating film 311 is formed by a CVD method, the hydrogen content of the insulating film 311 is increased. When heat treatment is performed in the presence of the insulating film 311, the semiconductor film 320 is hydrogenated and dangling bonds are terminated by hydrogen, so that defects in the semiconductor film 320 can be reduced. The dangling bonds in the semiconductor film 320 are terminated in this manner, which leads to an improvement in the reliability of the transistor 106[1] and the transistor 107[1].

An insulating film 312 is formed over the conductive films 328a to 328c and the insulating film 311, and conductive films 330a to 330c, a conductive film 332, a conductive film 334, and a conductive film 336 are formed over the insulating film 312. The conductive film 330a is connected to the conductive film 328a through an opening provided in the insulating film 312, the conductive film 330b is connected to the conductive film 328b through an opening provided in the insulating film 312, and the conductive film 330c is connected to the conductive film 328c through an opening provided in the insulating film 312. Although not illustrated in FIG. 10, in a manner similar to the manner in which the conductive film 330c is electrically connected to the gate electrode 324a, the conductive film 332 is electrically connected to the gate electrode 324b through an opening provided in the insulating films 311 and 312.

Here, the conductive film 332 extends in the row direction in FIG. 9A and functions as the wiring CONTEXT[1] described in the above embodiment. In addition, the conductive film 334 functions as a second terminal of a capacitor 108[1]. Note that the conductive film 334 extends in the row direction in FIG. 9A and also functions as second terminals of the capacitors 108[1] in the circuits 104[1] of the circuits 102[1] to 102[n].

The conductive film 336 functions as a back gate of the transistor 105[1]. The conductive film 336 can control the threshold voltage of the transistor 105[1]. The conductive film 336 may be electrically isolated (floating) or may be supplied with a potential from another wiring. The state of the conductive film 336 can be set as appropriate to control the threshold voltage of the transistor 105[1]. Note that the conductive film 336 extends in the row direction in FIG. 9A and also functions as back gates of the transistors 105[1] in the circuits 104[1] of the circuits 102[1] to 102[n]. In addition, the transistor 105[1] includes at least one gate electrode and is not necessarily provided with the conductive film 336 which functions as a back gate.

The conductive films 330a to 330c, the conductive film 332, the conductive film 334, and the conductive film 336 can be formed using any of the above materials which can be used for the conductive film 328a and the conductive film 328b.

The insulating film 312 can be formed using the above insulating film which can be used as the insulating film 310. Alternatively, for the insulating film 312, an organic resin such as a polyimide resin, a polyamide resin, an acrylic resin, a siloxane resin, an epoxy resin, or a phenol resin can be used.

Note that planarization treatment such as chemical mechanical polishing (CMP) is preferably performed on the insulating film 312 to improve the planarity.

The insulating film 314 is formed over the insulating film 313, and an insulating film 315 is formed over the insulating film 314.

As described above, dangling bonds of silicon have been terminated by hydrogen in the insulating film 311 and the like provided in the vicinity of the semiconductor film 320 of the transistor 106[1] and the transistor 107[1]. However, hydrogen in an insulating film provided in the vicinity of an oxide semiconductor film 340 of the transistor 105[1] acts as a factor for carrier generation in the oxide semiconductor, which might decrease the reliability of the transistor 105[1]. Therefore, it is particularly effective to provide an insulating film having a function of preventing hydrogen diffusion as the insulating film 314, which is positioned between the transistors 106[1] and 107[1] in the lower layer and the transistor 105[1] in the upper layer. The insulating film 314 makes hydrogen remain in the lower layer, thereby improving the reliability of the transistor 106[1] and the transistor 107[1]. In addition, since the insulating film 314 suppresses hydrogen diffusion from the lower layer into the upper layer, the reliability of the transistor 105[1] can also be improved.

The insulating film 314 can be formed using, for example, silicon nitride, silicon nitride oxide, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

The insulating film 315 is preferably formed using an oxide insulating film from which part of oxygen is released by heating. As the oxide insulating film from which part of oxygen is released by heating, an oxide insulating film containing a higher proportion of oxygen than the stoichiometric composition is used. As the insulating film 315, a single layer or a stack containing silicon oxide, silicon oxynitride, silicon nitride oxide, gallium oxide, hafnium oxide, yttrium oxide, aluminum oxide, or aluminum oxynitride can be used.

Note that planarization treatment such as CMP is preferably performed on the insulating film 315 to improve the planarity.

The transistor 105[1] is formed over the insulating film 315. The transistor 105[1] includes the oxide semiconductor film 340 over the insulating film 315, a conductive film 344a and a conductive film 344b which are electrically connected to the oxide semiconductor film 340 and function as a source electrode and a drain electrode, a gate insulating film 346 which is formed over and in contact with the oxide semiconductor film 340, and a gate electrode 348 which overlaps with the oxide semiconductor film 340 with the gate insulating film 346 positioned therebetween. The conductive film 344a also functions as a first terminal of the capacitor 108[1].

Illustrated here is an example in which the oxide semiconductor film 340 includes oxide semiconductor films 340a to 340c which are stacked in this order over the insulating film 315. Note that in one embodiment of the present invention, a single metal oxide film may be used as the oxide semiconductor film 340 of the transistor 105[1].

A conductive film 342a and a conductive film 342b are also formed over the insulating film 315. The conductive film 342a is connected to the conductive film 330a through an opening provided in the insulating films 313 to 315, the conductive film 342b is connected to the conductive film 330b through an opening provided in the insulating films 313 to 315, and the conductive film 344a is connected to the conductive film 330c through an opening provided in the insulating films 313 to 315.

The conductive film 342a, the conductive film 342b, the conductive film 344a, and the conductive film 344b can be formed using any of the above materials which can be used for the conductive film 328a and the conductive film 328b.

The gate insulating film 346 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 346 may be a stack of any of the above materials. The gate insulating film 346 may contain lanthanum (La), nitrogen, zirconium (Zr), or the like as an impurity.

An example of a stacked-layer structure of the gate insulating film 346 will be described. The gate insulating film 346 contains, for example, oxygen, nitrogen, silicon, or hafnium. Specifically, the gate insulating film 346 preferably contains hafnium oxide and silicon oxide or silicon oxynitride. Hafnium oxide has a higher dielectric constant than silicon oxide and silicon oxynitride. Therefore, in the case of using hafnium oxide, the thickness of the gate insulating film 346 can be made larger than that in the case of using silicon oxide; thus, even when the equivalent oxide thickness is 10 nm or less or 5 nm or less, leakage current due to tunneling current can be low. That is, a transistor with a low off-state current can be provided.

Here, the gate electrode 348 extends in the row direction in FIG. 9B and functions as the wiring WL[1] described in the above embodiment.

The gate electrode 348 can be formed using a metal element selected from aluminum, chromium, copper, tantalum, titanium, molybdenum, and tungsten, an alloy containing the metal element as a component, an alloy containing any of these metal elements in combination, or the like. Furthermore, at least one metal element selected from manganese and zirconium may be used. The gate electrode 348 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, or a three-layer structure in which a titanium film, an aluminum film, and a titanium film are stacked in this order can be used. Alternatively, an alloy film or a nitride film in which aluminum and one or more elements selected from titanium, tantalum, tungsten, molybdenum, chromium, neodymium, and scandium are combined may be used.

The gate electrode 348 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure containing the above light-transmitting conductive material and the above metal element.

Note that a transistor including a channel formation region in an oxide semiconductor film and the oxide semiconductor film will be described later in detail.

An insulating film 316 is formed over the transistor 105[1] and the insulating film 315, and an insulating film 317 is formed over the insulating film 316.

The insulating film 316 preferably has a blocking effect against oxygen, hydrogen, water, alkali metal, alkaline earth metal, and the like. The insulating film 316 can be a nitride insulating film, for example. As the nitride insulating film, a silicon nitride film, a silicon nitride oxide film, an aluminum nitride film, an aluminum nitride oxide film, and the like can be given. Instead of the nitride insulating film, an oxide insulating film having a blocking effect against oxygen, hydrogen, water, and the like may be provided. As the oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

An aluminum oxide film is preferably used as the insulating film 316 because it is highly effective in preventing transmission of both oxygen and impurities such as hydrogen and moisture. Furthermore, oxygen contained in the aluminum oxide film can be diffused into the oxide semiconductor film 340.

The insulating film 317 can be formed using the above insulating film which can be used as the insulating film 310.

Conductive films 350a to 350c are formed over the insulating film 317. The conductive film 350a is connected to the conductive film 342a through an opening $C_1$ provided in the insulating films 316 and 317, the conductive film 350b is connected to the conductive film 342b through an opening $D_1$ provided in the insulating films 316 and 317, and the conductive film 350c is connected to the conductive film 344b through an opening provided in the insulating films 316 and 317.

The conductive film 350a extends in the column direction in FIG. 9B and is electrically connected to a source region or a drain region of a transistor 106[2] of the circuit 104[2] through an opening $C_2$ provided in the insulating films 311 to 317. Furthermore, one end of the conductive film 350a extends to the first region 113a in FIG. 1 and is electrically connected to the output terminal of the inverter 103 in the same stage; the other end of the conductive film 350a ends at the contact with the transistor 106[2] through the opening $C_2$ because FIGS. 9A and 9B illustrate the circuit in the case of m=2. That is, the conductive film 350a functions as the wiring between the terminal A and the terminal $C_1$ and between the terminal A and the terminal $C_2$, which is described in the above embodiment.

The conductive film 350b extends in the column direction in FIG. 9B and is electrically connected to a source region or a drain region of a transistor 107[2] of the circuit 104[2] through an opening $D_2$ provided in the insulating films 311 to 317. Furthermore, one end of the conductive film 350b ends at the contact with the transistor 107[1] through the opening $D_1$ because FIGS. 9A and 9B illustrate the circuit in the case of m=2; the other end of the conductive film 350b extends to the third region 113b in FIG. 1 and is electrically connected to the input terminal of the inverter 103 in the next stage. That is, the conductive film 350b functions as the wiring between the terminal $D_1$ and the terminal B and between the terminal $D_2$ and the terminal B, which is described in the above embodiment.

Figure 2:
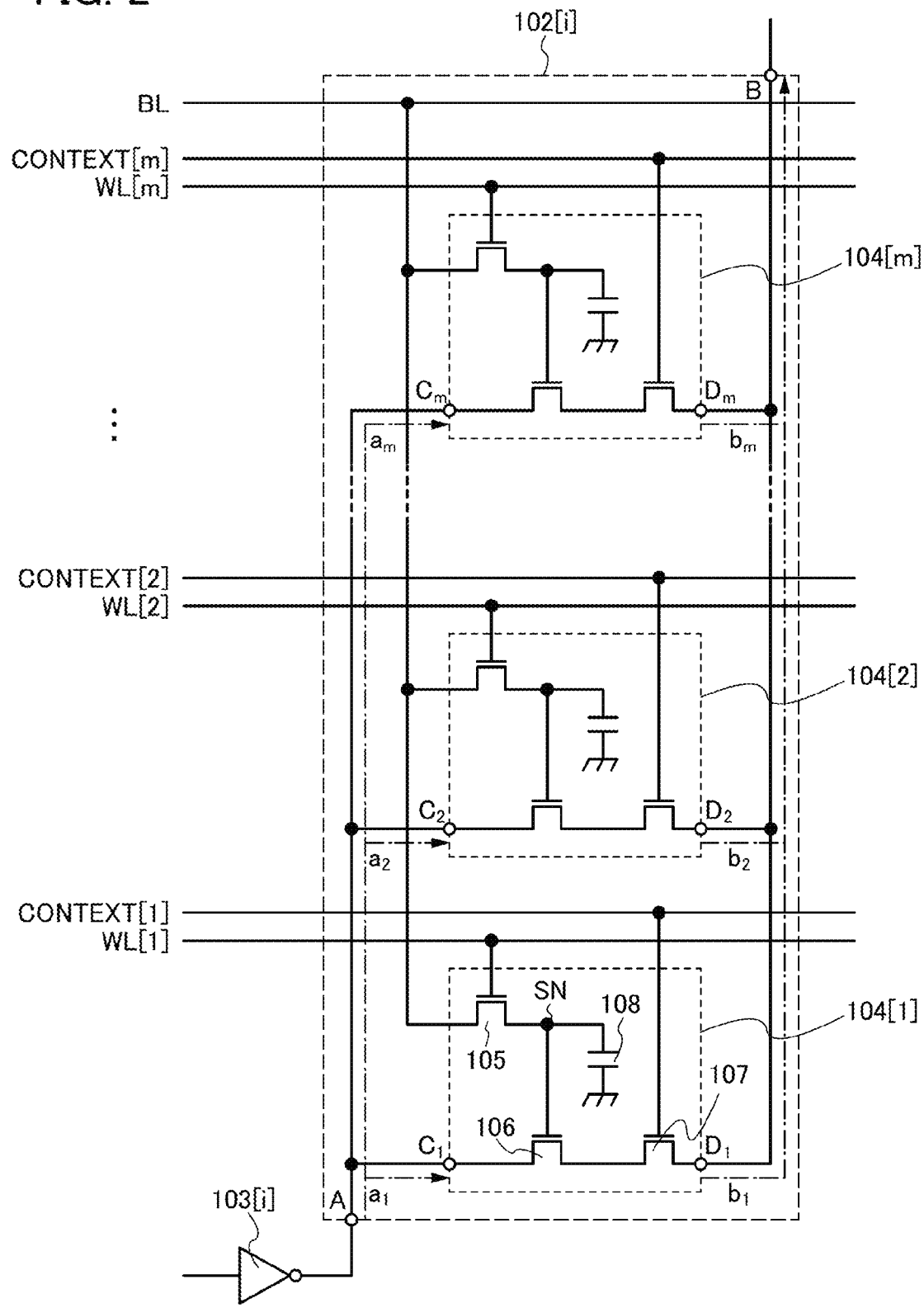
FIG. 2 illustrates a configuration of a device.

Here, the conductive film provided in the opening $C_1$ is electrically connected to the source region or the drain region of the transistor 106[1] and can be regarded as the terminal $C_1$ in FIG. 2. Similarly, the conductive film provided in the opening $C_2$ can be regarded as the terminal $C_2$ in FIG. 2, the conductive film provided in the opening $D_1$ can be regarded as the terminal $D_1$ in FIG. 2, and the conductive film provided in the opening $D_2$ can be regarded as the terminal $D_2$ in FIG. 2.

Accordingly, the distance between the opening $C_1$ and the opening $C_2$ can be regarded as $a_2-a_1$, and the distance between the opening $D_1$ and the opening $D_2$ can be regarded as $b_1-b_2$. As illustrated in FIGS. 9A and 9B, in the semiconductor device described in this embodiment, the relation $a_2-a_1=b_1-b_2$ is satisfied, which fulfills the formula (1) in the above embodiment.

Thus, when the distance between the opening $C_1$ and the opening $C_2$ is substantially equal to the distance between the opening $D_1$ and the opening $D_2$, the wiring resistances between the terminal A and the terminal B of the circuit 102 can be substantially equal regardless of the choice of the wiring path through the circuit 104. In other words, when the distance between the portion in which the conductive film 350a overlaps with the opening $C_1$ and the portion in which the conductive film 350a overlaps with the opening $C_2$ is substantially equal to the distance between the portion in which the conductive film 350b overlaps with the opening $D_1$ and the portion in which the conductive film 350b overlaps with the opening $D_2$, the wiring resistances between the terminal A and the terminal B of the circuit 102 can be substantially equal regardless of the choice of the wiring path through the circuit 104. Accordingly, the semiconductor device described in this embodiment can have substantially equal oscillation frequencies for specific data, which leads to an improvement in the accuracy of oscillation frequency.

The conductive film 350c extends in the column direction in FIG. 9B and is electrically connected to a source electrode or a drain electrode of a transistor 105[2] of the circuit 104[2] through an opening provided in the insulating films 316 and 317. Furthermore, one end of the conductive film 350c ends at the contact with the transistor 105[1] through the opening because FIGS. 9A and 9B illustrate the circuit in the case of m=2. That is, the conductive film 350c functions as the wiring BL, which is described in the above embodiment.

The conductive films 350a to 350c can be formed using any of the above materials which can be used for the conductive film 328a and the conductive film 328b.

The above configuration of the semiconductor device described in this embodiment can be provided as a novel circuit configuration. In the semiconductor device described in this embodiment, the oscillation frequency can be changed, or a circuit configuration capable of achieving the change can be provided. In the semiconductor device described in this embodiment, the accuracy of oscillation frequency can be improved, or a circuit configuration capable of achieving the improvement can be provided.

Although the connection between the conductive film 350a and the impurity region 320a is formed by repeating a step of forming an opening in an insulating film and a step of forming a conductive film, the structure of the semiconductor device described in this embodiment is not limited thereto. For example, an opening may be formed in the insulating films 311 to 317 in one step, so that the conductive film 350a is directly connected to the impurity region 320a. The same also applies to other openings and conductive films in the circuit 104.

In the capacitor 108[1], the conductive film 334 functioning as the second terminal is provided under the conductive film 344a functioning as the first terminal; however, the structure of the semiconductor device described in this embodiment is not limited thereto. For example, it is also possible to employ a structure in which a conductive film functioning as the second terminal is provided over the conductive film 344a and the insulating film 316 is used as a dielectric.

In FIG. 10, the transistor 105[1] includes the gate electrode 348 corresponding to a channel formation region. However, the transistor 105[1] may have a multi-gate structure in which a plurality of electrically connected gate electrodes is provided so that a plurality of channel formation regions is included in one active layer. In this embodiment, the transistor 105 overlaps with neither the transistor 106 nor the transistor 107; however, the structure of the semiconductor device described in this embodiment is not limited thereto, and the transistor 105 may overlap with the transistor 106 and/or the transistor 107. Moreover, in this embodiment, the channel length direction of the transistor 105 is parallel to the channel length direction of the transistors 106 and 107; however, the structure of the semiconductor device described in this embodiment is not limited thereto, and a structure may be employed in which the channel length direction of the transistor 105 is not parallel to the channel length direction of the transistors 106 and 107.

<Transistor>

Next, an example of the structure of a transistor 90 including a channel formation region in an oxide semiconductor film will be described.

Figure 11A:
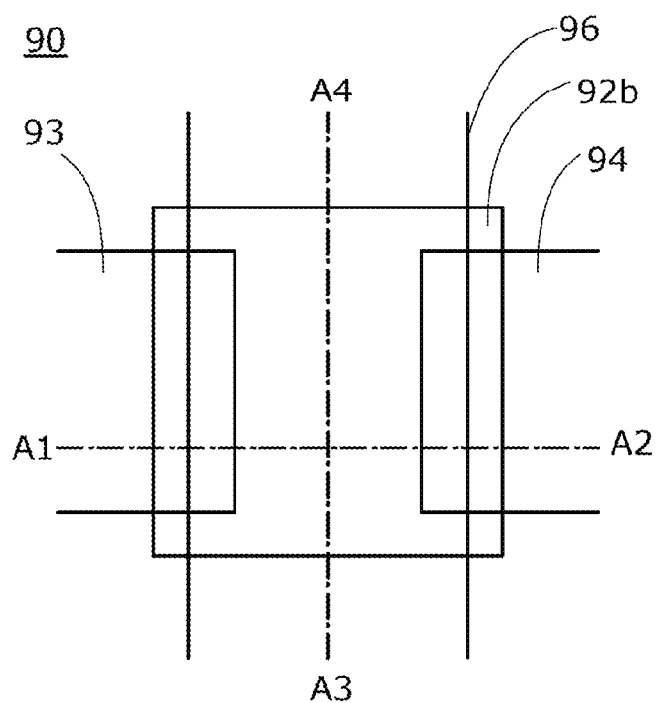
FIGS. 11A to 11C illustrate a structure of a transistor.
Figure 11C:
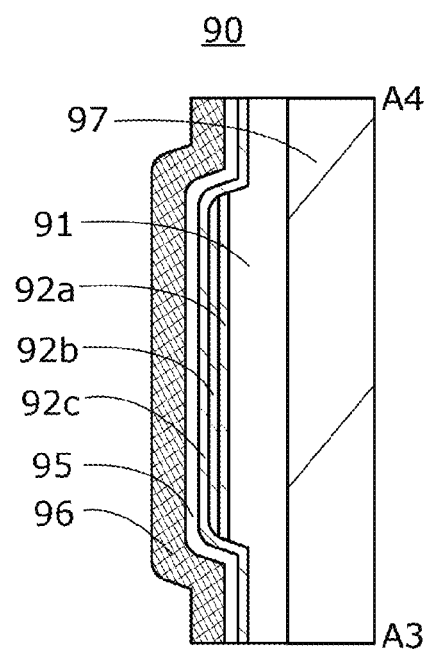
Figure 11B:
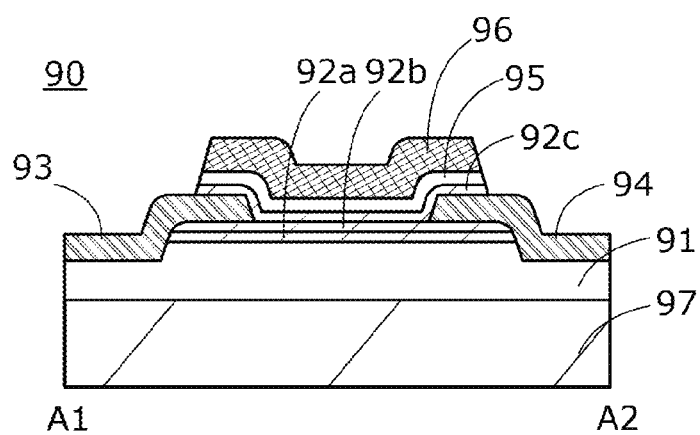

FIGS. 11A to 11C illustrate an example of the structure of the transistor 90 including a channel formation region in an oxide semiconductor film. FIG. 11A is a top view of the transistor 90. Note that insulating films are not illustrated in FIG. 11A in order to clarify the layout of the transistor 90. FIG. 11B is a cross-sectional view along the dashed-dotted line A1-A2 in the top view in FIG. 11A. FIG. 11C is a cross-sectional view along the dashed-dotted line A3-A4 in the top view in FIG. 11A.

As illustrated in FIGS. 11A to 11C, the transistor 90 includes an oxide semiconductor film 92a and an oxide semiconductor film 92b which are stacked in this order over an insulating film 91 formed over a substrate 97; a conductive film 93 and a conductive film 94 which are electrically connected to the oxide semiconductor film 92b and function as a source electrode and a drain electrode; an oxide semiconductor film 92c over the oxide semiconductor film 92b and the conductive films 93 and 94; an insulating film 95 which functions as a gate insulating film and is located over the oxide semiconductor film 92c; and a conductive film 96 which functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

Here, the transistor 90 corresponds to the transistor 105 described above, where the insulating film 91 corresponds to the insulating film 315, the oxide semiconductor films 92a to 92c correspond to the oxide semiconductor film 340, the conductive films 93 and 94 correspond to the conductive films 344a and 344b, the insulating film 95 corresponds to the gate insulating film 346, and the conductive film 96 corresponds to the gate electrode 348.

FIGS. 12A to 12C illustrate another specific example of the structure of the transistor 90. FIG. 12A is a top view of the transistor 90. Note that insulating films are not illustrated in FIG. 12A in order to clarify the layout of the transistor 90. FIG. 12B is a cross-sectional view along the dashed-dotted line A1-A2 in the top view in FIG. 12A. FIG. 12C is a cross-sectional view along the dashed-dotted line A3-A4 in the top view in FIG. 12A.

As illustrated in FIGS. 12A to 12C, the transistor 90 includes the oxide semiconductor films 92a to 92c which are stacked in this order over the insulating film 91; the conductive films 93 and 94 which are electrically connected to the oxide semiconductor film 92c and function as a source electrode and a drain electrode; the insulating film 95 which functions as a gate insulating film and is located over the oxide semiconductor film 92c and the conductive films 93 and 94; and the conductive film 96 which functions as a gate electrode, lies over the insulating film 95, and overlaps with the oxide semiconductor films 92a to 92c.

FIGS. 11A to 11C and FIGS. 12A to 12C each illustrate the structural example of the transistor 90 in which the oxide semiconductor films 92a to 92c are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the oxide semiconductor films 92a to 92c are stacked in this order, each of the oxide semiconductor films 92a and 92c is an oxide film which contains at least one of metal elements contained in the oxide semiconductor film 92b and in which the energy at the conduction band minimum is closer to the vacuum level than that in the oxide semiconductor film 92b by 0.05 eV or more, 0.07 eV or more, 0.1 eV or more, or 0.15 eV or more and 2 eV or less, 1 eV or less, 0.5 eV or less, or 0.4 eV or less. The oxide semiconductor film 92b preferably contains at least indium because the carrier mobility is increased.

In the case where the transistor 90 includes the semiconductor film with the above structure, when an electric field is applied to the semiconductor film by applying voltage to the gate electrode, a channel region is formed in the oxide semiconductor film 92b, which has the lowest conduction band minimum in the semiconductor film. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which leads to an increase in the field-effect mobility of the transistor 90.

When an interface state is formed at the interface between the oxide semiconductor film 92b and the oxide semiconductor film 92a, a channel region is also formed in the vicinity of the interface; thus, the threshold voltage of the transistor 90 fluctuates. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure can reduce variations in electrical characteristics of the transistor 90, such as the threshold voltage.

Furthermore, it is preferable that a plurality of oxide semiconductor films be stacked so that an interface state which is caused by an impurity existing between the oxide semiconductor films and inhibits carrier flow is not formed at the interface between the films. This is because when an impurity exists between the stacked oxide semiconductor films, the energy continuity of the conduction band minimum between the oxide semiconductor films is lost, and carriers are trapped or disappear by recombination in the vicinity of the interface. By reducing impurities existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, the films need to be stacked successively without being exposed to the air by using a multi-chamber deposition apparatus (sputtering apparatus) provided with a load lock chamber. Each chamber in the sputtering apparatus is preferably subjected to high vacuum evacuation (to a vacuum of about $5 \times 10^{-7}$ Pa to $1 \times 10^{-4}$ Pa) with the use of a suction vacuum pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used for the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M represents Ga, Y, Zr, La, Ce, or Nd) and a target having an atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film is easily formed as the oxide semiconductor film 92b. Typical examples of the atomic ratio of the metal elements of the target are In:M:Zn=1:1:1 and In:M:Zn=3:1:2.

Specifically, in the case where the oxide semiconductor films 92a and 92c are each an In-M-Zn oxide film (M represents Ga, Y, Zr, La, Ce, or Nd) and a target having an atomic ratio of metal elements of In:M:Zn=$x_2$:$y_2$:$z_2$ is used for forming the oxide semiconductor films 92a and 92c, $x_2/y_2$ is preferably smaller than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, and In:M:Zn=1:3:8.

The oxide semiconductor film 92a and the oxide semiconductor film 92c each have a thickness of greater than or equal to 3 nm and less than or equal to 100 nm, preferably greater than or equal to 3 nm and less than or equal to 50 nm. The thickness of the oxide semiconductor film 92b is greater than or equal to 3 nm and less than or equal to 200 nm, preferably greater than or equal to 3 nm and less than or equal to 100 nm, further preferably greater than or equal to 3 nm and less than or equal to 50 nm.

In the three-layer semiconductor film, the oxide semiconductor films 92a to 92c can be either amorphous or crystalline. Note that the oxide semiconductor film 92b, in which a channel region is formed, preferably has a crystalline structure because the transistor 90 can have stable electrical characteristics.

Note that a channel formation region refers to a region of a semiconductor film of the transistor 90 which overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of a target containing an In—Ga—Zn oxide (In:Ga:Zn=1:3:2 [atomic ratio]). The deposition conditions can be as follows: an argon gas (flow rate: 30 sccm) and an oxygen gas (flow rate: 15 sccm) are used as a deposition gas; the pressure is 0.4 Pa; the substrate temperature is 200° C.; and the DC power is 0.5 kW.

Furthermore, when the oxide semiconductor film 92b is a CAAC-OS film, the oxide semiconductor film 92b is preferably deposited with the use of a polycrystalline target containing an In—Ga—Zn oxide (In:Ga:Zn=1:1:1 [atomic ratio]). The deposition conditions can be as follows: an argon gas (flow rate: 30 sccm) and an oxygen gas (flow rate: 15 sccm) are used as a deposition gas; the pressure is 0.4 Pa; the substrate temperature is 300° C.; and the DC power is 0.5 kW.

Although the oxide semiconductor films 92a to 92c can be formed by a sputtering method, they may be formed by another method, e.g., a thermal CVD method. A metal organic chemical vapor deposition (MOCVD) method or an atomic layer deposition (ALD) method may be employed as an example of the thermal CVD method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor including a channel formation region in a highly purified oxide semiconductor film has an extremely low off-state current and high reliability. Thus, a transistor in which a channel formation region is formed in the oxide semiconductor film easily has an electrical characteristic of a positive threshold voltage (also referred to as a normally-off characteristic).

The carrier density in such a highly purified oxide semiconductor film is decreased by reducing impurity elements. The carrier density can be, for example, $1 \times 10^{17}/cm^3$ or lower, $1 \times 10^{15}/cm^3$ or lower, $1 \times 10^{13}/cm^3$ or lower, or $8 \times 10^{11}/cm^3$ or lower. Preferably, the carrier density can be lower than $8 \times 10^{11}/cm^3$, further preferably lower than $1 \times 10^{11}/cm^3$, or still further preferably lower than $1 \times 10^{10}/cm^3$ and $1 \times 10^{-9}/cm^3$ or higher.

Specifically, various experiments can prove the low off-state current of a transistor including a channel formation region in a highly purified oxide semiconductor film. For example, even when an element has a channel width of $1 \times 10^6$ μm and a channel length of 10 μm, the off-state current can be lower than or equal to the measurement limit of a semiconductor parameter analyzer, i.e., lower than or equal to $1 \times 10^{-13}$ A, at a voltage (drain voltage) between the source electrode and the drain electrode of 1 V to 10 V. In this case, it can be seen that the off-state current of the transistor which is normalized on the channel width is lower than or equal to 100 zA/μm. In addition, the off-state current is measured using a circuit in which a capacitor and a transistor are connected to each other and charge flowing into or from the capacitor is controlled by the transistor. In the measurement, a highly purified oxide semiconductor film is used for a channel formation region of the transistor, and the off-state current of the transistor is measured from a change in the amount of charge in the capacitor per unit time. It can be seen from the result that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably contained in the oxide semiconductor. In addition, as a stabilizer for reducing variations in electrical characteristics of a transistor formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Furthermore, unlike silicon carbide, gallium nitride, or gallium oxide, with the use of the In—Ga—Zn oxide, a transistor with favorable electrical characteristics can be formed over a glass substrate. Furthermore, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide (also referred to as IGZO), an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Furthermore, the In—Ga—Zn oxide may contain another metal element in addition to In, Ga, and Zn. The In—Ga—Zn oxide has sufficiently high resistance when no electric field is applied thereto, so that the off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 90, a metal in the source electrode and the drain electrode might extract oxygen from the oxide semiconductor film depending on a conductive material used for the source electrode and the drain electrode. In this case, a region of the oxide semiconductor film in contact with the source electrode or the drain electrode becomes an n-type region due to the formation of an oxygen vacancy. The n-type region functions as a source region or a drain region, resulting in a decrease in the contact resistance between the oxide semiconductor film and the source electrode or the drain electrode. Accordingly, the formation of the n-type region increases the mobility and the on-state current of the transistor 90, achieving high-speed operation of a semiconductor device using the transistor 90.

Note that the extraction of oxygen by a metal in the source electrode and the drain electrode is probably caused when the source electrode and the drain electrode are formed by a sputtering method or the like or when heat treatment is performed after the formation of the source electrode and the drain electrode. The n-type region is more likely to be formed when a conductive material which is easily bonded to oxygen is used for the source electrode and the drain electrode. Examples of such a conductive material include Al, Cr, Cu, Ta, Ti, Mo, and W.

In the case where the semiconductor film including the stacked oxide semiconductor films is used for the transistor 90, the n-type region preferably extends to the oxide semiconductor film 92b serving as a channel region in order that the mobility and the on-state current of the transistor 90 can be increased and the semiconductor device can operate at higher speed.

The insulating film 91 preferably has a function of supplying part of oxygen to the oxide semiconductor films 92a to 92c by heating. The number of defects in the insulating film 91 is preferably small; typically, the spin density at g=2.001 due to a dangling bond of silicon is lower than or equal to $1 \times 10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD method, a sputtering method, or the like.

Note that in this specification, an oxynitride contains more oxygen than nitrogen, and a nitride oxide contains more nitrogen than oxygen.

Note that in the transistor 90 in FIGS. 11A to 11C or FIGS. 12A to 12C, the conductive film 96 overlaps with end portions of the oxide semiconductor film 92b including a channel region which do not overlap with the conductive films 93 and 94, i.e., end portions of the oxide semiconductor film 92b which are in a region different from a region in which the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in the oxide semiconductor. For this reason, it can be considered that, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by the potential of the conductive film 96 because the end portions of the oxide semiconductor film 92b which do not overlap with the conductive films 93 and 94 overlap with the conductive film 96 in the transistor 90 in FIGS. 11A to 11C or FIGS. 12A to 12C. Consequently, current that flows between the conductive films 93 and 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, even when the distance between the conductive films 93 and 94 at the end portions of the oxide semiconductor film 92b is reduced as a result of reducing the channel length to obtain high on-state current, the transistor 90 can have a low off-state current. Consequently, with the short channel length, the transistor 90 can have a high on-state current when in an on state and a low off-state current when in an off state.

With the s-channel structure, specifically, when a potential at which the transistor 90 is turned on is supplied to the conductive film 96, the amount of current that flows between the conductive films 93 and 94 through the end portions can be increased. The current contributes to an increase in the field-effect mobility and an increase in the on-state current of the transistor 90. When the end portions of the oxide semiconductor film 92b overlap with the conductive film 96, carriers flow in a wide region of the oxide semiconductor film 92b without being limited to a region in the vicinity of the interface of the oxide semiconductor film 92b close to the insulating film 95, which results in an increase in the number of carriers transferred in the transistor 90. As a result, the on-state current of the transistor 90 is increased, and the field-effect mobility is increased to 10 $cm^2/V \cdot s$ or higher or 20 $cm^2/V \cdot s$ or higher, for example. Note that here, the field-effect mobility is not an approximate value of the mobility as a physical property of the oxide semiconductor film but an apparent field-effect mobility in a saturation region of the transistor, which is an index of current drive capability.

A structure of an oxide semiconductor film will be described below.

An oxide semiconductor film is roughly classified into a single crystal oxide semiconductor film and a non-single-crystal oxide semiconductor film. The non-single-crystal oxide semiconductor film means an amorphous oxide semiconductor film, a microcrystalline oxide semiconductor film, a polycrystalline oxide semiconductor film, a c-axis aligned crystalline oxide semiconductor (CAAC-OS) film, or the like.

The amorphous oxide semiconductor film has disordered atomic arrangement and no crystalline component. A typical example thereof is an oxide semiconductor film in which no crystal part exists even in a microscopic region, and the whole film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states in the microcrystalline oxide semiconductor film is lower than that in the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states in the CAAC-OS film is lower than that in the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to a TEM image of the CAAC-OS film observed in the direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

On the other hand, according to a TEM image of the CAAC-OS film observed in the direction substantially perpendicular to the sample surface (plan TEM image), metal atoms are arranged in a triangular or hexagonal configuration in the crystal parts. However, there is no regularity of arrangement of metal atoms between different crystal parts.

From the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears at a diffraction angle (2θ) of around 31° in some cases. This peak is derived from the (009) plane of the $InGaZnO_4$ crystal, which indicates that crystals in the CAAC-OS film have c-axis alignment and that the c-axes are aligned in the direction substantially perpendicular to the formation surface or the top surface of the CAAC-OS film.

On the other hand, when the CAAC-OS film is analyzed by an in-plane method in which an X-ray enters a sample in the direction substantially perpendicular to the c-axis, a peak appears at 2θ of around 56° in some cases. This peak is derived from the (110) plane of the $InGaZnO_4$ crystal. Here, analysis (φ scan) is performed under the conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film, while the directions of a-axes and b-axes are irregularly oriented between crystal parts, the c-axes are aligned in the direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in the direction parallel to a normal vector of a formation surface or a normal vector of a top surface of the CAAC-OS film.

Thus, for example, in the case where the shape of the CAAC-OS film is changed by etching or the like, the c-axis of the crystal might not be necessarily parallel to a normal vector of a formation surface or a normal vector of a top surface of the CAAC-OS film.

Furthermore, the crystallinity in the CAAC-OS film is not necessarily uniform. For example, in the case where crystal growth leading to the CAAC-OS film occurs from the vicinity of the top surface of the CAAC-OS film, the crystallinity in the vicinity of the top surface is higher than that in the vicinity of the formation surface in some cases. Moreover, when an impurity is added to the CAAC-OS film, the crystallinity in a region to which the impurity is added is changed, and the crystallinity in the CAAC-OS film varies depending on regions.

Note that when the CAAC-OS film including an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and not appear at around 36°.

In a transistor including the CAAC-OS film, variations in electrical characteristics due to irradiation with visible light or ultraviolet light are small. Thus, the transistor has high reliability.

Note that an oxide semiconductor film may be a stacked film including two or more kinds selected from an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when a flat-plate-like or pellet-like sputtered particle reaches the substrate, migration occurs on the substrate, so that a flat plane of the sputtered particle is attached to the substrate.

Furthermore, it is preferable that the proportion of oxygen in the deposition gas be increased and the power be optimized in order to reduce plasma damage during the deposition. The proportion of oxygen in the deposition gas is 30 vol % or higher, preferably 100 vol %.

As an example of the target, an In—Ga—Zn oxide target will be described below.

A polycrystalline In—Ga—Zn oxide target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of the $InO_X$ powder to the $GaO_Y$ powder and the $ZnO_Z$ powder is, for example, 2:2:1, 8:4:3, 3:1:1, 1:1:1, 4:2:3, 2:1:3, or 3:1:2. The kinds of powder and the molar ratio for mixing powder may be determined as appropriate depending on the desired target. In particular, when a CAAC-OS film is formed using a target with a molar ratio of In:Ga:Zn=2:1:3, the proportion of a region where a diffraction pattern of CAAC-OS is observed in a certain area (proportion of CAAC) can be increased; thus, a transistor including a channel formation region in the CAAC-OS film can have excellent frequency characteristics.

Alkali metal is not a constituent element of the oxide semiconductor and thus is an impurity. Alkaline earth metal is also an impurity in the case where the alkaline earth metal is not a constituent element of the oxide semiconductor. Among alkali metals, in particular, Na becomes $Na^-$ when an insulating film in contact with the oxide semiconductor film is an oxide and Na diffuses into the insulating film. Furthermore, in the oxide semiconductor film, Na cuts or enters a bond between metal and oxygen which are contained in the oxide semiconductor. As a result, the electrical characteristics of a transistor deteriorate; for example, a negative shift of the threshold voltage causes the transistor to be normally on, or the mobility is reduced. In addition, variations in characteristics also occur. Specifically, the Na concentration measured by secondary ion mass spectrometry is preferably $5 \times 10^{16}/cm^3$ or lower, further preferably $1 \times 10^{16}/cm^3$ or lower, still further preferably $1 \times 10^{15}/cm^3$ or lower. Similarly, the measured Li concentration is preferably $5 \times 10^{15}/cm^3$ or lower, further preferably $1 \times 10^{15}/cm^3$ or lower. Similarly, the measured K concentration is preferably $5 \times 10^{15}/cm^3$ or lower, further preferably $1 \times 10^{15}/cm^3$ or lower.

When a metal oxide containing indium is used, silicon or carbon, which have higher bond energy with oxygen than indium, might cut the bond between indium and oxygen, so that an oxygen vacancy may be formed. Accordingly, when silicon or carbon is contained in the oxide semiconductor film, the electrical characteristics of the transistor are likely to deteriorate as in the case where alkali metal or alkaline earth metal is contained. Thus, the silicon concentration and the carbon concentration in the oxide semiconductor film are preferably low. Specifically, the C concentration or the Si concentration measured by secondary ion mass spectrometry is preferably $1 \times 10^{18}/cm^3$ or lower. In this case, the deterioration of the electrical characteristics of the transistor can be prevented, so that the reliability of the semiconductor device can be improved.

Heat treatment may be performed to further reduce impurities such as moisture and hydrogen contained in the oxide semiconductor film, thereby increasing the purity of the oxide semiconductor film.

For example, the oxide semiconductor film is subjected to heat treatment in a reduced-pressure atmosphere, an inert gas atmosphere of nitrogen, a rare gas, or the like, an oxidation atmosphere, or an ultra-dry air atmosphere (the moisture content is 20 ppm (−55° C. by conversion into a dew point) or less, preferably 1 ppm or less, further preferably 10 ppb or less, in the case where the measurement is performed with a dew point meter in a cavity ring down laser spectroscopy (CRDS) system). Note that the oxidation atmosphere refers to an atmosphere containing an oxidation gas such as oxygen, ozone, or nitrogen oxide at 10 ppm or more. The inert gas atmosphere refers to an atmosphere containing the oxidation gas at less than 10 ppm and is filled with nitrogen or a rare gas.

Note that the heat treatment may be performed in the following manner: heat treatment is performed in an inert gas atmosphere, and then, another heat treatment is performed in an atmosphere containing an oxidation gas at 10 ppm or more, 1% or more, or 10% or more. The heat treatment may be performed at any time after the oxide semiconductor film is formed. For example, the heat treatment may be performed after the oxide semiconductor film is selectively etched.

The heat treatment is performed at a temperature higher than or equal to 250° C. and lower than or equal to 650° C., preferably higher than or equal to 300° C. and lower than or equal to 500° C. The treatment time is shorter than or equal to 24 hours.

An electric furnace, a rapid thermal annealing (RTA) apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

Modification Example 1 of Cross-Sectional Structure of Semiconductor Device

Figure 13:
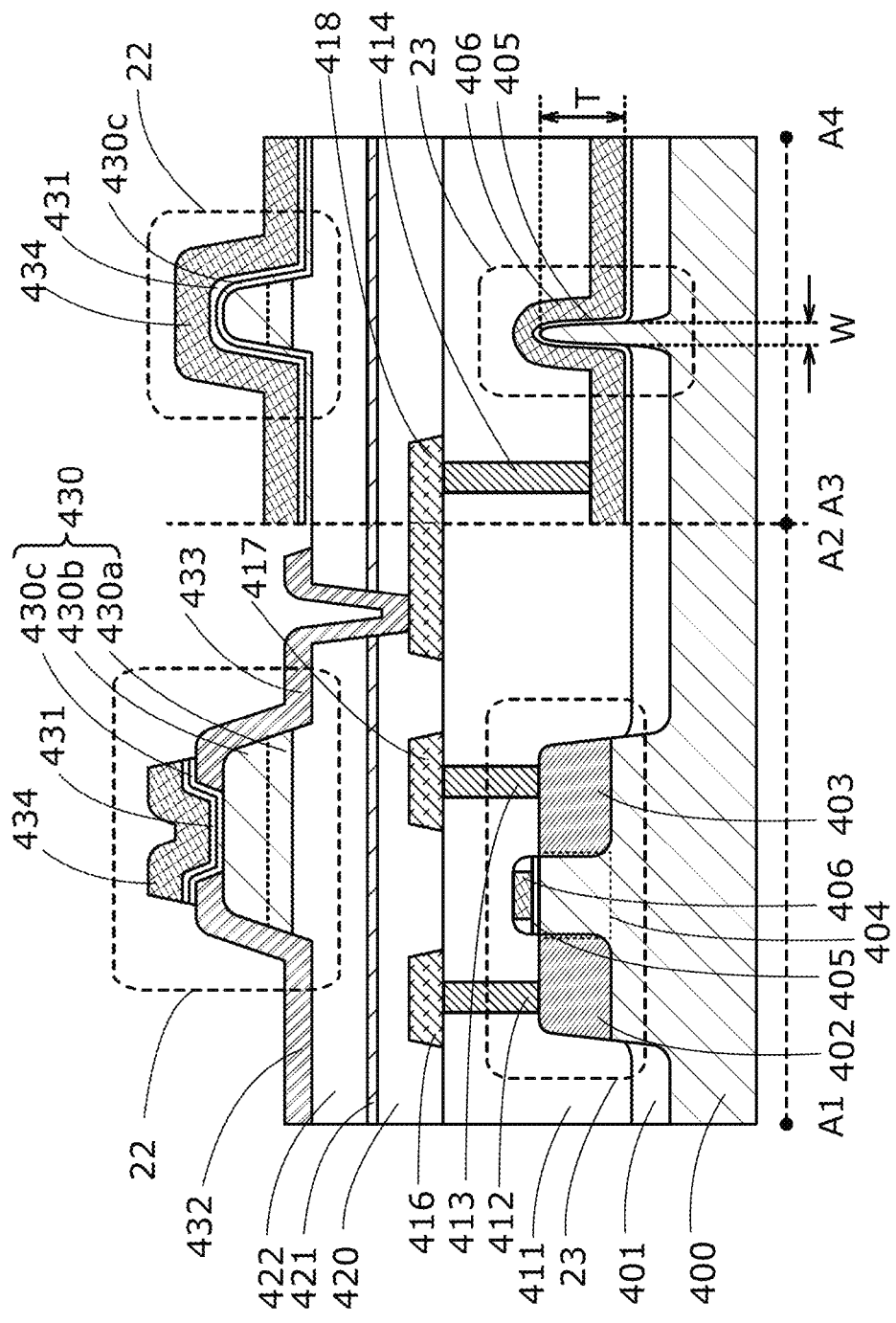
FIG. 13 illustrates a cross-sectional structure of a device.

FIG. 13 illustrates an example of the cross-sectional structure of transistors which correspond to the transistors 105 and 106 in FIG. 2. A transistor 22 corresponds to the transistor 105, and a transistor 23 corresponds to the transistor 106. A region along the dashed line A1-A2 shows a structure of the transistors 22 and 23 in the channel length direction, and a region along the dashed line A3-A4 shows a structure of the transistors 22 and 23 in the channel width direction. Note that in one embodiment of the present invention, the channel length direction of the transistor 22 is not necessarily aligned with the channel length direction of the transistor 23.

The channel length direction of a transistor refers to a direction in which carriers move between a source (source region or source electrode) and a drain (drain region or drain electrode). The channel width direction refers to a direction perpendicular to the channel length direction in a plane parallel to a substrate.

In FIG. 13, the transistor 22 including a channel formation region in an oxide semiconductor film is formed over the transistor 23 including a channel formation region in a single crystal silicon substrate.

The transistor 23 may include the channel formation region in a semiconductor film or a semiconductor substrate of silicon, germanium, or the like in an amorphous, microcrystalline, polycrystalline, or single crystal state. Alternatively, the transistor 23 may include the channel formation region in an oxide semiconductor film or an oxide semiconductor substrate. In the case where the transistors each include a channel formation region in an oxide semiconductor film or an oxide semiconductor substrate, the transistor 22 is not necessarily stacked over the transistor 23, and the transistors 22 and 23 may be formed in the same layer.

In the case where the transistor 23 is formed using a thin silicon film, any of the following materials can be used for the thin film: amorphous silicon formed by a sputtering method or a vapor deposition method such as a plasma CVD method, polycrystalline silicon obtained by crystallization of amorphous silicon by treatment such as laser annealing, single crystal silicon obtained by separation of a surface portion of a single crystal silicon wafer by implantation of hydrogen ions or the like into the silicon wafer, and the like.

A substrate 400 on which the transistor 23 is formed can be, for example, a silicon substrate, a germanium substrate, or a silicon germanium substrate. In FIG. 13, a single crystal silicon substrate is used as the substrate 400.

The transistor 23 is electrically isolated by an element isolation method. As the element isolation method, a trench isolation method or the like can be used. FIG. 13 illustrates an example in which the trench isolation method is used to electrically isolate the transistor 23. Specifically, in FIG. 13, the transistor 23 is electrically isolated by element isolation using an element isolation region 401 formed in the following manner: an insulator containing silicon oxide or the like is buried in a trench formed in the substrate 400 by etching or the like, and then, the insulator is partly removed by etching or the like.

In a projection of the substrate 400 which exists in a region other than the trench, an impurity region 402 and an impurity region 403 of the transistor 23 and a channel formation region 404 placed between the impurity regions 402 and 403 are provided. Furthermore, the transistor 23 includes an insulating film 405 which covers the channel formation region 404 and a gate electrode 406 which overlaps with the channel formation region 404 with the insulating film 405 positioned therebetween.

In the transistor 23, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, the area over the substrate occupied by the transistor 23 can be reduced, and the number of carriers transferred in the transistor 23 can be increased. As a result, the on-state current and field-effect mobility of the transistor 23 are increased. Suppose the length in the channel width direction (channel width) of the projection in the channel formation region 404 is W and the thickness of the projection in the channel formation region 404 is T. When the aspect ratio, i.e., the ratio of the thickness T to the channel width W, is higher, a region where carriers flow is larger. Thus, the on-state current and the field-effect mobility of the transistor 23 can be further increased.

Note that when the transistor 23 is formed using a bulk semiconductor substrate, the aspect ratio is preferably 0.5 or higher, further preferably 1 or higher.

An insulating film 411 is provided over the transistor 23. Openings are formed in the insulating film 411. Conductive films 412 and 413 which are electrically connected to the impurity regions 402 and 403, respectively, and a conductive film 414 which is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having an effect of blocking diffusion of oxygen, hydrogen, and water is provided over the insulating film 420. As the insulating film 421 has higher density to be denser or has fewer dangling bonds to be more chemically stable, the insulating film 421 has a higher blocking effect. The insulating film 421 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 22 is provided over the insulating film 422.

The transistor 22 includes a semiconductor film 430 which is over the insulating film 422 and contains an oxide semiconductor, a conductive film 432 and a conductive film 433 which are electrically connected to the semiconductor film 430 and function as a source electrode and a drain electrode, a gate insulating film 431 which covers the semiconductor film 430, and a gate electrode 434 which overlaps with the semiconductor film 430 with the gate insulating film 431 positioned therebetween. Note that an opening is formed in the insulating films 420 to 422. The conductive film 433 is connected to the conductive film 418 in the opening.

In FIG. 13, the transistor 22 has the gate electrode 434 on at least one side of the semiconductor film 430; alternatively, the transistor 22 may further have a gate electrode which overlaps with the semiconductor film 430 with the insulating film 422 positioned therebetween.

In the case where the transistor 22 has a pair of gate electrodes, one of the gate electrodes may be supplied with a signal for controlling the on/off state, and the other gate electrode may be supplied with a potential from another wiring. In this case, potentials at the same level may be supplied to the pair of gate electrodes, or a fixed potential such as a ground potential may be supplied only to the other gate electrode. By controlling the level of a potential supplied to the other gate electrode, the threshold voltage of the transistor can be controlled.

Note that in general, a potential (a voltage) has a relative value and its value is determined by the amount relative to a reference potential. Therefore, even when the term "ground", "GND", or the like is used, the potential is not necessarily 0 V. For example, the lowest potential in a circuit may be defined as "ground potential" or "GND". Alternatively, a substantially intermediate potential in a circuit may be defined as "ground potential" or "GND". In these cases, a positive potential and a negative potential are set using such a potential as a reference.

Here, when a transistor T includes a pair of gates between which a semiconductor film is provided, one of the gates may be supplied with a signal A and the other gate may be supplied with a fixed potential $V_b$.

The signal A is, for example, a signal for controlling the on/off state. The signal A may be a digital signal having two kinds of potentials, a potential $V_1$ and a potential $V_2$ ($V_1 > V_2$). For example, the potential $V_1$ can be a high power supply potential, and the potential $V_2$ can be a low power supply potential. The signal A may be an analog signal.

The fixed potential $V_b$ is, for example, a potential for controlling the threshold voltage $V_{thA}$ of the transistor T. The fixed potential $V_b$ may be the potential $V_1$ or the potential $V_2$. In this case, no additional potential generation circuit is necessary to generate the fixed potential $V_b$, which is preferable. The fixed potential $V_b$ may be different from the potential $V_1$ or the potential $V_2$. In some cases, the threshold voltage $V_{thA}$ can be high by setting the fixed potential $V_b$ low. As a result, in some cases, the drain current generated when the gate-source voltage $V_{gs}$ is 0 V can be reduced, and the leakage current in the circuit including the transistor T can be reduced. For example, the fixed potential $V_b$ may be lower than the low power supply potential. In some cases, the threshold voltage $V_{thA}$ can be low by setting the fixed potential $V_b$ high. As a result, in some cases, the drain current generated when the gate-source voltage $V_{gs}$ is $V_{DD}$ can be increased, and the operation speed of the circuit including the transistor T can be improved. For example, the fixed potential $V_b$ may be higher than the low power supply potential.

Alternatively, one of the gates of the transistor T may be supplied with the signal A, and the other gate may be supplied with a signal B. The signal B is, for example, a signal for controlling the on/off state of the transistor T. The signal B may be a digital signal having two kinds of potentials, a potential $V_3$ and a potential $V_4$ ($V_3 > V_4$). For example, the potential $V_3$ can be a high power supply potential, and the potential $V_4$ can be a low power supply potential. The signal B may be an analog signal.

When both the signal A and the signal B are digital signals, the signal B may have the same digital value as the signal A. In this case, it may be possible to increase the on-state current of the transistor T and the operation speed of the circuit including the transistor T. Here, the potential $V_1$ of the signal A may be different from the potential $V_3$ of the signal B. Furthermore, the potential $V_2$ of the signal A may be different from the potential $V_4$ of the signal B. For example, when a gate insulating film for the gate to which the signal B is input is thicker than a gate insulating film for the gate to which the signal A is input, the potential amplitude ($V_3 - V_4$) of the signal B may be larger than the potential amplitude ($V_1 - V_2$) of the signal A. In this manner, the influence of the signal A on the on/off state of the transistor T can be substantially equal to that of the signal B in some cases.

When both the signal A and the signal B are digital signals, the signal B may have a digital value different from that of the signal A. In this case, the signal A and the signal B can separately control the transistor T, and thus higher performance can be achieved. The transistor T which is, for example, an n-channel transistor can function by itself as a NAND circuit, a NOR circuit, or the like in the following case: the transistor T is turned on only when the signal A has the potential $V_1$ and the signal B has the potential $V_3$, or the transistor T is turned off only when the signal A has the potential $V_2$ and the signal B has the potential $V_4$. The signal B may be a signal for controlling the threshold voltage $V_{thA}$. For example, the potential of the signal B in a period during which the circuit including the transistor T operates may be different from that in a period during which the circuit does not operate. The signal B may be a signal whose potential is changed in accordance with the operation mode of the circuit. In this case, the potential of the signal B is not necessarily changed as frequently as the potential of the signal A.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor T and the operation speed of the circuit including the transistor T. The signal B may be an analog signal that is different from the signal A. In this case, the signal A and the signal B can separately control the transistor T, and thus higher performance can be achieved.

The signal A may be a digital signal, and the signal B may be an analog signal. Alternatively, the signal A may be an analog signal, and the signal B may be a digital signal.

Alternatively, one of the gates of the transistor T may be supplied with a fixed potential $V_a$, and the other gate may be supplied with the fixed potential $V_b$. When both of the gates of the transistor T are supplied with the fixed potentials, the transistor T can function as an element equivalent to a resistor in some cases. For example, when the transistor T is an n-channel transistor, the effective resistance of the transistor can be low (high) by setting the fixed potential $V_a$ or the fixed potential $V_b$ high (low) in some cases. When both the fixed potential $V_a$ and the fixed potential $V_b$ are high (low), the effective resistance is lower (higher) than that of a transistor with only one gate in some cases.

In FIG. 13, the transistor 22 has a single-gate structure and includes the gate electrode 434 corresponding to a channel formation region. However, the transistor 22 may have a multi-gate structure in which a plurality of electrically connected gate electrodes is provided so that a plurality of channel formation regions is included in one active layer.

FIG. 13 illustrates an example in which the semiconductor film 430 of the transistor 22 includes oxide semiconductor films 430a to 430c which are stacked in this order over the insulating film 422. Note that in one embodiment of the present invention, a single metal oxide film may be used as the semiconductor film 430 of the transistor 22.

Modification Example 2 of Cross-Sectional Structure of Semiconductor Device

Figure 14:
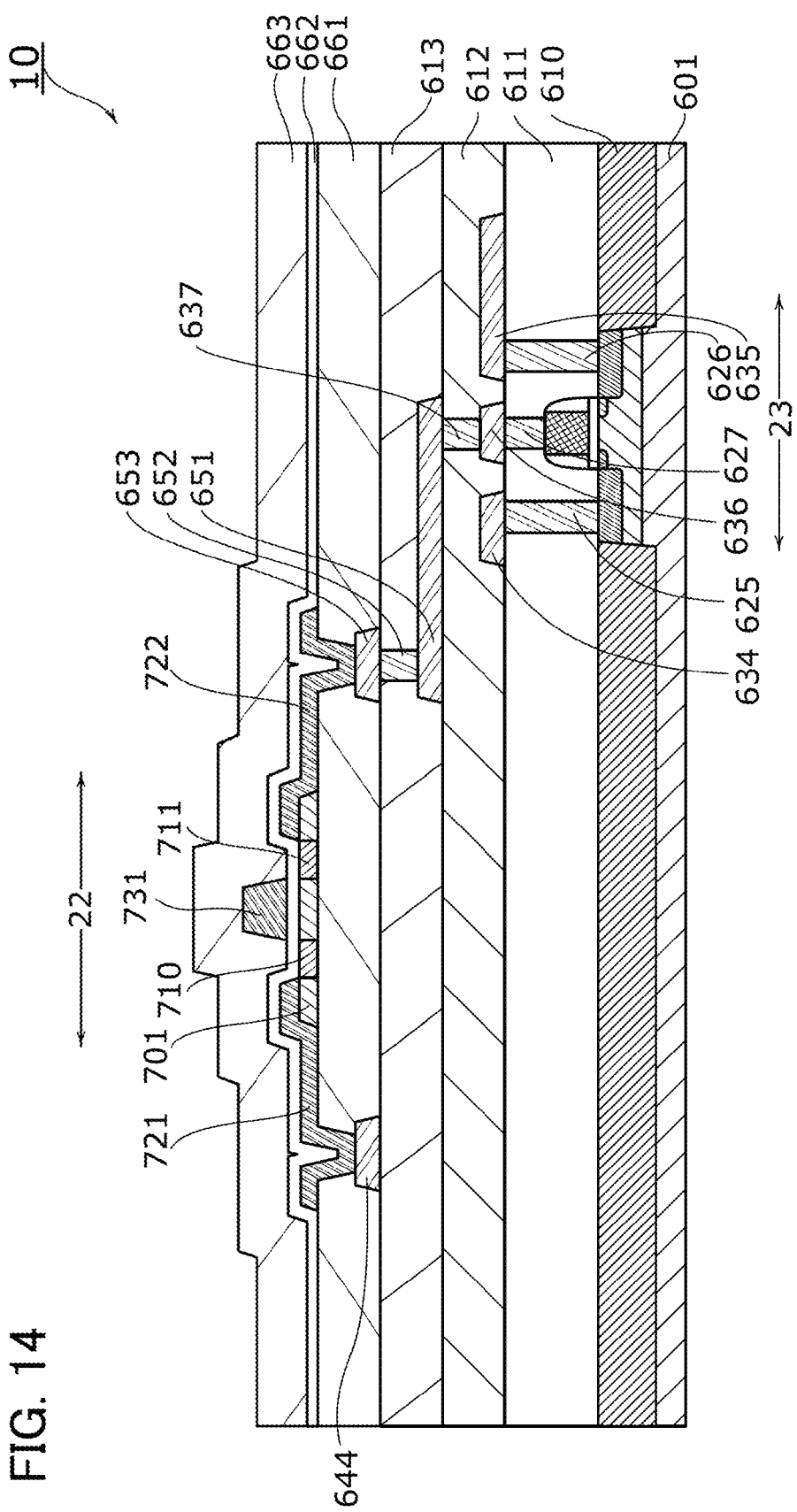
FIG. 14 illustrates a cross-sectional structure of a device.

FIG. 14 illustrates an example of the cross-sectional structure of transistors which correspond to the transistors 105 and 106 in FIG. 2.

In FIG. 14, the transistor 22 including a channel formation region in an oxide semiconductor film is formed over the transistor 23 including a channel formation region in a single crystal silicon substrate. The transistor 22 corresponds to the transistor 105, and the transistor 23 corresponds to the transistor 106.

The transistor 23 may include the channel formation region in a semiconductor film or a semiconductor substrate of silicon, germanium, or the like in an amorphous, microcrystalline, polycrystalline, or single crystal state. Alternatively, the transistor 23 may include the channel formation region in an oxide semiconductor film or an oxide semiconductor substrate. In the case where the transistors each include a channel formation region in an oxide semiconductor film or an oxide semiconductor substrate, the transistor 22 is not necessarily stacked over the transistor 23, and the transistors 22 and 23 may be formed in the same layer.

In the case where the transistor 23 is formed using a thin silicon film, any of the following materials can be used for the thin film: amorphous silicon formed by a sputtering method or a vapor deposition method such as a plasma CVD method, polycrystalline silicon obtained by crystallization of amorphous silicon by treatment such as laser annealing, single crystal silicon obtained by separation of a surface portion of a single crystal silicon wafer by implantation of hydrogen ions or the like into the silicon wafer, and the like.

A semiconductor substrate 601 on which the transistor 23 is formed can be, for example, a silicon substrate, a germanium substrate, or a silicon germanium substrate. In FIG. 14, a single crystal silicon substrate is used as the semiconductor substrate 601.

The transistor 23 is electrically isolated by an element isolation method. As the element isolation method, a selective oxidation method (a local oxidation of silicon (LOCOS) method), a trench isolation method (a shallow trench isolation (STI) method), or the like can be used. FIG. 14 illustrates an example in which the trench isolation method is used to electrically isolate the transistor 23. Specifically, in FIG. 14, the transistor 23 is electrically isolated by element isolation using an element isolation region 610 formed in the following manner: an insulator containing silicon oxide or the like is buried in a trench formed in the semiconductor substrate 601 by etching or the like.

An insulating film 611 is provided over the transistor 23. Openings are formed in the insulating film 611. Conductive films 625 and 626 which are electrically connected to the source and the drain of the transistor 23 and a conductive film 627 which is electrically connected to the gate of the transistor 23 are formed in the openings.

The conductive film 625 is electrically connected to a conductive film 634 formed over the insulating film 611. The conductive film 626 is electrically connected to a conductive film 635 formed over the insulating film 611. The conductive film 627 is electrically connected to a conductive film 636 formed over the insulating film 611.

An insulating film 612 is formed over the conductive films 634 to 636. An opening is formed in the insulating film 612. A conductive film 637 electrically connected to the conductive film 636 is formed in the opening. The conductive film 637 is electrically connected to a conductive film 651 formed over the insulating film 612.

An insulating film 613 is formed over the conductive film 651. An opening is formed in the insulating film 613. A conductive film 652 electrically connected to the conductive film 651 is formed in the opening. The conductive film 652 is electrically connected to a conductive film 653 formed over the insulating film 613. A conductive film 644 is formed over the insulating film 613.

An insulating film 661 is formed over the conductive film 653 and the conductive film 644. In FIG. 14, the transistor 22 is formed over the insulating film 661.

The transistor 22 includes a semiconductor film 701 which is over the insulating film 661 and contains an oxide semiconductor, a conductive film 721 and a conductive film 722 which are over the semiconductor film 701 and function as a source and a drain, a gate insulating film 662 over the semiconductor film 701 and the conductive films 721 and 722, and a gate electrode 731 which is over the gate insulating film 662 and overlaps with the semiconductor film 701 between the conductive films 721 and 722. Note that the conductive film 722 is electrically connected to the conductive film 653 in an opening provided in the insulating film 661.

In the semiconductor film 701 of the transistor 22, there is a region 710 between a region overlapping with the conductive film 721 and a region overlapping with the gate electrode 731. In addition, in the semiconductor film 701 of the transistor 22, there is a region 711 between a region overlapping with the conductive film 722 and the region overlapping with the gate electrode 731. When an inert gas such as argon, an impurity which imparts p-type conductivity to the semiconductor film 701, or an impurity which imparts n-type conductivity to the semiconductor film 701 is added to the regions 710 and 711 using the conductive films 721 and 722 and the gate electrode 731 as a mask, the resistivity of the regions 710 and 711 can be made lower than that of the region in which the semiconductor film 701 overlaps with the gate electrode 731.

An insulating film 663 is provided over the transistor 22.

In FIG. 14, the transistor 22 has the gate electrode 731 on at least one side of the semiconductor film 701; alternatively, the transistor 22 may have a pair of gate electrodes with the semiconductor film 701 positioned therebetween.

In the case where the transistor 22 has a pair of gate electrodes with the semiconductor film 701 positioned therebetween, one of the gate electrodes may be supplied with a signal for controlling the on/off state, and the other gate electrode may be supplied with a potential from another wiring. In this case, potentials at the same level may be supplied to the pair of gate electrodes, or a fixed potential such as a ground potential may be supplied only to the other gate electrode. By controlling the level of a potential supplied to the other gate electrode, the threshold voltage of the transistor can be controlled.

In FIG. 14, the transistor 22 has a single-gate structure and includes the gate electrode 731 corresponding to a channel formation region. However, the transistor 22 may have a multi-gate structure in which a plurality of electrically connected gate electrodes is provided so that a plurality of channel formation regions is included in one active layer.

This embodiment can be implemented in appropriate combination with any of the structures of the other embodiments and the like disclosed in this specification and the like.

Embodiment 4

Examples of Electronic Devices

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head-mounted displays), navigation systems, audio reproducing devices (e.g., car audio systems and digital audio players), copiers, facsimiles, printers, multifunction printers, automated teller machines (ATM), vending machines, and medical devices. FIGS. 15A to 15F illustrate specific examples of these electronic devices.

Figure 15A:
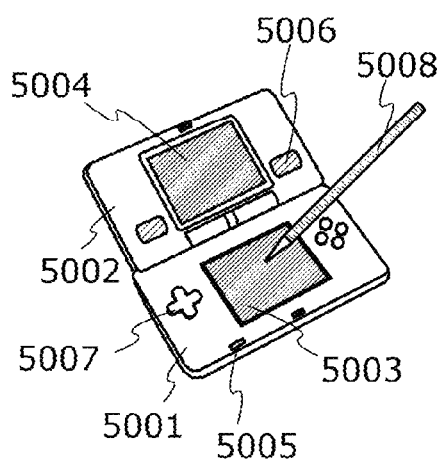
FIGS. 15A to 15F illustrate electronic devices.

FIG. 15A illustrates a portable game machine which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 15A has the two display portions 5003 and 5004, the number of display portions included in a portable game machine is not limited to two.

Figure 15B:
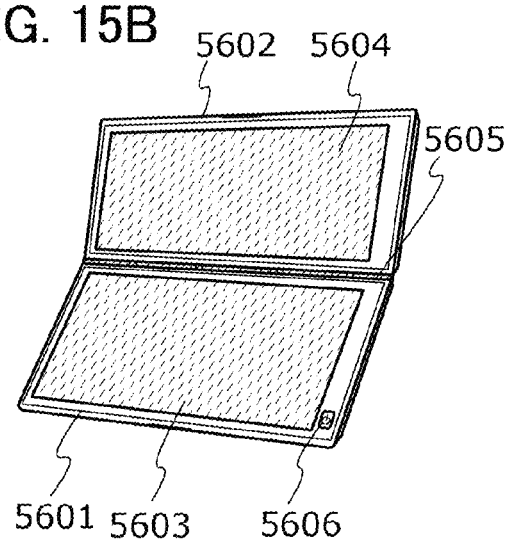

FIG. 15B illustrates a portable information terminal which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as the first display portion 5603 and/or the second display portion 5604. Note that the position input function can be added by providing a touch panel in a display device. Alternatively, the position input function can be added by providing a photoelectric conversion element called a photosensor in a pixel portion of a display device.

Figure 15C:
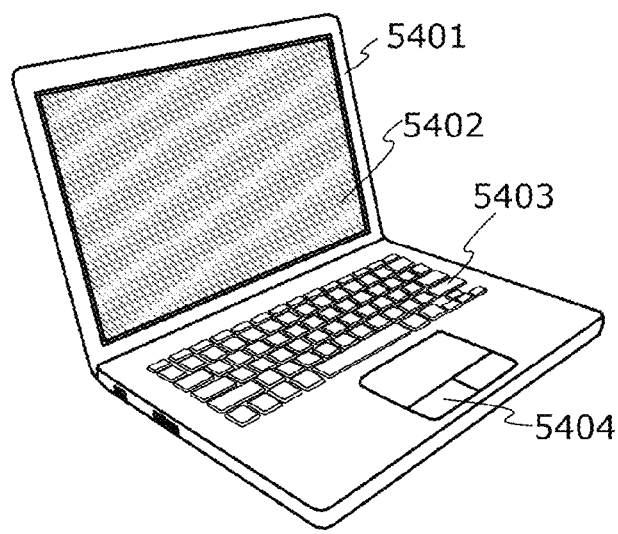

FIG. 15C illustrates a laptop which includes a housing 5401, a display portion 5402, a keyboard 5403, a pointing device 5404, and the like. The semiconductor device of one embodiment of the present invention can be used for a variety of integrated circuits included in laptops.

Figure 15D:
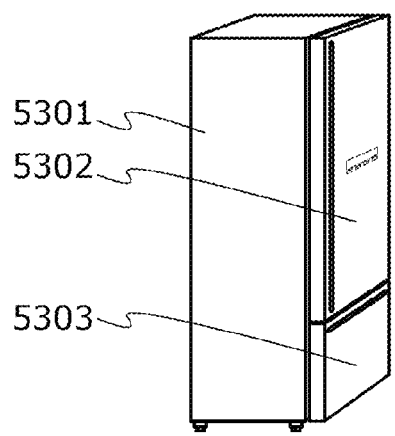

FIG. 15D illustrates an electric refrigerator-freezer which includes a housing 5301, a refrigerator door 5302, a freezer door 5303, and the like. The semiconductor device of one embodiment of the present invention can be used for a variety of integrated circuits included in electric refrigerator-freezers.

Figure 15E:
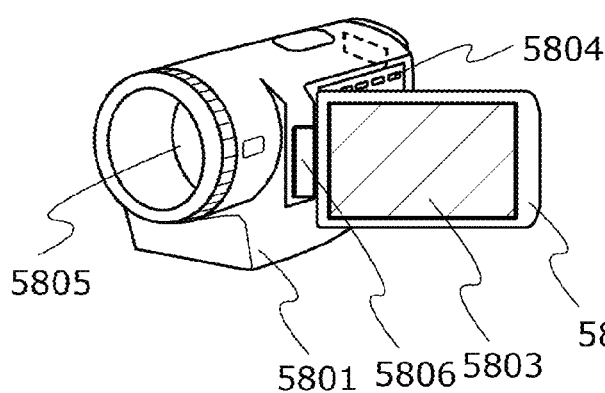

FIG. 15E illustrates a video camera which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 15F:
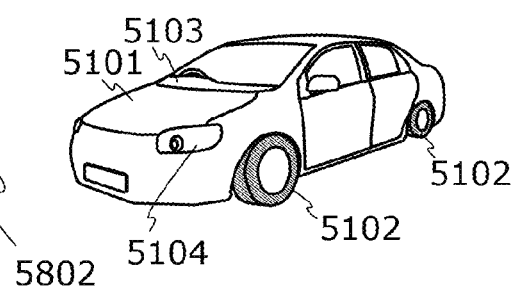

FIG. 15F illustrates a car which includes a car body 5101, wheels 5102, a dashboard 5103, lights 5104, and the like. The semiconductor device of one embodiment of the present invention can be used for a variety of integrated circuits included in cars.

Note that in this specification and the like, an explicit description "X and Y are connected" means that X and Y are electrically connected, X and Y are functionally connected, and X and Y are directly connected. Accordingly, without being limited to a predetermined connection relation, for example, a connection relation other than that shown in a drawing or text is possible.

Here, X and Y each denote an object (e.g., a device, an element, a circuit, a wiring, an electrode, a terminal, a conductive film, or a layer).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase the signal amplitude, the amount of current, or the like, an operational amplifier, a differential amplifier circuit, a source follower circuit, or a buffer circuit; a signal generation circuit; a memory circuit; or a control circuit) can be connected between X and Y. For example, in the case where a signal output from X is transmitted to Y even when another circuit is provided between X and Y, X and Y are functionally connected.

Note that an explicit description "X and Y are electrically connected" means that X and Y are electrically connected (i.e., X and Y are connected with another element or another circuit provided therebetween), X and Y are functionally connected (i.e., X and Y are functionally connected with another circuit provided therebetween), and X and Y are directly connected (i.e., X and Y are connected without another element or another circuit provided therebetween). That is, the explicit description "X and Y are electrically connected" is the same as the explicit simple description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to these examples, a source (or a first terminal or the like) and a drain (or a second terminal or the like) of a transistor can be distinguished from each other to specify the technical scope. Note that one embodiment of the present invention is not limited to these expressions which are just examples. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the category "electrical connection" in this specification includes such a case where one conductive film has functions of a plurality of components.

Note that what is described (or part thereof) in an embodiment can be applied to, combined with, or replaced with another content (or part thereof) in the same embodiment and/or what is described (or part thereof) in another embodiment or other embodiments.

Note that in each embodiment, a content described in the embodiment is a content described with reference to a variety of diagrams or a content described with text disclosed in the specification.

By combining a diagram (or part of thereof) illustrated in one embodiment with another part of the diagram, a different diagram (or part of thereof) illustrated in the embodiment, and/or a diagram (or part of thereof) illustrated in another embodiment or other embodiments, much more diagrams can be formed.

Note that a content that is not specified in any drawing or text in the specification can be excluded from one embodiment of the invention. Alternatively, when the range of a value that is defined by the maximum and minimum values or the like is described, the range may be freely narrowed or a value in the range may be excluded, so that one embodiment of the invention can be specified by a range part of which is excluded. In this manner, it is possible to specify the technical scope of one embodiment of the present invention so that a conventional technology is excluded, for example.

As a specific example, a diagram illustrates a circuit including first to fifth transistors. In this case, it can be specified that the circuit of the invention does not include a sixth transistor. It can be specified that the circuit of the invention does not include a capacitor. It can be specified that the circuit of the invention does not include a sixth transistor with a particular connection structure. It can be specified that the circuit of the invention does not include a capacitor with a particular connection structure. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, the description of a value, "a voltage is preferably higher than or equal to 3 V and lower than or equal to 10 V" is given. In this case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. For example, the invention can be specified by the voltage which is higher than or equal to 5 V and lower than or equal to 8 V. For example, the invention can be specified by the voltage which is approximately 9 V. For example, the invention can be specified by the voltage which is higher than or equal to 3 V and lower than or equal to 10 V but is not 9 V. Note that even when the description "a value is preferably in a certain range", "a value preferably satisfies a certain condition", or the like is given, the value is not limited to the description. In other words, a description of a value that includes the term "preferable", "preferably", or the like does not necessarily limit the value.

As another specific example, the description "a voltage is preferably 10 V" is given. In this case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, the description "a film is an insulating film" is given to describe a property of a material. In this case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the film is a conductive film is excluded from one embodiment of the invention. For example, it can be specified that the case where the film is a semiconductor film is excluded from one embodiment of the invention.

As another specific example, the description of a stacked-layer structure, "a film is provided between a film A and a film B" is given. In this case, for example, it can be specified that the case where the film is a stacked film of four or more layers is excluded from the invention. For example, it can be specified that the case where a conductive film is provided between the film A and the film is excluded from the invention.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Furthermore, in the case where a connection portion is disclosed in this specification and the like, it may be possible to determine that one embodiment of the invention in which a connection portion is not specified is disclosed in this specification and the like. In particular, in the case where the number of portions to which the terminal is connected may be more than one, it is not necessary to specify the portions to which the terminal is connected. Therefore, it may be possible to constitute one embodiment of the invention by specifying only portions to which some terminals of an active element (e.g., a transistor or a diode), a passive element (e.g., a capacitor or a resistor), and the like are connected.

Note that in this specification and the like, it may be possible for those skilled in the art to specify the invention when at least a connection portion of a circuit is specified. Alternatively, it may be possible for those skilled in the art to specify the invention when at least a function of a circuit is specified. In other words, when a function is specified, one embodiment of the invention is clear. Moreover, it can be determined that one embodiment of the invention in which a function is specified is disclosed in this specification and the like. Therefore, when a connection portion of a circuit is specified, the circuit is disclosed as one embodiment of the invention even when a function is not specified and can constitute one embodiment of the invention. Alternatively, when a function of a circuit is specified, the circuit is disclosed as one embodiment of the invention even when a connection portion is not specified and can constitute one embodiment of the invention.

Note that in this specification and the like, part of a diagram or text described in one embodiment can be taken out to constitute one embodiment of the invention. Thus, in the case where a diagram or text related to a certain portion is described, the content taken out from part of the diagram or the text is also disclosed as one embodiment of the invention and can constitute one embodiment of the invention. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text can be taken out to constitute one embodiment of the invention. For example, from a circuit diagram in which N circuit elements (e.g., transistors or capacitors; N is an integer) are provided, it is possible to take out M circuit elements (e.g., transistors or capacitors; M is an integer, where M<N) to constitute one embodiment of the invention. For another example, it is possible to take out M layers (M is an integer) from a cross-sectional view in which N layers (N is an integer, where M<N) are provided, to constitute one embodiment of the invention. For another example, it is possible to take out M elements (M is an integer) from a flow chart in which N elements (N is an integer, where M<N) are provided, to constitute one embodiment of the invention. For another example, it is possible to take out some given elements from a sentence "A includes B, C, D, E, or F" to constitute one embodiment of the invention, for example, "A includes B and E", "A includes E and F", "A includes C, E, and F", or "A includes B, C, D, and E".

Note that in the case where at least one specific example is given in a diagram or text described in one embodiment in this specification and the like, it will be readily appreciated by those skilled in the art that a broader concept of the specific example can be derived. Therefore, in the case where at least one specific example is given in the diagram or the text described in one embodiment, a broader concept of the specific example is disclosed as one embodiment of the invention and can constitute one embodiment of the invention. The embodiment of the invention is clear.

Note that in this specification and the like, what is illustrated in at least a diagram (or part thereof) is disclosed as one embodiment of the invention and can constitute one embodiment of the invention. Therefore, when certain content is illustrated in a diagram, the content is disclosed as one embodiment of the invention even when the content is not described with text and can constitute one embodiment of the invention. In a similar manner, part of a diagram, which is taken out from the diagram, is disclosed as one embodiment of the invention and can constitute one embodiment of the invention. The embodiment of the invention is clear.

EXAMPLE

In this example, results of evaluation of voltage-controlled oscillators (VCOs) fabricated according to one embodiment of the present invention will be described. The VCOs of this example were fabricated to have the circuit configuration of the device described in the above embodiment with reference to FIG. 2 and FIG. 3. Each of the VCOs of this example includes one hundred and one circuits 101 as the circuits 101[1] to 101[$n$] ($n$=101). Two kinds of VCOs were fabricated: as the circuits 104[1] to 104[$m$], one of them includes two circuits 104 ($m$=2), and the other includes eight circuits 104 ($m$=8).

The VCO of this example includes the circuits 101[1] to 101[101], and the circuits 101[1] to 101[101] are connected in a ring form. Specifically, an output terminal of each of the circuits 101[1] to 101[100] is connected to an input terminal of the circuit in the next stage. An output terminal of the circuit 101[101] is connected to an input terminal of the circuit 101[1]. The output terminal of the circuit 101[51] is also connected to the terminal OUT. From the terminal OUT, a signal generated by oscillation of the VCO is output.

The circuits 101[1] to 101[101] each include the circuit 102 and the inverter 103. The terminal A of the circuit 102 is connected to an output terminal of the inverter 103, and the terminal B of the circuit 102 is connected to an input terminal of the inverter 103 in the next stage. That is, one hundred and one inverters 103 are connected in a ring form and form an inverter ring. Furthermore, the circuit 102 is connected between any two adjacent inverters 103. In addition, the circuit 102 is connected to the wiring BL, the wirings CONTEXT[1] to CONTEXT[m], and the wirings WL[1] to WL[m].

As in FIG. 3, the second region 112a includes the circuits 102[1] to 102[51], and the fourth region 112b includes the circuits 102[52] to 102[101]. The third region 113b includes the inverter 103[$i_1$] ($i_1$ is an even number greater than or equal to 2 and less than or equal to 50). The first region 113a includes the inverter 103[$i_2$] ($i_{12}$ is an odd number greater than or equal to 1 and less than or equal to 51) and the inverter 103[$i_3$] ($i_3$ is an even number greater than or equal to 52 and less than or equal to 100). The fifth region 113c includes the inverter 103[$i_4$] ($i_4$ is an odd number greater than or equal to 53 and less than or equal to 101).

In this example, the inverter 103 is supplied with a ground potential GND as a low power supply potential and a potential $V_{RO}$ as a high power supply potential. The wiring BL is supplied with the ground potential GND as a low power supply potential and a potential $V_{DATA}$ as a high power supply potential. Hereinafter, a signal input through the wiring BL may also be referred to as analog voltage data (AVD). The wirings WL[1] to WL[m] are supplied with a potential $V_{SS}$ as a low power supply potential and the potential $V_{DATA}$ as a high power supply potential. The wirings CONTEXT[1] to CONTEXT[m] are supplied with the ground potential GND as a low power supply potential and a potential $V_{CONTEXT}$ as a high power supply potential.

The circuit 102 includes the circuits 104[1] to 104[m]. The terminals C of the circuits 104[1] to 104[m] are connected to the terminal A of the circuit 102, and the terminals D of the circuits 104[1] to 104[m] are connected to the terminal B of the circuit 102. Furthermore, the circuits 104[1] to 104[m] are each connected to the wiring BL, corresponding one of the wirings CONTEXT[1] to CONTEXT[m], and corresponding one of the wirings WL[1] to WL[m]. In the circuit 104[j] (j is one of 1 to m), the corresponding one of the wirings WL[1] to WL[m] refers to the wiring WL[j]. In the circuit 104[j], the corresponding one of the wirings CONTEXT[1] to CONTEXT[m] refers to the wiring CONTEXT[j].

The circuits 104[1] to 104[m] each include the transistor 105, the transistor 106, the transistor 107, and the capacitor 108. A first terminal of the transistor 105 is connected to the wiring BL, a second terminal of the transistor 105 is connected to a gate of the transistor 106, and a gate of the transistor 105 is connected to corresponding one of the wirings WL[1] to WL[m]. A first terminal of the transistor 106 is connected to the terminal C. A first terminal of the transistor 107 is connected to a second terminal of the transistor 106, a second terminal of the transistor 107 is connected to the terminal D, and a gate of the transistor 107 is connected to corresponding one of the wirings CONTEXT[1] to CONTEXT[m]. A first terminal of the capacitor 108 is connected to the gate of the transistor 106, and a second terminal of the capacitor 108 is connected to a wiring supplied with a predetermined potential.

The transistor 105 has a channel length of 1 μm and a channel width of 4 μm, and the transistors 106 and 107 each have a channel length of 0.5 μm and a channel width of 16 μm. In each of the transistors 106 and 107, silicon is used for a channel formation region.

In the transistor 105, a CAAC-OS film of an In—Ga—Zn oxide is used for a channel formation region. Accordingly, the off-state current of the transistor 105 is extremely low, and charge leakage from the capacitor 108 can be reduced. In addition, the transistor 105 is turned off by applying the potential $V_{SS}$ that is lower than the ground potential GND to the gate of the transistor 105, whereby the off-state current of the transistor 105 is further decreased and charge retention characteristics of the capacitor 108 are improved.

The transistor 105 includes a back gate, and the threshold voltage of the transistor 105 can be controlled by a voltage $V_{BG}$ of the back gate.

The gate capacitance of the transistor 106 is 16 fF, and the storage capacitance is 2 fF; the combined capacitance at the node SN, i.e., the sum of the gate capacitance and the storage capacitance, is 18 fF.

Figure 16:
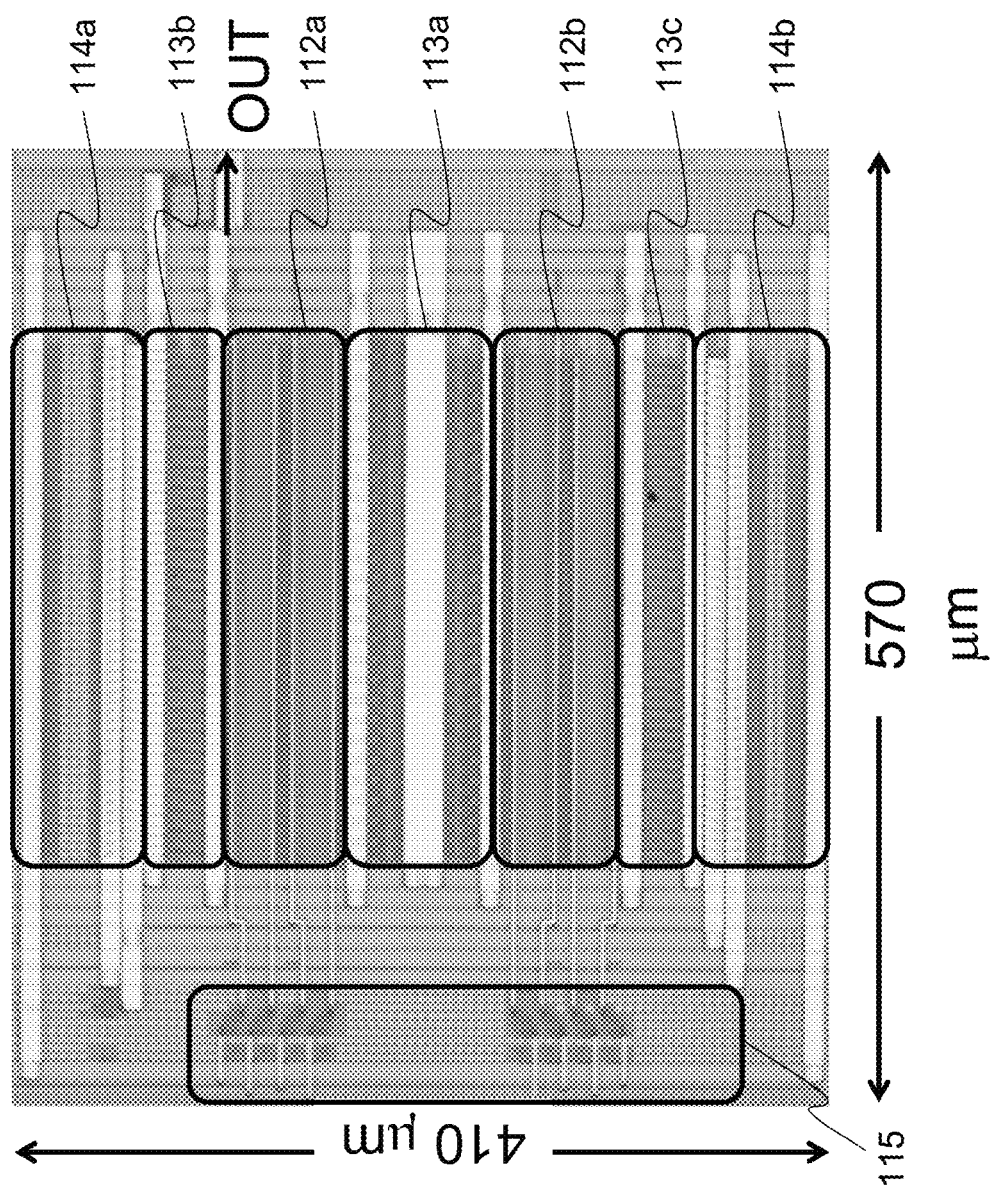
FIG. 16 is a photograph of a device of Example.
Figure 17:
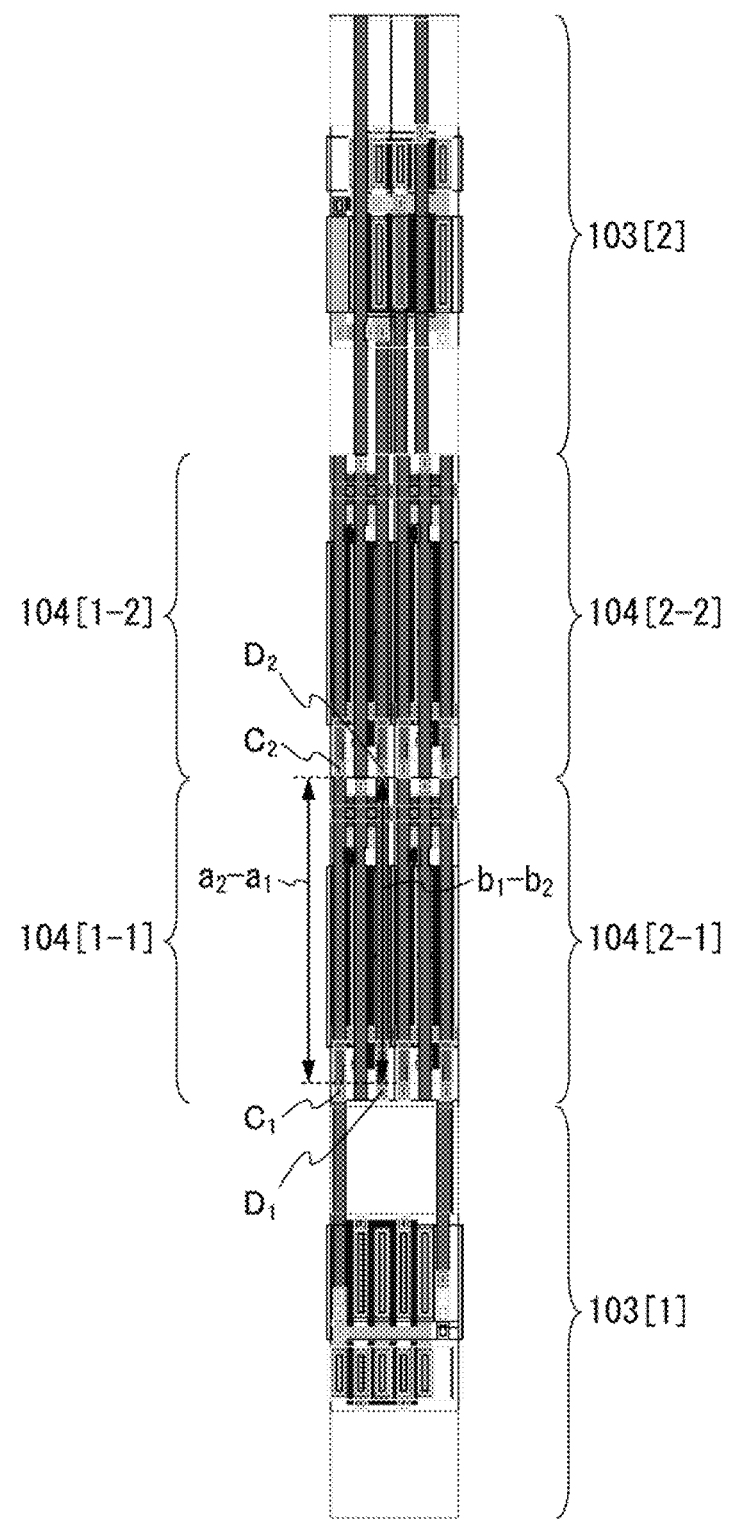
FIG. 17 shows a plan structure of a device of Example.

FIG. 16 shows a photograph of the VCO chip where m=2. FIG. 17 shows the layout of part of the VCO chip in FIG. 16. The VCO in FIG. 16 includes the first region 113a, the second region 112a, the third region 113b, the fourth region 112b, and the fifth region 113c and further includes a sixth region 114a, a seventh region 114b, and an eighth region 115 which are not illustrated in FIG. 3.

The sixth region 114a and the seventh region 114b each include the wiring BL, a buffer for supplying a potential to the wiring BL, and wirings connected to the buffer. The eighth region 115 includes the wirings WL[1] and WL[2], the wirings CONTEXT[1] and CONTEXT[2], buffers for supplying potentials to these wirings, and wirings connected to the buffers.

The planar layout in FIG. 17 shows the inverter 103[1] in the first region 113a, a circuit 104[1-1], a circuit 104[1-2], a circuit 104[2-1], and a circuit 104[2-2] in the second region 112a, and the inverter 103[2] in the third region 113b. Here, the circuit 104[1-1] and the circuit 104[1-2] represent the circuit 104[1] and the circuit 104[2] in the circuit 102[1], respectively. The circuit 104[2-1] and the circuit 104[2-2] represent the circuit 104[1] and the circuit 104[2] in the circuit 102[2], respectively. In the planar layout in FIG. 17, a region including the circuit 104[1-1] and the circuit 104[1-2] substantially corresponds to the layout in FIGS. 9A and 9B.

As described in the above embodiment with reference to FIG. 9B, in the circuit 104[1-1] and the circuit 104[1-2], the distance between the opening $C_1$ and the opening $C_2$ can be regarded as $a_2-a_1$, and the distance between the opening $D_1$ and the opening $D_2$ can be regarded as $b_1-b_2$. As shown in the planar layout in FIG. 17, the relation $a_2-a_1=b_1-b_2$ is also satisfied in the VCO of this example.

Thus, also in the VCO of this example, the distance between the opening $C_1$ and the opening $C_2$ is substantially equal to the distance between the opening $D_1$ and the opening $D_2$. Therefore, the wiring resistances between the terminal A and the terminal B of the circuit 102 can be substantially equal regardless of the choice of the wiring path through the circuit 104.

In the planar layout in FIG. 17, the circuit 101 in an odd-numbered stage and the circuit 101 in an even-numbered stage are provided in pairs as in the case of the circuit 101[1] and the circuit 101[2] in FIG. 3. Specifically, the circuit 102 in the odd-numbered stage (the circuit 104[1-1] and the circuit 104[1-2]) and the circuit 102 in the even-numbered stage (the circuit 104[2-1] and the circuit 104[2-2]) are provided adjacent to each other in the row direction. The inverter 103 in the odd-numbered stage (the inverter 103[1]) is provided below and adjacent to this circuit group in the column direction, and the inverter 103 in the even-numbered stage (the inverter 103[2]) is provided above and adjacent to this circuit group in the column direction. Accordingly, a space corresponding to the width of the circuit 102 in the odd-numbered stage and the width of the circuit 102 in the even-numbered stage in the row direction can be used for the inverter 103 in the odd-numbered stage and the inverter 103 in the even-numbered stage. Accordingly, the channel width of a transistor included in the inverter 103 can be increased while an increase in the area occupied by the inverter 103 is suppressed.

Figure 18A:
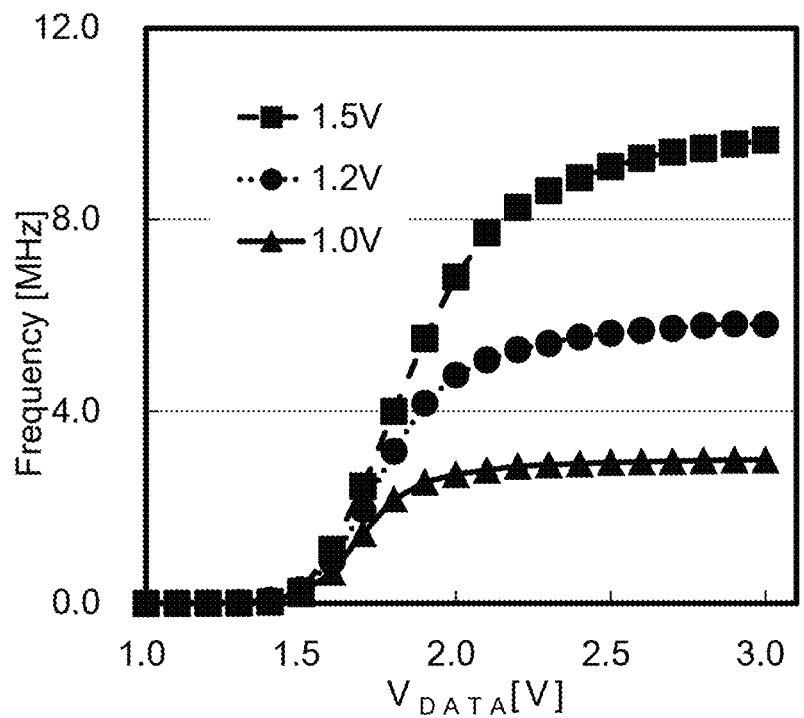
FIGS. 18A and 18B are graphs showing an operation of a device.
Figure 18B:
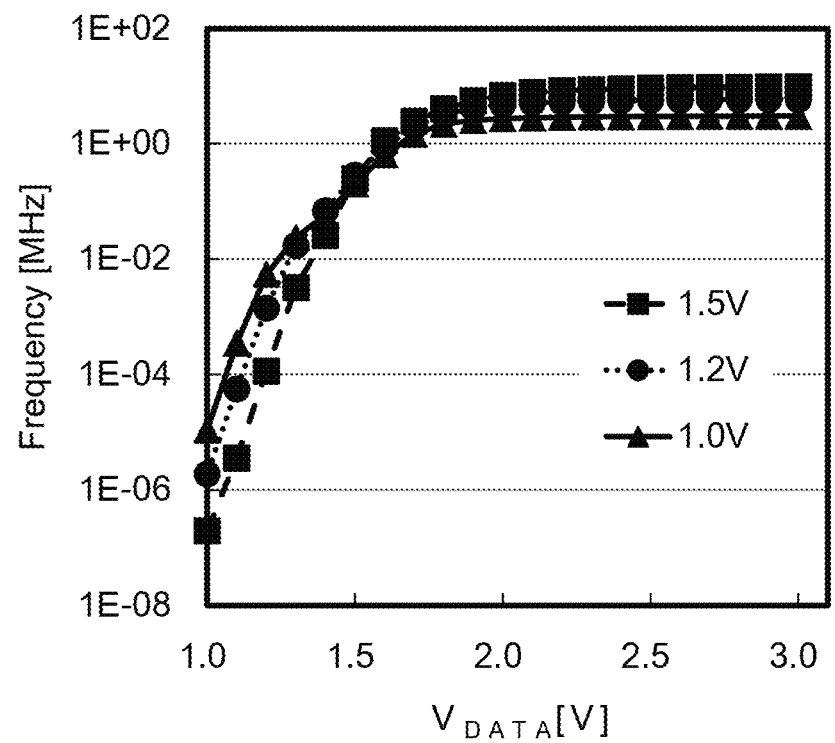

FIGS. 18A and 18B show results of measuring the output oscillation frequency of the VCO where m=2 with respect to the potential $V_{DATA}$ (AVD) input through the wiring BL. In FIG. 18A, the horizontal axis represents the potential $V_{DATA}$ [V], and the vertical axis represents the output oscillation frequency [MHz] in a linear scale. In FIG. 18B, the horizontal axis represents the potential $V_{DATA}$ [V], and the vertical axis represents the output oscillation frequency [MHz] in a log scale.

The oscillation frequency was measured under three conditions: the potential $V_{RO}$ was 1.0 V, 1.2 V, and 1.5 V. Here, only the circuit 104[1] was selected. The other conditions were as follows: $V_{CONTEXT}$ was 3.0 V, $V_{BG}$ was 0 V, $V_{SS}$ was −0.2 V, and the writing time was 1.0 ms.

FIGS. 18A and 18B show that the oscillation frequency can be controlled simply by changing the AVD. The oscillation frequency measured under the conditions where $V_{RO}$ was 1.5 V was higher than or equal to 197 mHz and lower than or equal to 9.65 MHz when the potential $V_{DATA}$ was in the range from 1.0 V to 3.0 V, which suggests that the oscillation frequency can vary over seven orders of magnitude.

Note that the change rate of the oscillation frequency varies with the change of the AVD. For example, in the case where $V_{DATA}$ is higher than or equal to 2.5 V and lower than or equal to 3.0 V, the oscillation frequency varies by 0.06 decades per 100 mV, and in the case where $V_{DATA}$ is higher than or equal to 1.0 V and lower than or equal to 1.5 V, the oscillation frequency varies by 1.24 decades per 100 mV. This can be explained as follows. In the case where $V_{DATA}$ is higher than or equal to 2.5 V and lower than or equal to 3.0 V, the conductivity of the transistor 106 is relatively high, the delay due to the inverter 103 is dominant, and the delay due to the transistor 106 has a small influence on the change rate of the oscillation frequency with the change of the AVD. In contrast, in the case where $V_{DATA}$ is higher than or equal to 1.0 V and lower than or equal to 1.5 V, the conductivity of the transistor 106 is relatively low, the delay due to the transistor 106 is dominant, and the oscillation frequency is more dependent on the AVD.

In a range where the AVD is high, the delay due to the inverter 103 is dominant, and thus, varying the potential $V_{RO}$ induces a large variation in the oscillation frequency. In the case where $V_{DATA}$ is higher than or equal to 1.0 V and lower than or equal to 1.5 V, the oscillation frequency increases at an average rate of 0.82 decades, 1.10 decades, and 1.24 decades per 100 mV when $V_{RO}$ is 1.0 V, 1.2 V, and 1.5 V, respectively. Therefore, for example, the drive voltage of the inverter 103 is set high for the use in which a wide range of frequencies is required, and the drive voltage of the inverter 103 is set low for the use in which delicate frequency control is required.

Figure 19:
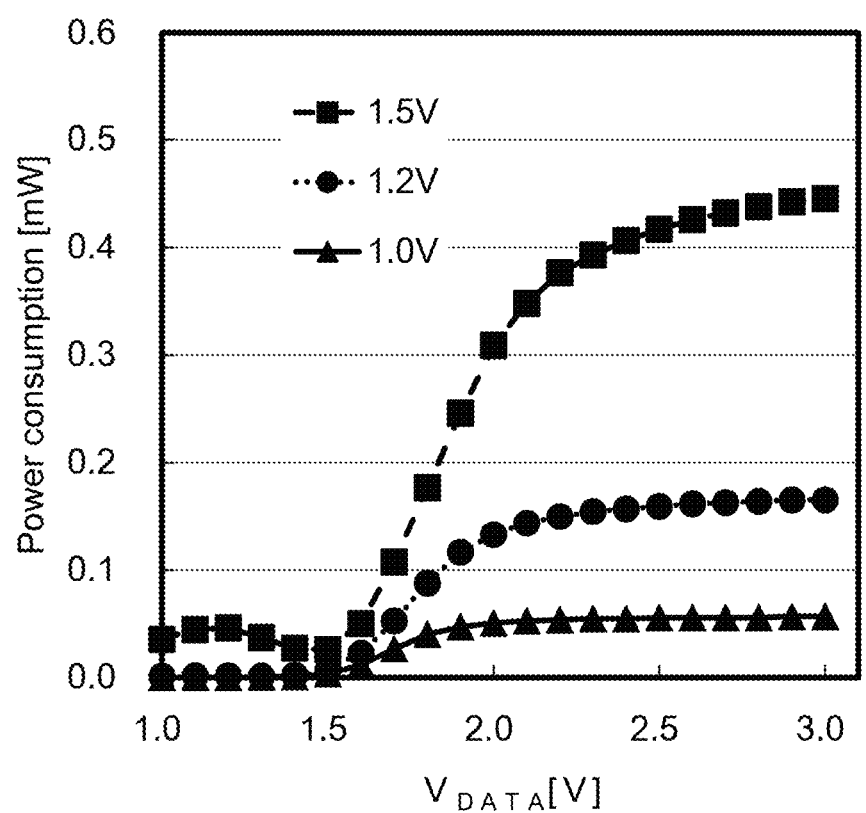
FIG. 19 is a graph showing an operation of a device.

FIG. 19 shows the power consumption at the points shown in FIGS. 18A and 18B. In FIG. 19, the horizontal axis represents the potential $V_{DATA}$ [V], and the vertical axis represents the power consumption [mW].

It can be seen that the dependence of the power consumption on $V_{RO}$ and $V_{DATA}$ under each condition correlates with the dependence of the oscillation frequency on $V_{RO}$ and $V_{DATA}$ which is shown in FIG. 18A. Therefore, setting $V_{RO}$ and $V_{DATA}$ in consideration of the intended oscillation frequency and power consumption is effective. When $V_{DATA}$ is relatively low with respect to $V_{RO}$, there is a region where the power efficiency is low because the voltage drops across the circuit 104 and an intermediate potential is applied to the inverter in the next stage.

Figure 20:
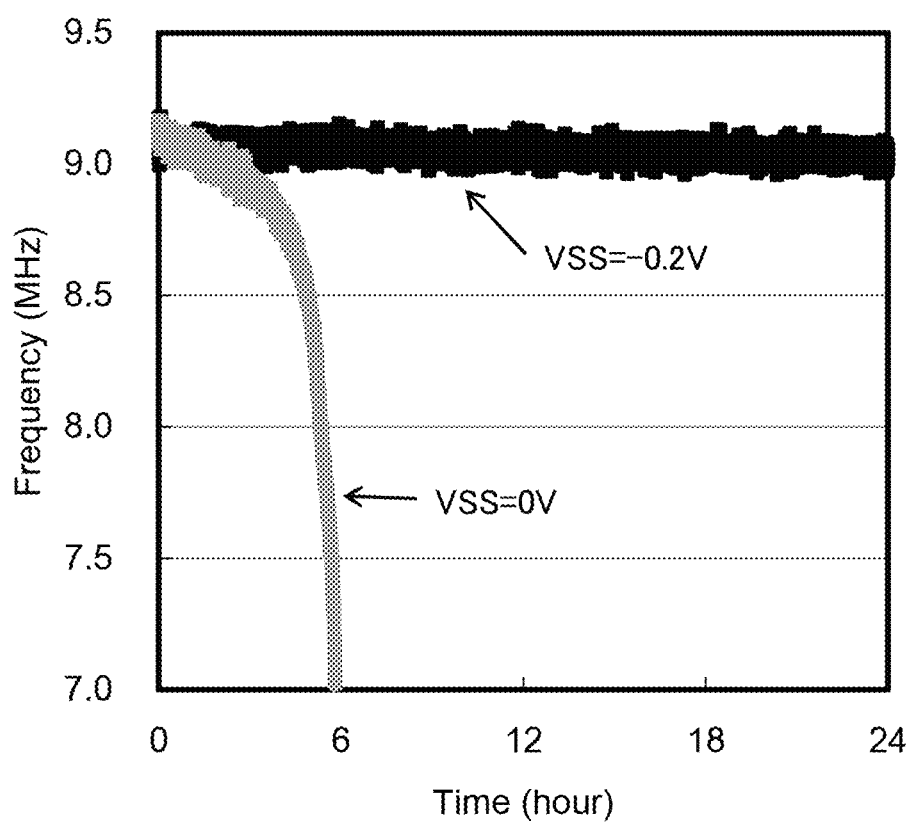
FIG. 20 is a graph showing an operation of a device.

FIG. 20 shows the temporal change of the oscillation frequency of the VCO oscillating under the conditions where $V_{DATA}$ stored in the circuit 104[1] was 2.5 V and $V_{RO}$ was 1.5 V. In FIG. 20, the horizontal axis represents the elapsed time [hour], and the vertical axis represents the oscillation frequency [MHz].

FIG. 20 shows results of measurement under two conditions where $V_{SS}$ was 0 V and −0.2 V. In an initial state, the oscillation frequency was 9.10 MHz under each condition. However, under the condition where $V_{SS}$ was 0 V, the oscillation frequency was attenuated over time. In 5 hours, the oscillation frequency decreased by approximately 7.7%, and after that, the oscillation frequency decreased at a drastic rate.

In contrast, under the condition where $V_{SS}$ was −0.2 V, the oscillation frequency hardly decreased over time. Even after 24 hours, the oscillation frequency was 9.02 MHz and decreased by only 0.87%. In the case where $V_{DATA}$ was uniformly lowered, the attenuation of $V_{DATA}$ over 24 hours can be estimated to be approximately 30 mV from the graph in FIG. 18A.

Leakage current $I_{leak}$ is given by the following formula (2), where t is time (s), C is the storage capacitance (F), and ΔV is the change in voltage (V).

[Formula 2] (2)

$$I_{leak} = \frac{\Delta V C}{t}$$

Since t=86400 (s), C=18 (fF), and ΔV=0.03 V, the leakage current $I_{leak}$ can be estimated to be 6×10$^{-21}$ (A) according to the formula (2). This indicates that the AVD can be retained for a long time by conducting quite infrequent refresh operations. Subsequent evaluations were conducted under the conditions where the attenuation of the oscillation frequency over 24 hours was less than 1%, i.e., $V_{SS}$=−0.2 V.

Figure 21A:
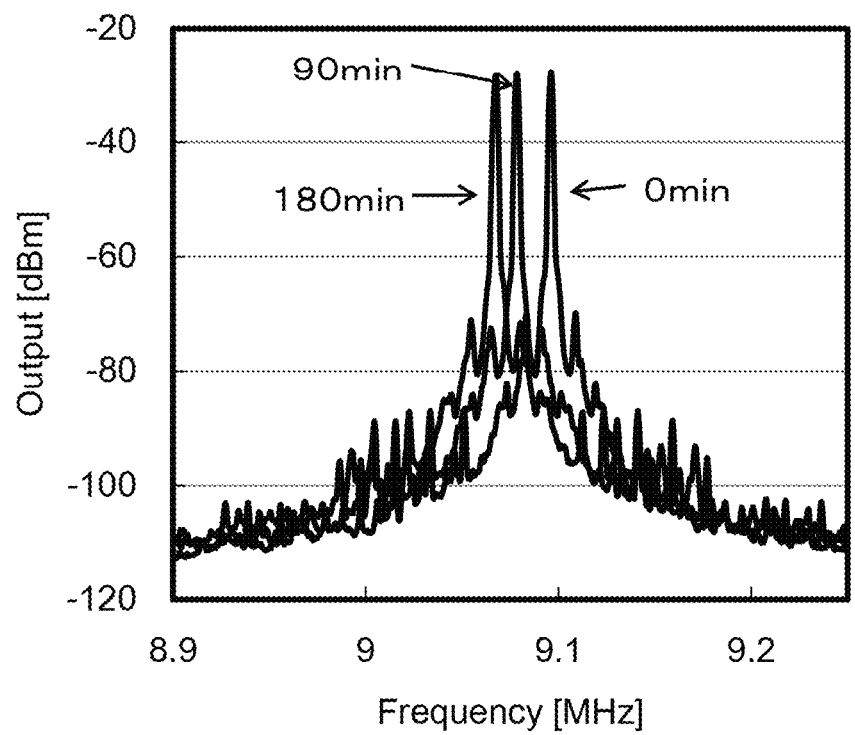
FIGS. 21A and 21B are graphs showing an operation of a device.
Figure 21B:
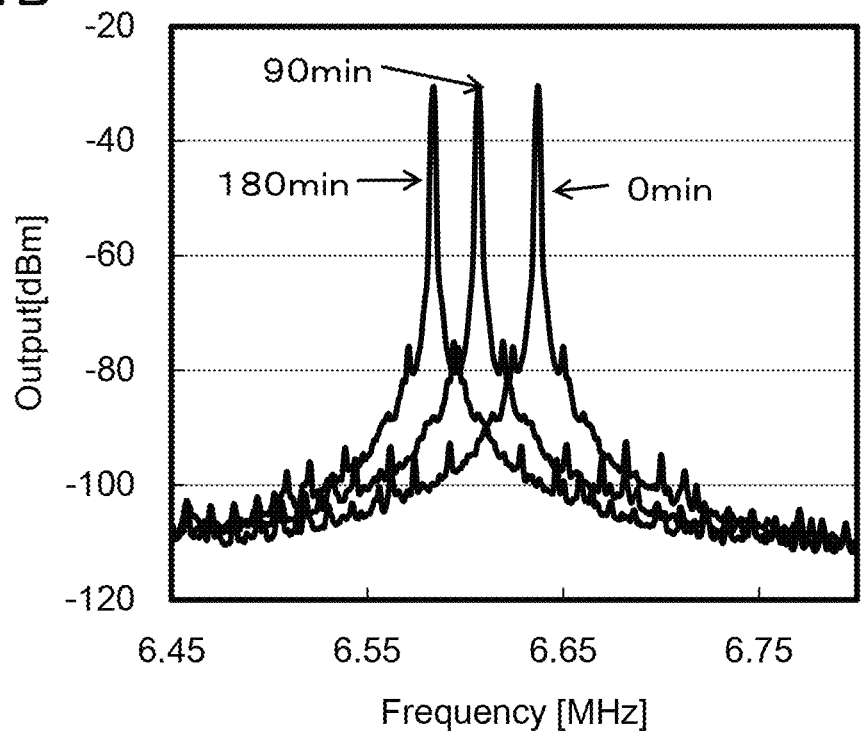

FIGS. 21A and 21B show changes in the oscillation frequency spectra of the VCO oscillating at $V_{RO}$=1.5 V. In FIGS. 21A and 21B, the horizontal axis represents the oscillation frequency [MHz], and the vertical axis represents the output [dBm].

FIG. 21A is a graph obtained when the AVD is set to 2.5 V. Three spectra shown in FIG. 21A are obtained at 0 min shortly after $V_{DATA}$ is applied to the node SN through the wiring BL, after 90 min, and after 180 min, respectively.

FIG. 21B is a graph obtained when the AVD is set to 2.0 V. Three spectra shown in FIG. 21B are obtained at 0 min shortly after $V_{DATA}$ is applied to the node SN through the wiring BL, after 90 min, and after 180 min, respectively.

The frequency spectrum at AVD=2.5 V in FIG. 21A peaks at 9.10 MHz at 0 min and at 9.07 MHz after 180 min, indicating a 0.34% attenuation of the oscillation frequency. The frequency spectrum at AVD=2.0 V in FIG. 21B peaks at 6.63 MHz at 0 min and at 6.58 MHz after 180 min, indicating a 0.74% attenuation of the oscillation frequency.

These results demonstrate that under the condition where $V_{SS}$ is −0.2 V, the change in the oscillation frequency is significantly small regardless of the AVD; that is, AVD retention characteristics are significantly favorable.

Furthermore, a figure of merit (FOM) at t=0 min with the AVD set to 2.5 V was calculated from the spectra in FIG. 21A according to a formula (3).

[Formula 3] (3)

$$FOM = Phn - 20\log\left(\frac{F_c}{\Delta F}\right) + 10\log(1000P)$$

Here, Phn is the phase noise, $F_c$ is the center frequency, and P is the power consumption.

Table 1 shows the FOM of this example and the FOMs of comparative examples 1 and 2 which are ring-oscillator-based VCOs. Note that Reference 1 (S. B. Anand and B. Razavi, "A CMOS Clock Recovery Circuit for 2.5-Gb/s NRZ Data," IEEE. J. Solid-State Circuits, vol. 36, no. 3, pp. 432-439, March 2001) can be referred to for the comparative example 1, and Reference 2 (C. Zhai et al., "An N-path Filter Enhanced Low Phase Noise Ring VCO," in Proc. VLSI Circuits Symp., 2014, pp. 187-188) can be referred to for the comparative example 2.

TABLE 1

|  | Example | Comparative example 1 | Comparative example 2 |
|---|---|---|---|
| $F_c$ | 9.1 MHz | 2.5 GHz | 1.0 GHz |
| Phase noise (dBc/Hz) | −108.8 | −80.0 | −110.0 |
| Power consumption | 420 μW | 10.0 mW | 4.7 mW |
| FOM (dBc/Hz) | −151.8 | −124.0 | −163.3 |

As shown in Table 1, the VCO described in this example has comparable or higher performance in comparison with the FOMs of the other ring-oscillator-based VCOs.

Figure 22A:
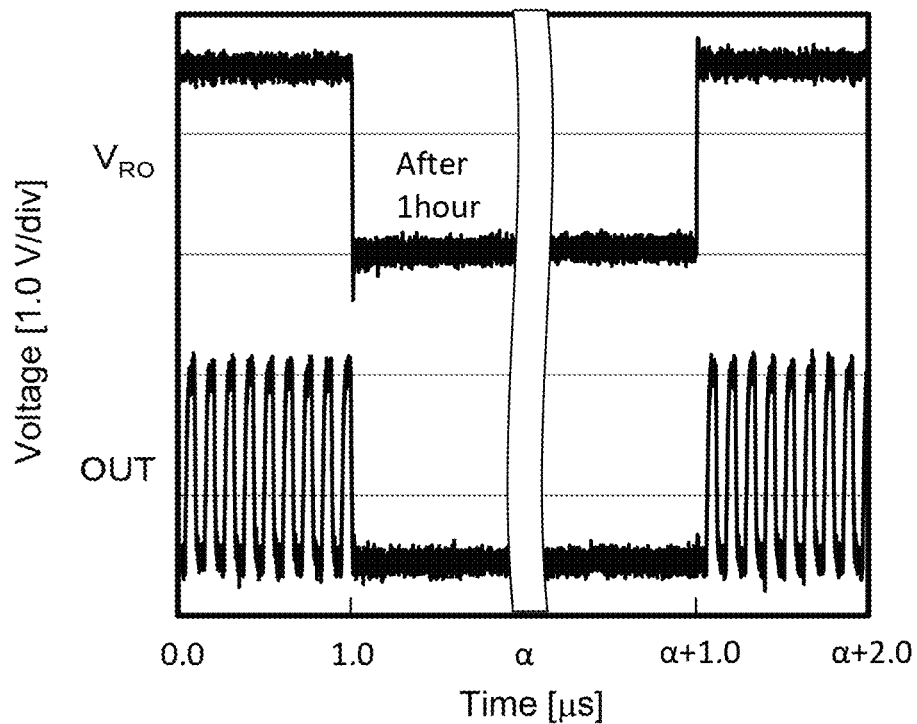
FIGS. 22A and 22B are graphs showing an operation of a device.
Figure 22B:
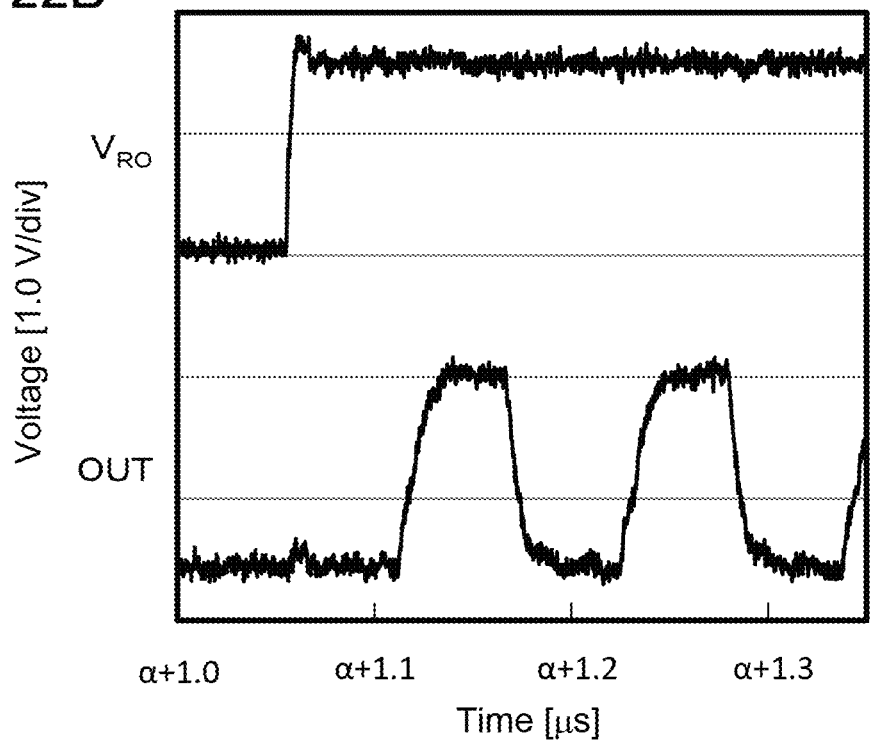

The VCO described in this example can retain an analog potential at the node SN and can maintain the oscillation frequency also at the time of restart after the stop of power supply. FIGS. 22A and 22B show waveforms obtained at the terminal OUT at the time of restart from a power supply stop state in the case where $V_{DATA}$ is 2.5 V, for example. Here, evaluation was conducted under the conditions where $V_{RO}$=1.5 V, $V_{SS}$=−0.2 V, and $V_{BG}$=0 V. In FIG. 22B, a region in FIG. 22A at around the time of restart is enlarged.

The waveforms in FIGS. 22A and 22B show that oscillation is resumed within 100 ns after the restart from the power supply stop state at time (α+1.0) μs. Note that α is 1 hour in FIG. 22A. That is, FIGS. 22A and 22B show that oscillation is favorably resumed even after 1 hour.

Accordingly, in the case where the VCO of this example is used in a PLL, power supply to component circuits other than the VCO can be stopped except in periods when infrequent refresh operations necessary to maintain the oscillation frequency are conducted. Therefore, the power consumption of the PLL in which the VCO of this example is used can be reduced.

In the case where the VCO of this example is used in the PLL, $V_{DATA}$ for outputting the previous oscillation frequency can be retained even in the case of restart from a power supply stop state. Therefore, instant restart can be achieved.

Figure 23:
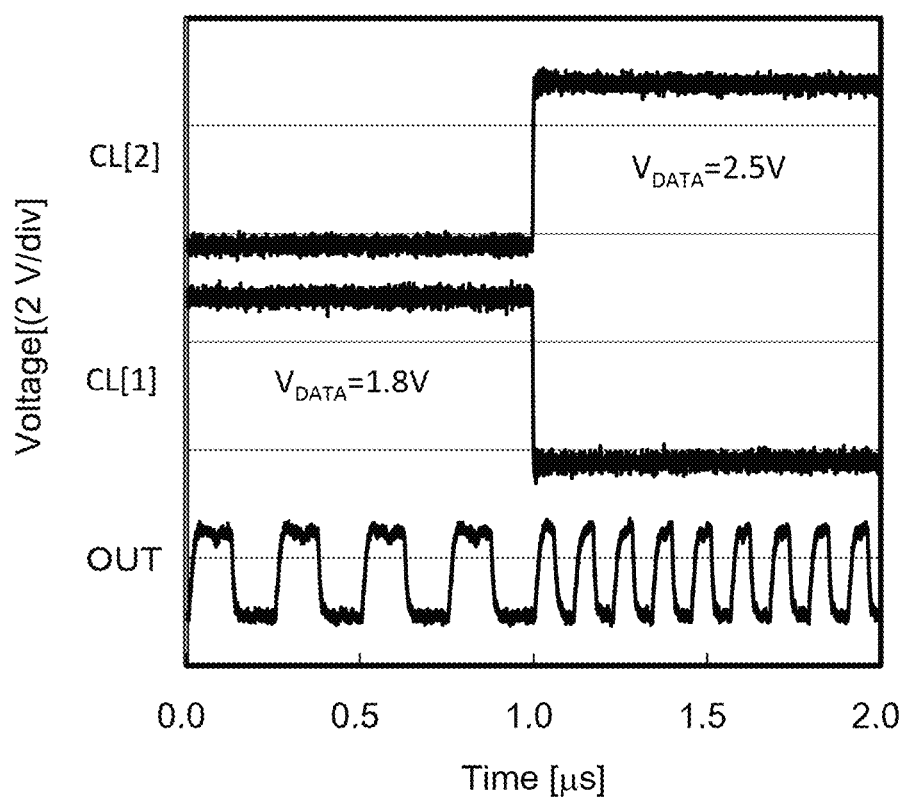
FIG. 23 is a graph showing an operation of a device.

The oscillation frequency of the VCO described in this example can be quickly changed by changing the choice from among the circuits 104[1] to 104[m] for which $V_{DATA}$ is set to respective different analog potentials. FIG. 23 shows waveforms obtained at the terminal OUT of the VCO under the following conditions: $V_{RO}$ is set to 1.5 V, $V_{DATA}$ is set to 1.8 V for the circuit 104[1] and 2.5 V for the circuit 104[2], and the selected circuit is switched from the circuit 104[1] to the circuit 104[2].

In FIG. 23, during time t in the range from 0 μsec to 1.0 μsec, the circuit 104[1] is selected, and a signal is output at an oscillation frequency of 4.0 MHz based on the AVD of 1.8 V. When the selected circuit is switched to the circuit 104[2] at t=1.0 μsec, the oscillation frequency of the output signal is instantly changed to 9.1 MHz.

As described above, the waveforms in FIG. 23 show that the oscillation frequency of the VCO of this example can be changed within 100 ns.

Figure 24:
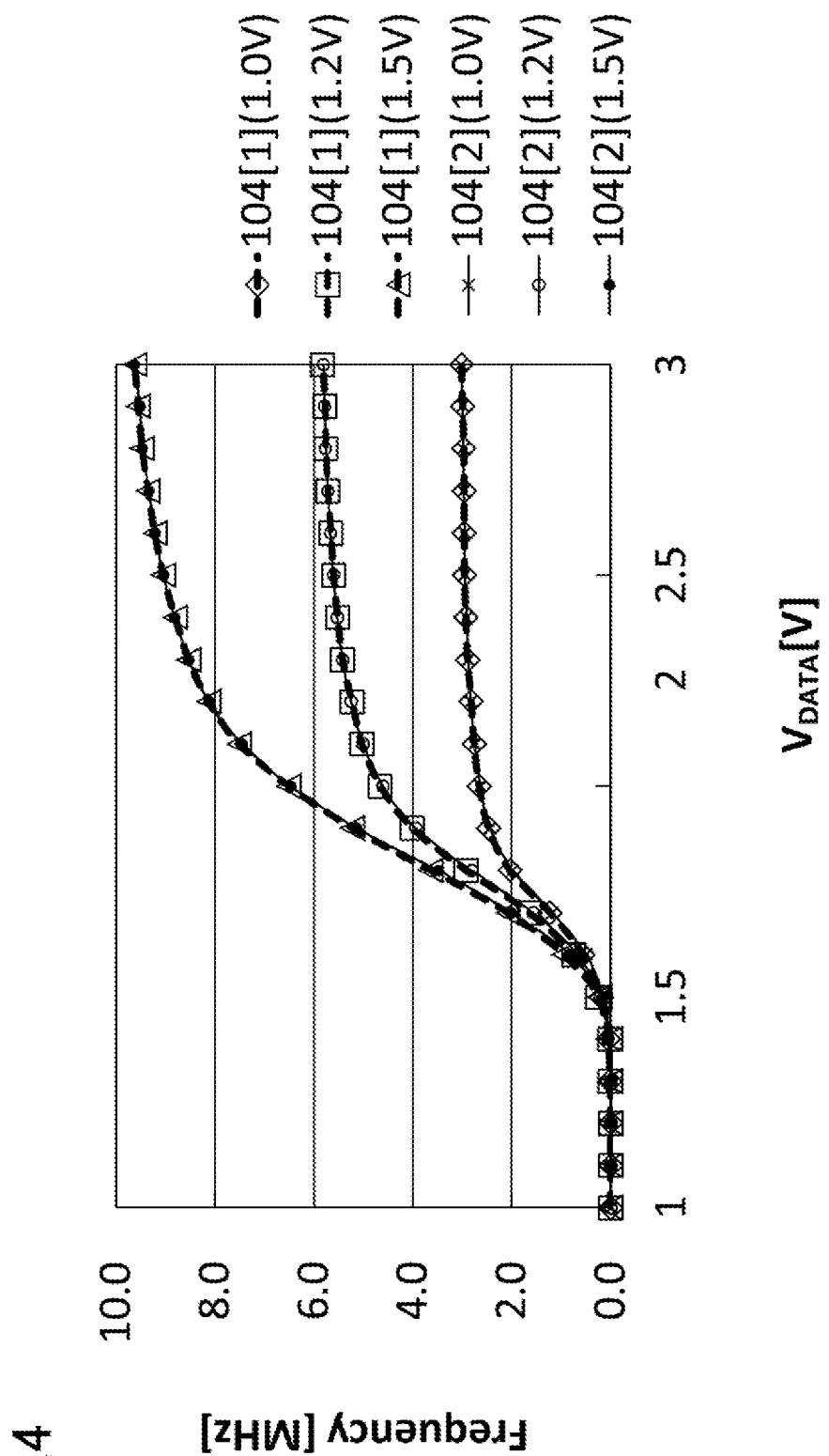
FIG. 24 is a graph showing an operation of a device.

FIG. 24 shows results of measuring the output oscillation frequency of the VCO described in this example, where m=2, with respect to the potential $V_{DATA}$ (AVD) which is selectively input to the circuit 104[1] and the circuit 104[2] through the wiring BL. In FIG. 24, the horizontal axis represents the potential $V_{DATA}$ [V], and the vertical axis represents the output oscillation frequency [MHz].

The oscillation frequency was measured under three conditions: the potential $V_{RO}$ was 1.0 V, 1.2 V, and 1.5 V. The other conditions were as follows: $V_{CONTEXT}$ was 2.5 V, $V_{BG}$ was 0 V, $V_{SS}$ was −0.2 V, and the writing time was 1.0 ms.

As shown in FIG. 24, under all the conditions where the potential $V_{RO}$ was 1.0 V, 1.2 V, and 1.5 V, substantially the same oscillation frequency was output when the same AVD was input to the circuit 104[1] and the circuit 104[2]. That is, in the VCO described in this example, the same oscillation frequency was obtained regardless of the choice between the circuit 104[1] and the circuit 104[2].

The above results indicate that the VCO described in this example can have a substantially uniform wiring length regardless of the choice of the circuit 104, so that signal delay depending on the choice of the circuit 104 can be prevented. Accordingly, the semiconductor device of one embodiment of the present invention can have substantially equal oscillation frequencies for specific data, which leads to an improvement in the accuracy of oscillation frequency.

Figure 25:
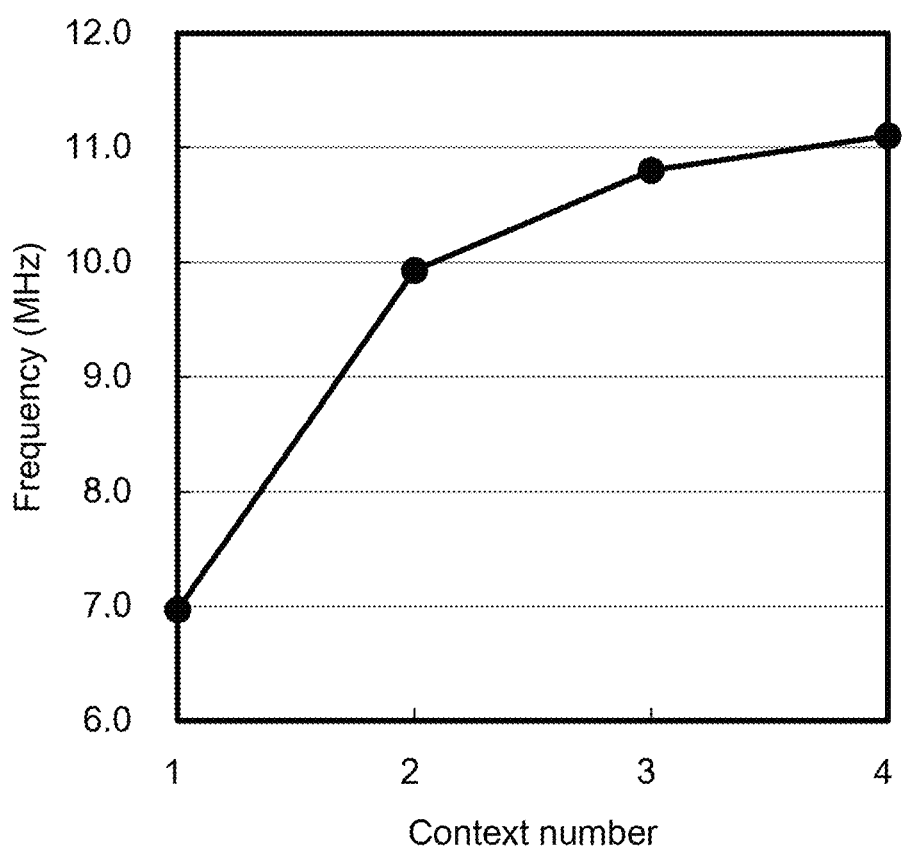
FIG. 25 is a graph showing an operation of a device.

Next, the oscillation frequency of the VCO where m=8 was measured under the conditions where $V_{DATA}$ was set to 2.5 V for the circuits 104[1] to 104[8] and the number of selected circuits 104 was one, two, three, and four. Here, evaluation was conducted under the conditions where $V_{RO}$=3.0 V, $V_{SS}$=−0.2 V, and $V_{BG}$=0 V. FIG. 25 is a graph showing the relation between the number of selected circuits 104 and the oscillation frequency.

The oscillation frequency is 6.97 MHz when one circuit 104 is selected, but increases to 9.93 MHz, 10.80 MHz, and 11.10 MHz as the number of selected circuits 104 increases to two, three, and four, respectively. This is because increasing the number of selected circuits 104 increases the conductivity of the circuit 102 and reduces delay. That is, the oscillation frequency can be controlled by the number of selected circuits 104.

When the conductivity increases with an increase in the number of selected circuits 104, the delay time in inverters exerts a greater effect on the oscillation frequency of the VCO. Therefore, when a larger number of circuits 104 are selected, the increase rate of the oscillation frequency of the VCO with respect to the increase in the number of selected circuits 104 decreases.

A VCO containing a plurality of analog memory sets can store different AVD sets in the circuits 104. Therefore, a wide oscillation frequency range can be minutely controlled by combining digital control (for changing the number of selected circuits 104) with analog control (for changing the AVD value).

This application is based on Japanese Patent Application serial no. 2014-222832 filed with Japan Patent Office on Oct. 31, 2014, the entire contents of which are hereby incorporated by reference.

What is claimed is:

1. A semiconductor device comprising an oscillator circuit comprising:
   first to n-th inverters;
   a first circuit configured to store first data; and
   a second circuit configured to store second data,
   wherein n is an odd number of 3 or more,
   wherein a first terminal of the first circuit is electrically connected to an output terminal of the i-th inverter, wherein i is one of 1 to n−1,
   wherein a second terminal of the first circuit is electrically connected to an input terminal of the i+1-th inverter,
   wherein a first terminal of the second circuit is electrically connected to the output terminal of the i-th inverter,
   wherein a second terminal of the second circuit is electrically connected to the input terminal of the i+1-th inverter, and
   wherein a sum of a length of a wiring path between the output terminal of the i-th inverter and the first terminal of the first circuit and a length of a wiring path between the second terminal of the first circuit and the input terminal of the i+1-th inverter is substantially equal to a sum of a length of a wiring path between the output terminal of the i-th inverter and the first terminal of the second circuit and a length of a wiring path between the second terminal of the second circuit and the input terminal of the i+1-th inverter.

2. The semiconductor device according to claim 1, further comprising:
   an insulating film over at least part of the first circuit and part of the second circuit;
   a first wiring over the insulating film, the first wiring being electrically connected to the output terminal of the i-th inverter; and
   a second wiring over the insulating film, the second wiring being electrically connected to the input terminal of the i+1-th inverter,
   wherein a first opening, a second opening, a third opening and a fourth opening are in the insulating film,
   wherein the first wiring is electrically connected to the first terminal of the first circuit through the first opening and to the first terminal of the second circuit through the second opening,
   wherein the second wiring is electrically connected to the second terminal of the first circuit through the third opening and to the second terminal of the second circuit through the fourth opening, and
   wherein a distance between the first opening and the second opening is substantially equal to a distance between the third opening and the fourth opening.

3. The semiconductor device according to claim 1, further comprising:
   a first region in which the j-th inverter, where j is an odd number greater than or equal to 1 and less than or equal to n, is provided;
   a second region in which the first circuit and the second circuit are provided; and
   a third region in which the k-th inverter, where k is an even number greater than or equal to 2 and less than or equal to n−1, is provided,
   wherein the second region is positioned between the first region and the third region.

4. The semiconductor device according to claim 1,
   wherein the first circuit is configured to perform switching between a mode in which the first terminal and the second terminal are electrically disconnected from each other and a mode in which a resistance value between the first terminal and the second terminal is set to a value based on the first data,
   and
   wherein the second circuit is configured to perform switching between a mode in which the first terminal and the second terminal are electrically disconnected from each other and a mode in which a resistance value between the first terminal and the second terminal is set to a value based on the second data.

5. The semiconductor device according to claim 1,
   wherein the first data and the second data are each an analog potential.

6. The semiconductor device according to claim 1,
   wherein the first circuit comprises a first transistor and a first capacitor,
   wherein the second circuit comprises a second transistor and a second capacitor,
   wherein the first data is input to the first capacitor through the first transistor,
   wherein the second data is input to the second capacitor through the second transistor,
   wherein a channel formation region of each of the first transistor and the second transistor comprises an oxide semiconductor.

7. The semiconductor device according to claim 1,
   wherein the first circuit comprises a third transistor and a fourth transistor,
   wherein the second circuit comprises a fifth transistor and a sixth transistor,
   wherein the third transistor and the fourth transistor are electrically connected in series between the first terminal of the first circuit and the second terminal of the first circuit,
   wherein the fifth transistor and the sixth transistor are electrically connected in series between the first terminal of the second circuit and the second terminal of the second circuit,
   wherein a resistance value between a source and a drain of the third transistor is based on the first data,
   wherein the fourth transistor is configured to control conduction/non-conduction between the first terminal of the first circuit and the second terminal of the first circuit,
   wherein a resistance value between a source and a drain of the fifth transistor is based on the second data, and
   wherein the sixth transistor is configured to control conduction/non-conduction between the first terminal of the second circuit and the second terminal of the second circuit.

8. The semiconductor device according to claim 1, further comprising a PLL, wherein the PLL comprises the oscillator circuit, a frequency divider, a phase comparator, and a loop filter.

9. The semiconductor device according to claim 6,
wherein the oxide semiconductor of each of the first transistor and the second transistor comprises In, Zn and M where Al is Ga, Y, Zr, La; Ce, or Nd.

10. An electronic device comprising the semiconductor device according to claim 1.

11. A semiconductor device comprising an oscillator circuit comprising:
a first inverter;
a second inverter;
a third inverter;
a first circuit configured to store first data; and
a second circuit configured to store second data,
wherein a first terminal of the first circuit is electrically connected to an output terminal of the first inverter,
wherein a second terminal of the first circuit is electrically connected to an input terminal of the second inverter,
wherein a first terminal of the second circuit is electrically connected to the output terminal of the first inverter,
wherein a second terminal of the second circuit is electrically connected to the input terminal of the second inverter, and
wherein a sum of a length of a wiring path between the output terminal of the first inverter and the first terminal of the first circuit and a length of a wiring path between the second terminal of the first circuit and the input terminal of the second inverter is substantially equal to a sum of a length of a wiring path between the output terminal of the first inverter and the first terminal of the second circuit and a length of a wiring path between the second terminal of the second circuit and the input terminal of the second inverter.

12. The semiconductor device according to claim 11, further comprising:
an insulating film over at least part of the first circuit and part of the second circuit;
a first wiring over the insulating film, the first wiring being electrically connected to the output terminal of the first inverter; and
a second wiring over the insulating film, the second wiring being electrically connected to the input terminal of the second inverter,
wherein a first opening, a second opening, a third opening and a fourth opening are in the insulating film,
wherein the first wiring is electrically connected to the first terminal of the first circuit through the first opening and to the first terminal of the second circuit through the second opening,
wherein the second wiring is electrically connected to the second terminal of the first circuit through the third opening and to the second terminal of the second circuit through the fourth opening, and
wherein a distance between the first opening and the second opening is substantially equal to a distance between the third opening and the fourth opening.

13. The semiconductor device according to claim 11, further comprising:
a first region in which the first inverter is provided;
a second region in which the first circuit and the second circuit are provided; and
a third region in which the second inverter is in provided,
wherein the second region is positioned between the first region and the third region.

14. The semiconductor device according to claim 11,
wherein the first circuit is configured to perform switching between a mode in which the first terminal and the second terminal are electrically disconnected from each other and a mode in which a resistance value between the first terminal and the second terminal is set to a value based on the first data,
and
wherein the second circuit is configured to perform switching between a mode in which the first terminal and the second terminal are electrically disconnected from each other and a mode in which a resistance value between the first terminal and the second terminal is set to a value based on the second data.

15. The semiconductor device according to claim 11,
wherein the first data and the second data are each an analog potential.

16. The semiconductor device according to claim 11,
wherein the first circuit comprises a first transistor and a first capacitor,
wherein the second circuit comprises a second transistor and a second capacitor,
wherein the first data is input to the first capacitor through the first transistor,
wherein the second data is input to the second capacitor through the second transistor,
wherein a channel formation region of each of the first transistor and the second transistor comprises an oxide semiconductor.

17. The semiconductor device according to claim 11,
wherein the first circuit comprises a third transistor and a fourth transistor,
wherein the second circuit comprises a fifth transistor and a sixth transistor,
wherein the third transistor and the fourth transistor are electrically connected in series between the first terminal of the first circuit and the second terminal of the first circuit,
wherein the fifth transistor and the sixth transistor are electrically connected in series between the first terminal of the second circuit and the second terminal of the second circuit,
wherein a resistance value between a source and a drain of the third transistor is based on the first data,
wherein the fourth transistor is configured to control conduction/non-conduction between the first terminal of the first circuit and the second terminal of the first circuit,
wherein a resistance value between a source and a drain of the fifth transistor is based on the second data, and
wherein the sixth transistor is configured to control conduction/non-conduction between the first terminal of the second circuit and the second terminal of the second circuit.

18. The semiconductor device according to claim 11, further comprising a PLL,
wherein the PLL comprises the oscillator circuit, a frequency divider, a phase comparator, and a loop filter.

19. The semiconductor device according to claim 16,
wherein the oxide semiconductor of each of the first transistor and the second transistor comprises In, Zn and Al, where M is Ga, Y, Zr, La, Ce, or Nd.

20. An electronic device comprising the semiconductor device according to claim 11.

* * * * *

UNITED STATES PATENT AND TRADEMARK OFFICE
CERTIFICATE OF CORRECTION

PATENT NO. : 9,793,905 B2
APPLICATION NO. : 14/925161
DATED : October 17, 2017
INVENTOR(S) : Yuki Okamoto and Yoshiyuki Kurokawa Page 1 of 1

It is certified that error appears in the above-identified patent and that said Letters Patent is hereby corrected as shown below:

Column 59, Line 6, in Claim 9, after "and M" insert --,--;

Column 59, Line 6, in Claim 9, replace "Al" with --M--;

Column 59, Line 6, in Claim 9, after "La" replace ";" with --,--;

Column 60, Line 62, in Claim 19, replace "Al," with --M,--.

Signed and Sealed this
Sixth Day of February, 2018

Joseph Matal
*Performing the Functions and Duties of the*
*Under Secretary of Commerce for Intellectual Property and*
*Director of the United States Patent and Trademark Office*